United States Patent
Ogiwara et al.

(10) Patent No.: US 9,614,170 B2
(45) Date of Patent: Apr. 4, 2017

(54) ORGANIC ELECTROLUMINESCENT ELEMENT

(71) Applicant: Idemitsu Kosan Co., Ltd., Tokyo (JP)

(72) Inventors: Toshinari Ogiwara, Sodegaura (JP); Yukitoshi Jinde, Sodegaura (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 0 days.

(21) Appl. No.: 14/432,696

(22) PCT Filed: Sep. 24, 2013

(86) PCT No.: PCT/JP2013/075650
§ 371 (c)(1),
(2) Date: Mar. 31, 2015

(87) PCT Pub. No.: WO2014/054452
PCT Pub. Date: Apr. 10, 2014

(65) Prior Publication Data
US 2015/0280158 A1 Oct. 1, 2015

(30) Foreign Application Priority Data

Oct. 3, 2012 (JP) .................. 2012-221625

(51) Int. Cl.
*H01L 51/50* (2006.01)
*H01L 51/00* (2006.01)

(52) U.S. Cl.
CPC ........ *H01L 51/504* (2013.01); *H01L 51/5044* (2013.01); *H01L 51/0061* (2013.01);
(Continued)

(58) Field of Classification Search
CPC ............. H01L 51/5036; H01L 51/5016; H01L 2251/5315
See application file for complete search history.

(56) References Cited

U.S. PATENT DOCUMENTS 5,707,745 A * 1/1998 Forrest .................. C09K 11/06
257/440
7,358,661 B2 4/2008 Kuma
(Continued)

FOREIGN PATENT DOCUMENTS

JP 2008-085078 A 4/2008
JP 2010-541144 A 12/2010
(Continued)

OTHER PUBLICATIONS

Adachi et al., "Development of Highly-Efficient Electroluminescence Devices Utilizing Thermally Activated Delayed Fluorescence of Spiro-Structures Molecules," The Chemical Society of Japan, 3 M3-37, Mar. 25-28, 2012.
(Continued)

Primary Examiner — Jaehwan Oh
(74) Attorney, Agent, or Firm — Oblon, McClelland, Maier & Neustadt, L.L.P.

(57) ABSTRACT

An organic electroluminescence device includes a pair of electrodes and an organic compound layer interposed therebetween. The organic compound layer includes a plurality of emitting layers at least including a first emitting layer and a second emitting layer. The first emitting layer contains a first host material and a fluorescent first luminescent material. The second emitting layer contains a second luminescent material that is different from the first luminescent material. A difference $\Delta ST(H1)$ between singlet energy $EgS(H1)$ of the first host material and an energy gap $Eg_{77K}(H1)$ at 77[K] of the first host material satisfies a specific relationship. One of the first luminescent material and the second luminescent material has a main peak wavelength from 400 nm to less than 500 nm and the other of the first luminescent material and the second luminescent
(Continued)

material has a main peak wavelength from 500 nm to 700 nm.

11 Claims, 18 Drawing Sheets

(52) U.S. Cl.
CPC ...... *H01L 51/0067* (2013.01); *H01L 51/0072* (2013.01); *H01L 2251/5376* (2013.01); *H01L 2251/552* (2013.01)

(56) References Cited

U.S. PATENT DOCUMENTS

| | | | | |
|---|---|---|---|---|
| 8,941,297 | B2* | 1/2015 | Kaiser | H01L 51/5016 313/504 |
| 2006/0279203 | A1* | 12/2006 | Forrest | H01L 51/0072 313/504 |
| 2010/0090593 | A1* | 4/2010 | Mori | H01L 27/3211 313/504 |
| 2010/0187517 | A1 | 7/2010 | Nishimura et al. | |
| 2010/0270539 | A1* | 10/2010 | Nishimura | C09K 11/06 257/40 |
| 2010/0314648 | A1 | 12/2010 | Fehrer et al. | |
| 2012/0097998 | A1 | 4/2012 | Pieh et al. | |
| 2012/0126208 | A1* | 5/2012 | Kawamura | H01L 51/0061 257/40 |
| 2012/0126209 | A1* | 5/2012 | Kawamura | H01L 51/5096 257/40 |
| 2012/0241732 | A1* | 9/2012 | Endo | C09B 57/00 257/40 |
| 2012/0248968 | A1* | 10/2012 | Ogiwara | H01L 51/5012 313/504 |
| 2013/0207088 | A1* | 8/2013 | Seo | H01L 51/5016 257/40 |
| 2015/0188070 | A1* | 7/2015 | Ogiwara | H01L 51/5012 257/40 |

FOREIGN PATENT DOCUMENTS

| | | |
|---|---|---|
| JP | 2011-199019 A | 10/2011 |
| WO | WO-2009/008344 A1 | 1/2009 |
| WO | WO-2010/134350 A1 | 11/2010 |
| WO | WO-2010/134352 A1 | 11/2010 |
| WO | WO-2011/070963 A1 | 6/2011 |

OTHER PUBLICATIONS

Adachi et al., "Expression of Highly-Efficient Thermally-Activated Delayed-Fluorescence and Application Thereof to OLED," Organic EL Symposium, Jun. 17-18, 2010, pp. 11-12.

Adachi et al., "Molecular Design of Triazine Derivatives Having a High Up-Conversion Efficiency from Triplet into Singlet Excited States and Their Application to OLEDs," The Chemical Society of Japan, 2 PA-126, Mar. 25-28, 2012.

Das et al., "Can H. Aggregates Serve as Light-Harvesting Antennae? Triplet-Triplet Energy Transfer between Excited Aggregates and Monomer Thionine in Aersol-OT Solutions," J. Phys. Chem. B, vol. 103, 1999, pp. 209-215.

Fukagawa et al., "Anthracene derivatives as efficient emitting hosts for blue organic light-emitting diodes utilizing triplet-triplet annihilation." Organic Electronics, vol. 13, 2012, pp. 1197-1203.

International Search Report dated Dec. 17, 2013 issued in Application No. PCT/JP2013/075650.

Kang et al., "Prevention of H-Aggregates Formation in Cy5 Labeled Macromolecules," International Journal of Polymer Science, vol. 2010, Article ID 264781, pp. 1-7.

Kasha, et al., "The Exciton Model in Molecular Spectroscopy," Institute of Molecular Biophysics and Department of Chemistry, Florida State University, Tallahassee, Florida, pp. 371-392.

Tokumaru, Katumi, Tokyo Kagaku Dojin Co., Ltd., "Organic Photochemical Reaction Theory."

* cited by examiner

ORGANIC ELECTROLUMINESCENT ELEMENT

CROSS REFERENCE TO RELATED APPLICATIONS

This application is the National Phase of PCT/JP2013/075650, filed Sep. 24, 2013, which claims priority to Japanese Application No. 2012-221625, filed Oct. 3, 2012.

TECHNICAL FIELD

The present invention relates to an organic electroluminescence device.

BACKGROUND ART

When voltage is applied on an organic electroluminescence device (hereinafter, occasionally referred to as an organic EL device), holes and electrons are respectively injected into an emitting layer from an anode and a cathode. The injected electrons and holes are recombined in an emitting layer to form excitons. Here, according to the electron spin statistics theory, singlet excitons and triplet excitons are generated at a ratio of 25%:75%. In the classification according to the emission principle, in a fluorescent EL device which uses an emission caused by singlet excitons, the limited value of an internal quantum efficiency of the organic EL device is believed to be 25%. On the other hand, in a phosphorescent EL device which uses an emission caused by triplet excitons, it has been known that the internal quantum efficiency can be improved up to 100% when intersystem crossing efficiently occurs from the singlet excitons.

A technology for extending a lifetime of a fluorescent organic EL device has recently been improved and applied to a full-color display of a mobile phone, TV and the like. However, an efficiency of a fluorescent EL device is required to be improved.

Based on such a background, a highly efficient fluorescent organic EL device using delayed fluorescence has been proposed and developed. For instance, Patent Literatures 1 and 2 disclose an organic EL device using TTF (Triplet-Triplet Fusion) mechanism that is one of mechanisms for delayed fluorescence. The TTF mechanism utilizes a phenomenon in which singlet excitons are generated by collision between two triplet excitons.

By using delayed fluorescence by the TTF mechanism, it is considered that an internal quantum efficiency can be theoretically raised up to 40% even in a fluorescent emission. However, as compared with a phosphorescent emission, the fluorescent emission is still problematic on improving efficiency. Accordingly, in order to enhance the internal quantum efficiency, an organic EL device using another delayed fluorescence mechanism has been studied.

For instance, TADF (Thermally Activated Delayed Fluorescence) mechanism is used. The TADF mechanism utilizes a phenomenon in which inverse intersystem crossing from triplet excitons to singlet excitons is generated by using a material having a small energy gap ($\Delta ST$) between the singlet level and the triplet level. An organic EL device using the TADF mechanism is disclosed in, for instance, non-Patent Literature 1. In the organic EL device of non-Patent Literature 1, a compound having a small $\Delta ST$ is used as a dopant material to cause inverse intersystem crossing from the triplet level to the singlet level by heat energy. It is considered that the internal quantum efficiency can be theoretically raised up to 100% even in a fluorescent emission by using delayed fluorescence by the TADF mechanism, Non-Patent Literature 2 discloses an organic EL device having a doped layer in which a specific host material and a specific compound having a spiro skeleton as a dopant material are used. The organic EL device exhibits a high external quantum efficiency with the use of the TADF mechanism.

Non-Patent Literature 3 discloses an organic EL device having a doped layer in which a specific host material and a compound having a triazine derivative skeleton as a dopant material are used. The organic EL device exhibits a high external quantum efficiency with the use of the TADF mechanism.

CITATION LIST

Patent Literature(s)

Patent Literature 1: International Publication No. WO2010/134350
Patent Literature 2: International Publication No. WO2011/070963

Non-Patent Literature(s)

Non-Patent Literature 1: "Expression of Highly-Efficient Thermally-Activated Delayed-Fluorescence and Application thereof to OLED" Organic EL Symposium, proceeding for the tenth meeting edited by Chihaya Adachi et al., pp. 11-12, Jun. 17-18, 2010
Non-Patent Literature 2: "Development of Highly-Efficient Electroluminescence Devices Utilizing Thermally Activated Delayed Fluorescence of Spiro-Structured Molecules" The Chemical Society of Japan, proceeding for the $92^{nd}$ Spring meeting edited by Chihaya Adachi et al., 3M3-37, Mar. 25-28, 2012
Non-Patent Literature 3: "Molecular Design of Triazine Derivatives Having a High Up-conversion Efficiency from Triplet into Singlet Excited States and Their Application to OLEDs" The Chemical Society of Japan, proceeding for the $92^{nd}$ Spring meeting edited by Chihaya Adachi et al., 2PA-126, Mar. 25-28, 2012

SUMMARY OF THE INVENTION

Problems to be Solved by the Invention

Although the organic EL devices disclosed in Non-Patent Literatures 1 to 3 exhibit the maximum luminous efficiency in a range of 0.01 mA/cm$^2$ to 0.1 mA/cm$^2$ of a low current density area, so-called roll-off is generated to decrease a luminous efficiency in a practically high current density area from approximately 1 mA/cm$^2$ to 10 mA/cm$^2$.

Accordingly, it is considered that many practical problems in using delayed fluorescence by the TADF mechanism are left unsolved, among which improvement in the luminous efficiency in the practically high current density area has been particularly demanded.

Non-Patent Literatures 1 and 3 do not disclose an organic EL device having a plurality of emitting layers.

An object of the invention is to provide an organic electroluminescence device efficiently exhibiting a white emission in a practically high current density area.

Means for Solving the Problems

An organic EL device according to an aspect of the invention includes a pair of electrodes and an organic compound layer between the pair of electrodes, a pair of electrodes and an organic compound layer between the pair of electrodes, in which the organic compound layer includes a plurality of emitting layers at least including a first emitting layer and a second emitting layer, the first emitting layer includes a first host material and a fluorescent first luminescent material, the second emitting layer includes a second luminescent material that is different from the first luminescent material, a difference ΔST(H1) between singlet energy EgS(H1) of the first host material and an energy gap $Eg_{77K}(H1)$ at 77[K] of the first host material satisfies a formula (1) below, $$\Delta ST(H1)=EgS(H1)-Eg_{77K}(H1)<0.3 \text{ [eV]} \tag{1}$$

the first luminescent material emits light having a main peak wavelength from 400 nm to less than 500 nm and the second luminescent material emits light having a main peak wavelength from 500 nm to 700 nm, or alternatively, the first luminescent material emits light having a main peak wavelength from 500 nm to 700 nm and the second luminescent material emits light having a main peak wavelength from 400 nm to less than 500 nm.

Herein, fluorescence is an emission caused when a luminescent material is excited and transits from a singlet excited state to a ground state. Phosphorescence is an emission caused when the luminescent material is excited and transits from a triplet excited state to the ground state.

According to the above aspect of the invention, an organic electroluminescence device efficiently exhibiting a white emission in a practically high current density area can be provided.

DESCRIPTION OF EMBODIMENT(S)

Arrangement(s) of Organic EL Device

Figure 1:
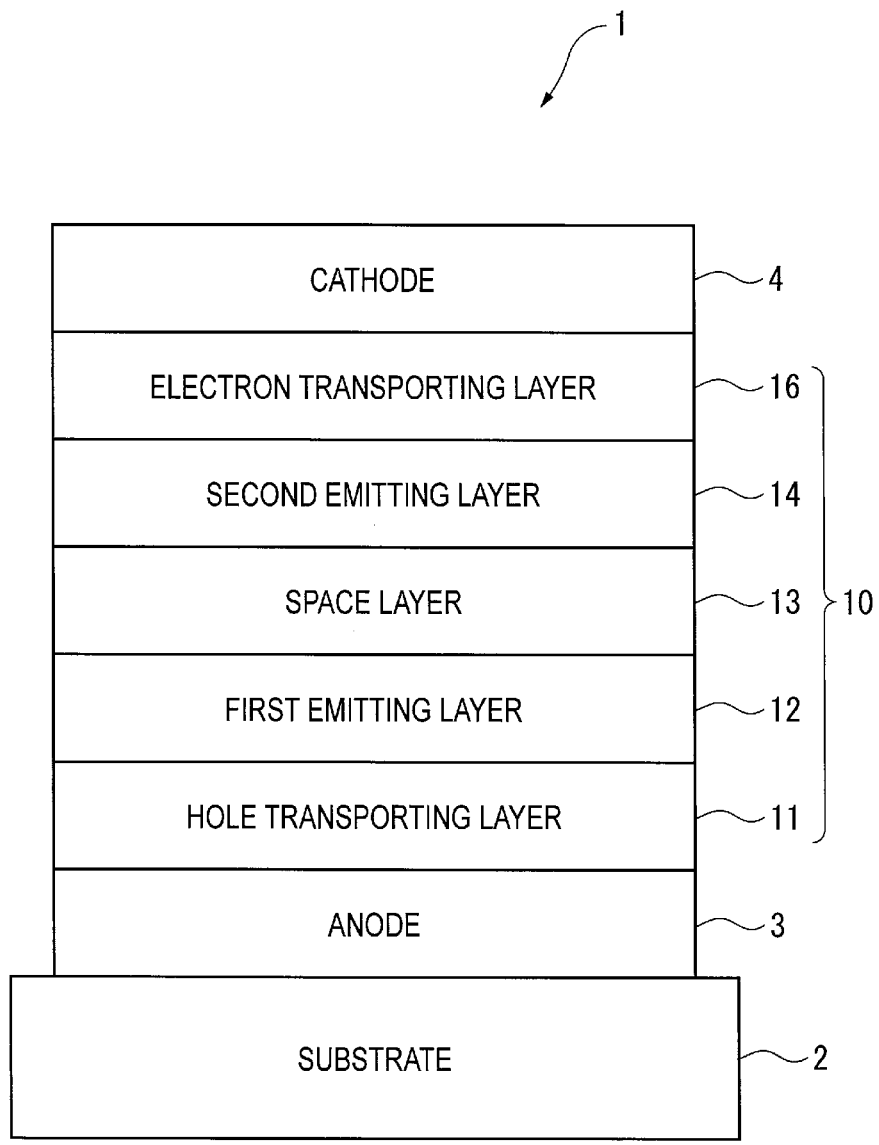
FIG. 1 schematically shows an exemplary arrangement of an organic electroluminescence device according to a first exemplary embodiment of the invention.

Arrangement(s) of an organic EL device according to an exemplary embodiment will be described below.

The organic EL device according to the exemplary embodiment includes a pair of electrodes and an organic compound layer interposed between the pair of electrodes. The organic compound layer includes a plurality of layers formed of an organic compound. The organic compound layer may include an inorganic compound.

The organic compound layer includes a plurality of emitting layers including a first emitting layer and a second emitting layer. The organic compound layer includes a space layer between the first emitting layer and the second emitting layer. The organic compound layer may include a third emitting layer adjacent to the second emitting layer.

In addition, the organic compound layer may include layers applied in a known organic EL device such as a hole injecting layer, a hole transporting layer, an electron injecting layer, an electron transporting layer, a hole blocking layer and an electron blocking layer.

Examples of the arrangement of the organic EL device of the invention include:

(a) anode/first emitting layer/space layer/second emitting layer/cathode;

(b) anode/hole injecting•transporting layer/first emitting layer/space layer/second emitting layer/cathode;

(c) anode/first emitting layer/space layer/second emitting layer/electron injecting•transporting layer/cathode;

(d) anode/hole injecting•transporting layer/first emitting layer/space layer/second emitting layer/electron injecting•transporting layer/cathode;

(e) anode/first emitting layer/space layer/second emitting layer/third emitting layer/cathode;

(f) anode/hole injecting•transporting layer/first emitting layer/space layer/second emitting layer/third emitting layer/cathode;

(g) anode/third emitting layer/first emitting layer/space layer/second emitting layer/electron injecting•transporting layer/cathode;

(h) anode/hole injecting•transporting layer/first emitting layer/space layer/second emitting layer/third emitting layer/electron injecting•transporting layer/cathode;

(i) anode/hole injecting•transporting layer/first emitting layer/space layer/second emitting layer/blocking layer/electron injecting•transporting layer/cathode;
(j) anode/first emitting layer/second emitting layer/cathode;
(k) anode/hole injecting•transporting layer/first emitting layer/second emitting layer/cathode;
(l) anode/first emitting layer/second emitting layer/electron injecting•transporting layer/cathode;
(m) anode/hole injecting•transporting layer/first emitting layer/second emitting layer/electron injecting•transporting layer/cathode;
(n) anode/first emitting layer/second emitting layer/third emitting layer/cathode;
(o) anode/hole injecting•transporting layer/first emitting layer/second emitting layer/third emitting layer/cathode;
(p) anode/third emitting layer/first emitting layer/second emitting layer/electron injecting•transporting layer/cathode;
(q) anode/hole injecting•transporting layer/first emitting layer/second emitting layer/third emitting layer/electron injecting•transporting layer/cathode; and
(r) anode/hole injecting•transporting layer/first emitting layer/second emitting layer/blocking layer/electron injecting•transporting layer/cathode.

Although the arrangements (d), (h), (m) and (q) are preferably used among the above arrangements, the arrangement of the invention is not limited to the above arrangements.

It should be noted that the aforementioned "emitting layer" is an organic layer generally employing a doping system and including a host material and a dopant material. In general, the host material promotes recombination of electrons and holes and transmits exciton energy generated by recombination to the dopant material. The dopant material is preferably a compound having a high quantum yield. The dopant material exhibits a high luminescent performance after receiving exciton energy from the host material.

The "hole injecting•transporting layer" means "at least one of a hole injecting layer and a hole transporting layer" while the "electron injecting•transporting layer" means "at least one of an electron injecting layer and an electron transporting layer." Herein, when the hole injecting layer and the hole transporting layer are provided, the hole injecting layer is preferably adjacent to the anode. When the electron injecting layer and the electron transporting layer are provided, the electron injecting layer is preferably adjacent to the cathode.

In the invention, the electron transporting layer means an organic layer having the highest electron mobility among electron injecting•transporting layer(s) existing between the emitting layer and the cathode. When the electron injecting•transporting layer is provided by a single layer, the single layer is the electron transporting layer. Moreover, in the phosphorescent device, a blocking layer having an electron mobility that is not always high may be provided as shown in the arrangement (i) between the emitting layer and the electron transporting layer in order to prevent diffusion of exciton energy generated in the emitting layer. Thus, the organic layer adjacent to the emitting layer does not always correspond to the electron transporting layer.

First Exemplary Embodiment

FIG. 1 schematically shows an exemplary arrangement of an organic EL device according to a first exemplary embodiment of the invention.

An organic electroluminescence device 1 includes a light-transmissive substrate 2, an anode 3, a cathode 4 and an organic compound layer 10 disposed between the anode 3 and the cathode 4.

The organic compound layer 10 has a hole transporting layer 11, first emitting layer 12, space layer 13, second emitting layer 14, and electron transporting layer 16 sequentially from the anode 3. The layers are adjacent to each other.

Emitting Layer

The organic EL device 1 in the first exemplary embodiment has the first emitting layer 12 and the second emitting layer 14 as the emitting layer. The first emitting layer 12 includes a first host material, second host material, and first dopant material (first luminescent material). The second emitting layer 14 includes a third host material and a second dopant material (second luminescent material).

The organic EL device in the first exemplary embodiment exhibits a white emission as a whole of the device.

In order that the organic EL device exhibits a white emission, a plurality of luminescent materials may be contained in a single emitting layer to cause a white emission, or a plurality of emitting layers that emit lights having different main peak emission wavelengths may be provided and the respective lights therefrom may be mixed by additive color mixing to exhibit a white emission. In order to obtain a white emission by additive color mixing from the plurality of emitting layers that emit lights having different main peak emission wavelengths, for instance, an organic EL device has a red emitting layer, green emitting layer and blue emitting layer or an organic EL device has a yellow emitting layer and blue emitting layer, where the emitting layers are made to emit lights in a well-balanced manner with each other. Here, one emitting layer among the plurality of emitting layers that emit lights having different main peak emission wavelengths may contain a plurality of luminescent compounds. Note that the white emission refers to CIE1931 chromaticity being (CIEx, CIEy)=(0.27, 0.28) to (0.48, 0.44) based on International Energy Star Program 1.1 edition for solid-state illumination.

In the first exemplary embodiment, the first dopant material emits light having a main peak emission wavelength from 400 nm to less than 500 nm and the second dopant material emits light having a main peak emission wavelength from 500 nm to 700 nm, or alternatively, the first dopant material emits light having a main peak emission wavelength from 500 nm to 700 nm and the second dopant material emits light having a main peak emission wavelength from 400 nm to less than 500 nm. In other words, the organic EL device 1 in the first exemplary embodiment has a plurality of emitting layers respectively containing the dopant materials that emit lights having mutually different main peak emission wavelengths. Accordingly, the organic EL device 1 in the first exemplary embodiment exhibits a white emission by additive-color-mixing emissions from two emitting layers that emit lights having different main peak emission wavelengths.

First Emitting Layer

In the first exemplary embodiment, the first host material, second host material and first dopant material which satisfy specific conditions are used in the first emitting layer 12. The above materials and specific conditions will be described below.

In the first emitting layer 12, a difference $\Delta ST(H1)$ between singlet energy $EgS(H1)$ of the first host material and an energy gap $Eg_{77K}(H1)$ at 77[K] of the first host material satisfies a relationship of a numerical formula (1) below.

$$\Delta ST(H1) = EgS(H1) - Eg_{77K}(H1) < 0.3 \text{ [eV]} \quad (1)$$

It is preferable that the singlet energy EgS(H1) of the first host material and singlet energy EgS(D) of the first dopant material satisfy a relationship of a numerical formula (2) below.

$$EgS(H1) > EgS(D) \quad (2)$$

Further, it is preferable that singlet energy EgS(H2) of the second host material and the singlet energy EgS(D) of the first dopant material satisfy a relationship of a numerical formula (3) below.

$$EgS(H2) > EgS(D) \quad (3)$$

Further, it is preferable that an energy gap $Eg_{77K}(H2)$ at 77K of the second host material and an energy gap $Eg_{77K}(D)$ at 77K of the first dopant material satisfy a relationship of a numerical formula (5) below.

$$Eg_{77K}(H2) < Eg_{77K}(D) \quad (5)$$

When the energy gap of the second host material and the energy gap of the first dopant material satisfy the numerical formula (5), energy can be transferred from a triplet level of the first dopant material to a triplet level of the second host material. By this energy transfer, triplet excitons contributing to a later-described TTF mechanism increases in the second host material, whereby the energy can be more efficiently transferred.

It is preferable that an energy gap $Eg_{77K}(H1)$ at 77K of the first host material and the energy gap $Eg_{77K}(H2)$ at 77K of the second host material satisfy a relationship of a numerical formula (6) below.

$$Eg_{77K}(H1) - Eg_{77K}(H2) > 0.5 \ [eV] \quad (6)$$

When the energy gap of the first host material and the energy gap of the second host material satisfy the numerical formula (6), the triplet excitons of the first host material are difficult to transfer from the triplet level of the first host material to the triplet level of the second host material, so that energy transfer from the first host material is suppressible.

The energy gap $Eg_{77K}(H1)$ and the energy gap $Eg_{77K}(H2)$ preferably satisfy a relationship of a numerical formula (6-1) below, particularly preferably a relationship of a numerical formula (6-2) below.

$$Eg_{77K}(H1) - Eg_{77K}(H2) \geq 0.8 \ [eV] \quad (6\text{-}1)$$

$$Eg_{77K}(H1) - Eg_{77K}(H2) \geq 0.9 \ [eV] \quad (6\text{-}2)$$

The energy gap $Eg_{77K}(H1)$ at 77K of the first host material and the energy gap $Eg_{77K}(D)$ at 77K of the first dopant material satisfy a relationship of a numerical formula (7) below.

$$\Delta T = Eg_{77K}(H1) - Eg_{77K}(D) \geq 0.5 \ [eV] \quad (7)$$

When the energy gap of the first host material and the energy gap of the first dopant material satisfy the numerical formula (7), the excitons of the first host material are difficult to transfer from the triplet level of the first host material to the triplet level of the first dopant material, so that energy transfer from the first host material is suppressible.

The energy gap $Eg_{77K}(H1)$ and the energy gap $Eg_{77K}(D)$ preferably satisfy a relationship of a numerical formula (7-1) below, particularly preferably a relationship of a numerical formula (7-2) below.

$$\Delta T = Eg_{77K}(H1) - Eg_{77K}(D) \geq 0.9 \ [eV] \quad (7\text{-}1)$$

$$\Delta T = Eg_{77K}(H1) - Eg_{77K}(D) \geq 1.0 \ [eV] \quad (7\text{-}2)$$

A difference $(Eg_{77K}(H1) - Eg_{77K}(D))$ between the energy gap of the first host material and the energy gap of the first dopant material is represented by $\Delta T$.

First Host Material

ΔST

The organic EL device emits light at a high efficiency in a high current density area by using a compound having a small energy gap (ΔST) between singlet energy EgS and triplet energy EgT as the first host material. The above ΔST(H1) refers to ΔST of the first host material.

From quantum chemical viewpoint, decrease in the energy difference (ΔST) between the singlet energy EgS and the triplet energy EgT can be achieved by a small exchange interaction therebetween. Physical details of the relationship between ΔST and the exchange interaction are exemplarily described in the following:

Document 1: Organic EL Symposium, proceeding for the tenth meeting edited by Chihaya Adachi et al., S2-5, pp. 11-12; and Document 2: Organic Photochemical Reaction Theory edited by Katsumi Tokumaru, Tokyo Kagaku Dojin Co., Ltd. (1973).

Such a material can be synthesized according to molecular design based on quantum calculation. Specifically, the material is a compound in which a LUMO electron orbit and a HOMO electron orbit are localized to avoid overlapping.

Examples of the compound having a small ΔST, which is used as the first host material in the first exemplary embodiment, are compounds in which a donor element is bonded to an acceptor element in a molecule and ΔST is in a range of 0 eV or more and less than 0.3 eV in terms of electrochemical stability (oxidation-reduction stability).

A more preferable compound is such a compound that dipoles formed in the excited state of a molecule interact with each other to form an aggregate having a reduced exchange interaction energy. According to analysis by the inventors, the dipoles are oriented substantially in the same direction in the compound, so that ΔST can be further reduced by the interaction of the molecules. In such a case, ΔST can be extremely small in a range of 0 eV to 0.2 eV.

Aggregate

Figure 2:
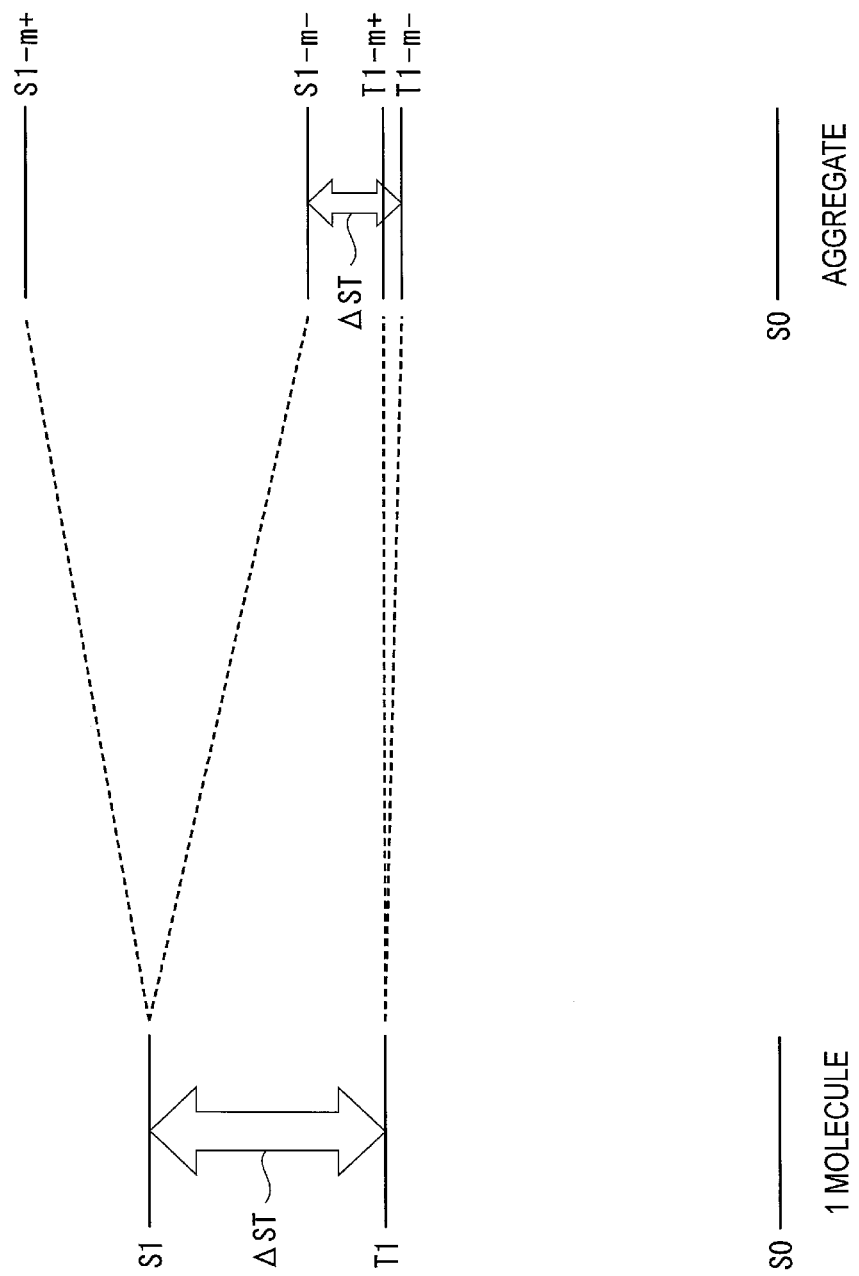
FIG. 2 shows an example of physics models with aggregate formation.

Decrease in the energy gap (ΔST) between the singlet energy EgS and the triplet energy EgT can also be achieved by aggregate formation. Herein, the aggregate does not reflect an electronic state by a single molecule, but the aggregate is provided by several molecules physically approaching each other. After the plurality of molecules approach each other, electronic states of a plurality of molecules are mixed and changed, thereby changing an energy level. A value of singlet energy is decreased, thereby decreasing a value of ΔST. The decrease in the value of ΔST by the aggregate formation can also be explained by Davydov splitting model showing that two molecules approach each other to change electronic states thereof (see FIG. 2). As shown in Davydov splitting model, it is considered that change of the electronic states by two molecules different from change of an electronic state by a single molecule is brought about by two molecules physically approaching each other. A singlet state exists in two states represented by $S1-m^+$ and $S1-m^-$. A triplet state exists in two states represented by $T1-m^+$ and $T1-m^-$. Since $S1-m^-$ and $T1-m^-$ showing a lower energy level exist, ΔST representing a gap between $S1-m^-$ and $T1-m^-$ becomes smaller than that in the electronic state by a single molecule.

The Davydov splitting model is exemplarily described in the following:

Document 3: J. Kang, et al, International Journal of Polymer Science, Volume 2010, Article ID 264781;

Document 4: M. Kasha, et al, Pure and Applied Chemistry, Vol. 11, p 371, 1965; and Document 5: S. Das, et al, J. Phys. Chem. B. vol. 103, p 209, 1999.

The inventors found usage of sublevels of a singlet state and a triplet state of a compound easily forming an aggregate in a thin film, and consequent possibility of promotion of inverse intersystem crossing by molecules and aggregates in the thin film.

For instance, a compound having a large half bandwidth of a photoluminescence spectrum is considered to easily form an aggregate in a thin film of the compound. A relationship between the half bandwidth of the photoluminescence spectrum and easy formability of the aggregate can be estimated as follows.

In a compound having a property of typically existing as a single molecule without forming an aggregate, a vibrational level is less recognized in the singlet state, so that a narrow half bandwidth of the photoluminescence spectrum is observed. For instance, CBP (4,4'-bis[9-dicarbazolyl]-2, 2'-biphenyl) exhibits a property to typically exist as a single molecule, in which a half bandwidth of a photoluminescence spectrum is about 50 nm.

On the other hand, in the compound easily forming the aggregate, a plurality of molecules electronically influence each other, whereby a lot of vibrational levels exist in the singlet state. As a result, since the vibrational levels of the singlet state are often relaxed to the ground state, the half bandwidth of the photoluminescence spectrum is increased.

Such a compound easily forming the aggregate is expected to have a lot of vibrational levels even in a triplet state. Consequently, it is speculated that $\Delta ST$ in relation to heat is decreased through the sublevels to promote the inverse intersystem crossing, since a lot of sublevels exist between the singlet state and the triplet state.

It should be noted that the aggregate means that a single molecule forms any aggregate with another single molecule. In other words, a specific aggregate state is not shown in the exemplary embodiment. An aggregate state of an organic molecule is probably formable in various states in a thin film, which is different from an aggregate state of an inorganic molecule.

TADF Mechanism

As described above, when $\Delta ST(H1)$ of the organic material is small, inverse intersystem crossing from the triplet level of the first host material to the singlet level thereof is easily caused by heat energy given from the outside. Herein, an energy state conversion mechanism to perform spin exchange from the triplet state of electrically excited excitons within the organic EL device to the singlet state by inverse intersystem crossing is referred to as TADF Mechanism.

In the first exemplary embodiment, since the material having a small $\Delta ST(H1)$ is used as the first host material, inverse intersystem crossing from the triplet level of the first host material to the singlet level thereof is easily caused by heat energy given from the outside.

Figure 3:
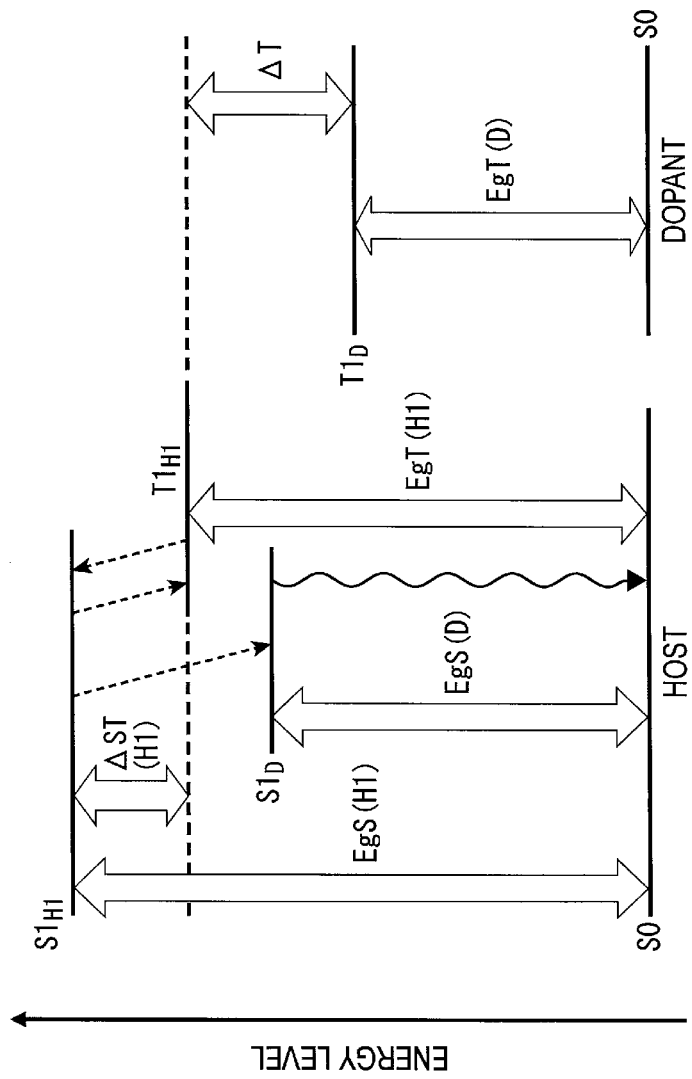
FIG. 3 shows a relationship between energy levels of a host material and a dopant material in an emitting layer.

FIG. 3 shows a relationship in energy level between the first host material and the first dopant material in the emitting layer. In FIG. 3, S0 represents a ground state, $S1_{H1}$ represents a lowest singlet state of the first host material, $T1_{H1}$ represents a lowest triplet state of the first host material, $S1_D$ represents a lowest singlet state of the first dopant material, and $T1_D$ represents a lowest triplet state of the first dopant material. As shown in FIG. 3, a difference between $S1_{H1}$ and $T1_{H1}$ corresponds to $\Delta ST(H1)$, a difference between $S1_{H1}$ and S0 corresponds to EgS(H1), a difference between $S1_D$ and S0 corresponds to EgS(D), and a difference between $T1_{H1}$ and $T1_D$ corresponds to $\Delta T$. A dotted-line arrow shows energy transfer between the respective excited states in FIG. 3.

As described above, a compound having a small $\Delta ST(H1)$ is selected as the compound used for the first host material in the first exemplary embodiment. This is because the material having a small $\Delta ST(H1)$ is considered to easily cause inverse intersystem crossing from the triplet excitons generated in the lowest triplet state $T1_{H1}$ to the lowest singlet state $S1_{H1}$ of the first host material by heat energy. Due to the small $\Delta ST(H1)$, inverse intersystem crossing is easily caused, for instance, even around a room temperature. When the inverse intersystem crossing is thus easily caused, a ratio of energy transfer from the host material to the lowest singlet state $S1_D$ of the fluorescent first dopant material is increased by Förster transfer, resulting in improvement in a luminous efficiency of a fluorescent organic EL device.

In other words, use of the compound having a small $\Delta ST(H1)$ as the first host material increases an emission by the TADF mechanism, so that a delayed fluorescence ratio becomes large. When the delayed fluorescence ratio is large, a high internal quantum efficiency is achievable. It is considered that the internal quantum efficiency can be theoretically raised up to 100% even by using delayed fluorescence by the TADF mechanism.

Figure 4:
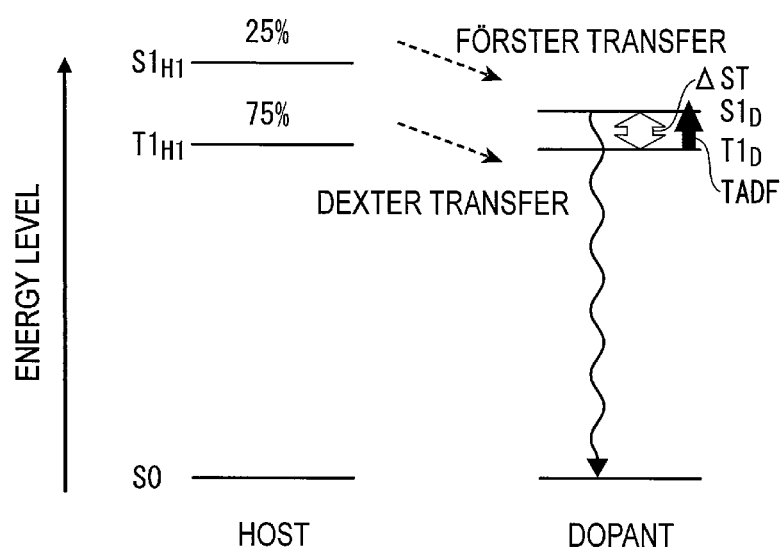
FIG. 4 shows a relationship between energy levels of a host material and a dopant material in the emitting layer.

FIG. 4 shows a relationship in energy level between the first host material and the first dopant material in the emitting layer in the TADF mechanism described in Patent Literature 1. In FIG. 4, S0, $S1_{H1}$, $T1_{H1}$, $S1_D$, and $T1_D$ represent the same as those in FIG. 3. A dotted-line arrow shows energy transfer between the respective excited states. As shown in FIG. 4, a material having a small $\Delta ST(D)$ is used as the first dopant material in the TADF mechanism described in Non-Patent Literature 1. Accordingly, energy is transferred from the lowest triplet state $T1_{H1}$ of the first host material to the lowest singlet state $S1_D$ or the lowest triplet state $T1_D$ of the first dopant material by Dexter transfer. Further, inverse intersystem crossing from the lowest triplet state $T1_D$ to the lowest singlet state $S1_D$ of the first dopant material is possible by heat energy. As a result, a fluorescent emission from the lowest single state $S1_D$ of the first dopant material can be observed. It is considered that the internal quantum efficiency can be theoretically raised up to 100% also by using delayed fluorescence by the TADF mechanism.

The inventors herein employ a fluorescent compound having a small $\Delta ST(H1)$ as described in Non-Patent Literature 1 as the first host material in a host-dopant system. The reasons are detailed as follows.

First, considering conversion of energy states on the first dopant material by the TADF mechanism, the first dopant material has a relatively high singlet energy for the fluorescent emission and triplet energy approximately equivalent to the singlet energy. In order to efficiently trap the triplet energy within the emitting layer, it is necessary to select the first host material having larger triplet energy. If a typical organic material usually having a large $\Delta ST$ is used as the first host material, the singlet energy of the first host material, i.e., an energy gap between a HOMO level and a LUMO level becomes extremely large. As a result, an energy gap between the first host material and a carrier transporting layer adjacent to the emitting layer becomes large, so that injection of carriers to the emitting layer is considered to become difficult. Accordingly, the inventors consider that conversion of the energy states by the TADF mechanism is preferably performed on the first host material, whereby the carriers are advantageously injected to the emitting layer and are easily balanced in the entire organic EL device.

Secondly, the inventors believe it possible to suppress decrease in a luminous efficiency caused by Triplet-Triplet-Annihilation in a high current density area by using the fluorescent compound having a small $\Delta ST(H1)$ as the first host material. Herein, Triplet-Triplet-Annihilation (hereinafter, referred to as TTA) is a physical phenomenon in which long-life triplet excitons generated on a molecule are adjacent to each other at a high density to collide with each other and is thermally deactivated.

The inventors believe it possible to suppress decrease in the luminous efficiency in the high current density area to some extent in the host-dopant system in which the triplet energy is difficult to transit from the first host material to the first dopant material. In the exemplary embodiment, the compound having a small $\Delta ST$ is used as the first host material of the emitting layer. After inverse intersystem crossing from a triplet excited level of the first host material to a singlet excited level thereof by the TADF mechanism, energy is transferred to a singlet excited level of the first dopant material. Accordingly, the generated triplet excitons are kept in a triplet excited state on the first host material whose abundance ratio is high in the emitting layer. On the other hand, if the compound having a small $\Delta ST$ is used as the first dopant material in the emitting layer, the generated triplet excitons are kept in a triplet excited state on the first dopant material whose abundance ratio is extremely low in the emitting layer. In other words, the inventors believe it preferable to design a system that avoids concentration of triplet excited state on the first dopant material in driving the organic EL device in the high current density area. Accordingly, in the exemplary embodiment, the inventors employ the material having a small $\Delta ST(H1)$ as the first host material.

Thirdly, a material having a high emission quantum efficiency can be easily selected as the first dopant material by using a material causing inverse intersystem crossing from the triplet level to the singlet level as the first host material. As a result, an emission of the singlet excitons is quickly relaxed after energy transfer thereof to the first dopant material, so that energy quenching in the high current density area is suppressible. In the host-dopant system in a fluorescent device, generally, the first host material has a carrier transporting function and an exciton generating function and the first dopant material has an emission function. This system is for separating the carrier transporting function and the emission function of the emitting layer. Accordingly, an effective organic EL emission is promoted by doping a small amount of the first dopant material having a high emission quantum efficiency into the emitting layer. The first emitting layer according to the exemplary embodiment is required to have a function to cause inverse intersystem crossing by the TADF function in addition to a typical function of the emitting layer. By requiring the first host material to have the function to cause inverse intersystem crossing by the TADF mechanism, the inventors increased options for the first dopant material having a high emission quantum efficiency which largely contributes to the luminous efficiency of the organic EL device. With this arrangement, a fluorescent first dopant material typically known as being highly efficient can be selected.

Relationship Between EgT and $Eg_{77K}$

In this exemplary embodiment, the compound having $\Delta ST$ of a predetermined value or less is used. The aforementioned triplet energy EgT is different from a typically defined triplet energy. Such a difference will be described below.

For general measurement of the triplet energy, a target compound to be measured is dissolved in a solvent to form a sample. A phosphorescent spectrum (ordinate axis: phosphorescent luminous intensity, abscissa axis: wavelength) of the sample is measured at a low temperature (77K). A tangent is drawn to the rise of the phosphorescent spectrum on the short-wavelength side. The triplet energy is calculated by a predetermined conversion equation based on a wavelength value at an intersection of the tangent and the abscissa axis.

As described above, the compound for the first host material in the exemplary embodiment has a small $\Delta ST$. When $\Delta ST$ is small, intersystem crossing and inverse intersystem crossing are likely to occur even at a low temperature (77K), so that the singlet state and the triplet state coexist. As a result, the spectrum to be measured in the same manner as the above includes emissions from both the singlet state and the triplet state. Although it is difficult to distinguish the emission from the singlet state from the emission from the triplet state, the value of the triplet energy is basically considered dominant.

Accordingly, in order to distinguish the triplet energy EgT in the exemplary embodiment from the typical triplet energy EgT in a strict meaning although the measurement method is the same, the triplet energy EgT in the exemplary embodiment is defined as follows. A target compound to be measured is dissolved in a solvent to form a sample. A phosphorescent spectrum (ordinate axis: phosphorescent luminous intensity, abscissa axis: wavelength) of the sample is measured at a low temperature (77K). A tangent is drawn to the rise of the phosphorescent spectrum on the short-wavelength side. Energy is calculated as an energy gap $Eg_{77K}$ by a predetermined conversion equation based on a wavelength value at an intersection of the tangent and the abscissa axis. $\Delta ST$ is defined as a difference between the singlet energy EgS and the energy gap $Eg_{77K}$. Accordingly, $\Delta ST(H1)$ is represented by the formula (1).

The triplet energy measured in a solution state may include an error by interaction between the target molecule and the solvent. Accordingly, as an ideal condition, a measurement in a thin film state is desired in order to avoid the interaction between the target molecule and the solvent. However, the molecule of the compound used as the first host material in this exemplary embodiment exhibits a photoluminescence spectrum having a broad half bandwidth in a solution state, which strongly implies aggregate formation also in the solution state. Accordingly, since the solution state is considered to be under the same conditions as in a thin film state, a measurement value of the triplet energy in the solution state is used in this exemplary embodiment.

Singlet Energy EgS

The singlet energy EgS in the exemplary embodiment is defined based on calculation by a typical method. Specifically, the target compound is evaporated and deposited on a quartz substrate to prepare a sample. An absorption spectrum (ordinate axis: absorbance, abscissa axis: wavelength) of the sample is measured at a normal temperature (300K). A tangent is drawn to the rise of the absorption spectrum on the long-wavelength side. The singlet energy EgS is calculated by a predetermined conversion equation based on the tangent and the wavelength value at the intersection. EgS in aggregate formation corresponds to an energy gap between $S1-m^-$ and the ground state S0 in the Davydov splitting model.

The calculation of the singlet energy EgS and the energy gap $Eg_{77K}$ will be described in detail later.

Delayed Fluorescence Ratio

A delayed fluorescence ratio of the first emitting layer according to the organic EL device of the exemplary embodiment exceeds the theoretical upper-limit of a delayed fluorescence ratio (TTF ratio) of a case where it is assumed that delayed fluorescence is caused only by the TTF mechanism. In other words, according to the exemplary embodiment, an organic EL device having a higher internal quantum efficiency is achievable.

The delayed fluorescence ratio is measurable by a transitional EL method. The transitional EL method is for measuring reduction behavior (transitional property) of EL emission after pulse voltage applied on the device is removed. EL luminous intensity is classified into a luminescence component from singlet excitons generated in first recombination and a luminescence component from singlet excitons generated through triplet excitons. Since lifetime of the singlet excitons generated in the first recombination is very short at a nano-second order, an emission from the singlet excitons generated in the first recombination is rapidly reduced after removal of pulse voltage.

On the other hand, since delayed fluorescence provides an emission from singlet excitons generated through long-life triplet excitons, EL emission is gradually reduced. Thus, since there is a large difference in time between the emission from the singlet excitons generated in the first recombination and the emission from the singlet excitons derived from the triplet excitons, a luminous intensity derived from delayed fluorescence is obtainable. Specifically, the luminous intensity can be determined by the following method.

Figure 5:
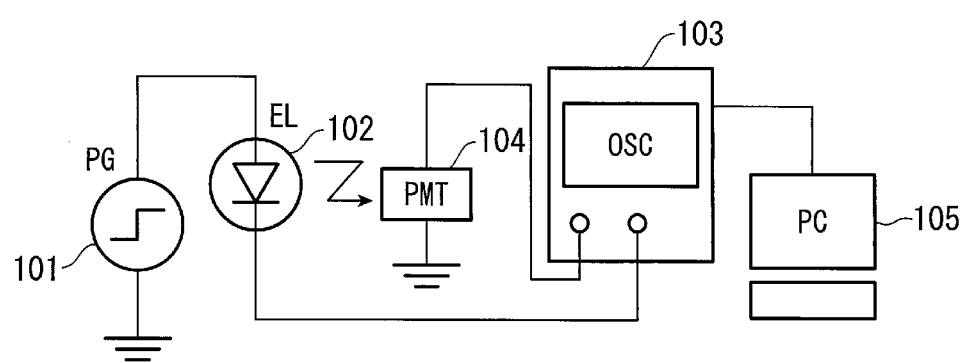
FIG. 5 shows a measurement system of transitional EL waves.

Transitional EL waveform is measured as follows (see FIG. 5). Pulse voltage waveform outputted from a voltage pulse generator (PG) 101 is applied on an organic EL device (EL) 102. The applied voltage waveform is loaded in an oscilloscope (OSC) 103. When pulse voltage is applied on the organic EL device 102, the organic EL device 102 generates a pulse emission. This emission is loaded in the oscilloscope (OSC) 103 through a photomultiplier (PMT) 104. The voltage waveform and the pulse emission are synchronized and loaded in a personal computer (PC) 105.

The ratio of luminous intensity derived from delayed fluorescence is defined as follows based on analysis of the transitional EL waveform. It should be noted that a formula to calculate a TTF ratio described in International Publication No. WO2010/134352 may be used for calculation of the ratio of luminous intensity derived from delayed fluorescence.

It is considered that a delayed fluorescence component defined in the exemplary embodiment includes thermally activated delayed fluorescence (TADF mechanism) in addition to the luminescence component derived from TTF. For this reason, in the exemplary embodiment, a ratio of the delayed fluorescence component calculated according to the following formula (14) is referred to as a delayed fluorescence ratio, not as a TTF ratio.

The delayed fluorescence ratio is calculated according to a numerical formula (14) below.

[Numerical Formula 1]

$$\frac{1}{\sqrt{I}} \propto A + \gamma \cdot t \quad (14)$$

In the formula (14), I represents luminous intensity derived from delayed fluorescence. A represents a constant. The measured transitional EL waveform data is fit in the formula (14) to obtain the constant A. Here, a luminous intensity $1/A^2$ at the time t=0 when pulse voltage is removed is defined as the ratio of luminous intensity derived from delayed fluorescence.

Figure 6A:
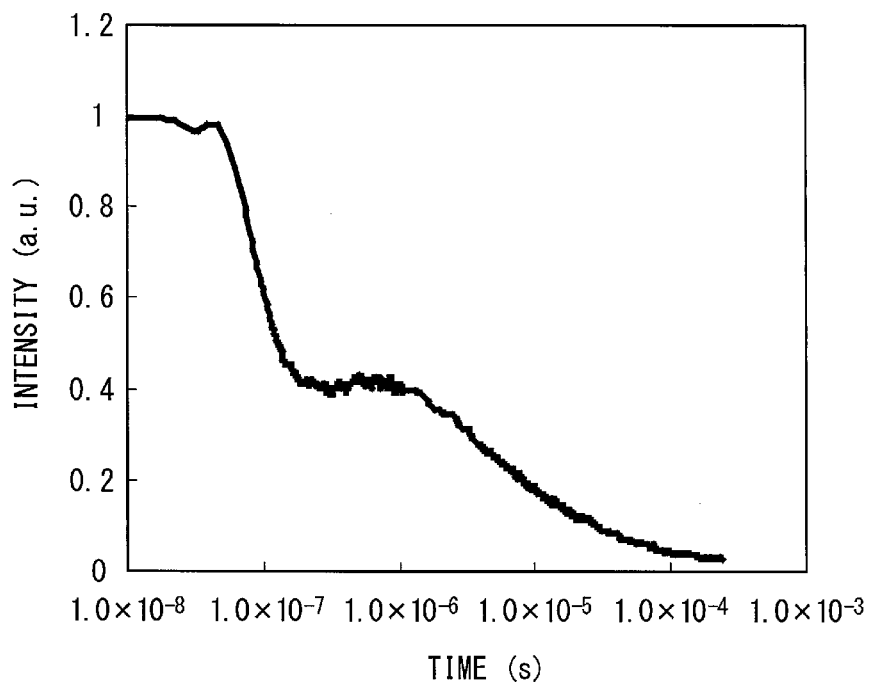
FIG. 6A shows a measurement method of a ratio of luminous intensities derived from delayed fluorescence and is a graph showing time-varying luminous intensities of the EL device.

A graph of FIG. 6A shows a measurement example where a predetermined pulse voltage is applied on the organic EL device and then the pulse voltage is removed and shows time-varying luminous intensities of the organic EL device.

The pulse voltage was removed at the time of about $3 \times 10^{-8}$ seconds in the graph of FIG. 6A. In the graph of FIG. 6A, the luminous intensity when the voltage is removed is defined as 1.

After rapid reduction before the elapse of about $2 \times 10^{-7}$ seconds after the voltage removal, a gradual reduction component appears.

Figure 6B:
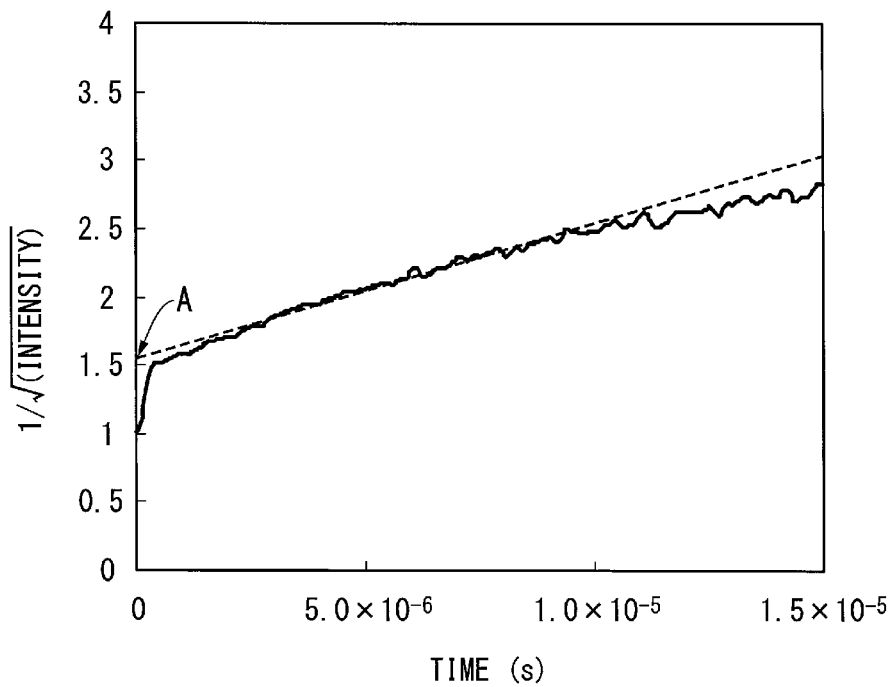
FIG. 6B shows a measurement method of a ratio of luminous intensities derived from delayed fluorescence and is a graph showing time-varying inverse square root of luminous intensities.

In the graph of FIG. 6B, the voltage removal time is a starting point and the inverse square root of luminous intensity before the elapse of $1.5 \times 10^{-5}$ seconds after voltage removal is plotted. Fitting is conducted as follows.

A value at an intersection A of the ordinate axis and the linear line extended to the starting point is 1.55. Accordingly, the ratio of luminous intensity derived from the delayed fluorescence obtained from the transitional EL waveform is $1/(1.55)^2 = 0.41$, which means 41% of the luminous intensity is derived from the delayed fluorescence. In other words, the ratio of luminous intensity exceeds 37.5%, i.e., the supposed theoretical upper-limit of the TTF ratio.

The luminous intensity derived from the delayed fluorescence obtained from the transitional EL waveform is variable in accordance with measurement temperatures. Such a phenomenon is considered to be inherent mostly in a fluorescent emission by the TADF mechanism The luminous intensity is preferably fitted in a linear line by the method of least squares.

In this case, the luminous intensity before the elapse of $10^{-5}$ seconds is preferably fitted.

Figure 7:
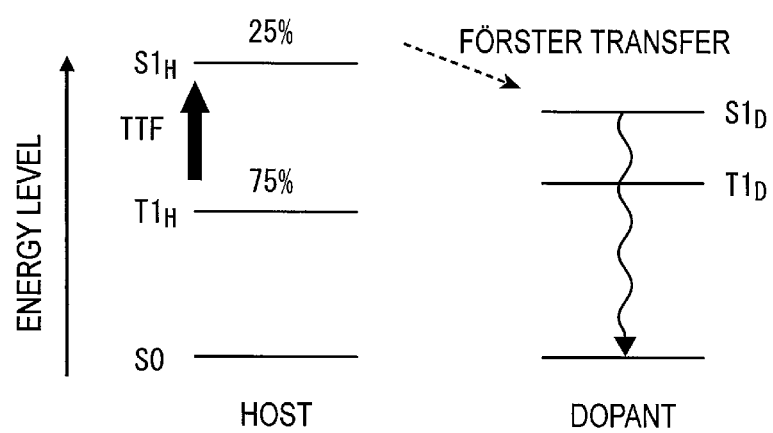
FIG. 7 shows a relationship between energy levels of a host material and a dopant material in the emitting layer.

The TTF mechanism having an emission mechanism by delayed fluorescence will be described using FIG. 7. FIG. 7 shows a relationship in energy level between the host material and the dopant material in an organic EL device using the TTF mechanism. In FIG. 7, S0, $S1_H$, $T1_H$, $S1_D$ and $T1_D$ represent the same as those in FIG. 3. An arrow shows energy transfer between the respective excited states in FIG. 7.

As described above, the TTF mechanism utilizes a phenomenon in which singlet excitons are generated by collision between two triplet excitons. As shown in FIG. 7, it is preferable that the lowest triplet state $T1_H$ of the host material is lower than the lowest triplet state $T1_D$ of the dopant material, so that triplet excitons concentrate on molecules of the host material. The triplet excitons efficiently collide with each other in accordance with increase in the density of the triplet excitons, whereby the triplet excitons are partially changed into singlet excitons. The lowest singlet state $S1_H$ of the host material generated by the TTF mechanism is immediately transferred to the lowest singlet state $S1_D$ of the dopant material by Förster transfer, so that the dopant material emits fluorescence.

The theoretical upper-limit of the TTF ratio can be obtained as follows.

According to S. M. Bachilo et al. (J. Phys. Chem. A, 104, 7711 (2000)), assuming that high-order excitons such as quintet excitons are quickly returned to triplet excitons, triplet excitons (hereinafter abbreviated as $^3A^*$) collide with one another when the density thereof is increased, whereby a reaction shown by the following numerical formula (15) occurs. In the formula, $^1A$ represents the ground state and $^1A^*$ represents the lowest singlet excitons.

[Numerical Formula 2]

$$^3A^* + {}^3A^* \rightarrow (4/9)^1A + (1/9)^1A^* + (13/9)^3A^* \quad (15)$$

In short, $5\,^3A^* \to 4\,^1A + {}^1A^*$

It is expected that, among triplet excitons initially generated, which account for 75%, one fifth thereof (i.e., 20%) is changed to singlet excitons.

Accordingly, the amount of the singlet excitons which contributes to emission is 40%, which is a value obtained by adding 15% (75%×(⅕)=15%) to 25%, which is the amount ratio of initially generated singlet excitons.

At this time, a ratio of luminous intensity derived from TTF (TTF ratio) relative to the total luminous intensity is 15/40, i.e., 37.5%. Thus, it is recognized that the delayed fluorescence ratio of the organic EL device described above exceeds the theoretical upper-limit of only the TTF ratio.

Residual Strength Ratio in 1 μs

A method for relatively measuring an amount of delayed fluorescence is exemplified by a method for measuring a residual strength in 1 μs. The residual strength in 1 μs is defined as a ratio of a luminous intensity after the elapse of 1 μs after removal of a pulse voltage measured by a transitional EL method to a luminous intensity at the time of the removal of the pulse voltage. The relative amount of delayed fluorescence can be estimated based on reduction behavior of EL emission after the removal of the pulse voltage measured by the transitional EL method. The residual strength ratio in 1 μs can be obtained by reading luminous intensity at the time of 1.0 μs in the graph of FIG. 6A.

The residual strength ratio in 1 us is preferably larger than 36.0%, more preferably 38.0 or more.

ΔT

In the exemplary embodiment, it is preferable that a difference ΔT between triplet energy $Eg_{77K}(H1)$ of the first host material and triplet energy $Eg_{77K}(D)$ of the first dopant material satisfies a relationship represented by the numerical formula (7). ΔT is preferably more than 0.5 eV, more preferably 0.8 eV or more, further preferably 1.0 eV or more.

When ΔT satisfies the relationship represented by the numerical formula (7), energy of the triplet excitons generated by recombination on the first host material becomes difficult to transfer to the triplet level of the first dopant material, and thermal deactivation of the triplet excitons becomes difficult. Consequently, the first dopant efficiently emits fluorescence.

Compound to be Used as First Host Material

In a combination with the second host material and the first dopant material, the first host material satisfying the numerical formulae (1) to (2) and (6) to (7) is preferably selected from a carbazole derivative, a biscarbazole derivative, an indolocarbazole derivative, an acridine derivative, an oxazine derivative, a pyrazine derivative, a pyrimidine derivative, a triazine derivative, a dibenzofuran derivative, a dibenzothiophene derivative and the like. These derivatives may have a substituent as needed.

Examples of the substituent include an alkyl group having 6 to 40 carbon atoms, a heterocyclic group having 2 to 40 carbon atoms, a trialkylsilyl group, dialkylarylsilyl group, an alkyldiarylsilyl group, a triarylsilyl group, a fluorine atom, and a cyano group. The trialkylsilyl group, the dialkylarylsilyl group, the alkyldiarylsilyl group, and the triarylsilyl group as the substituent contain at least one of an alkyl group having 1 to 30 carbon atoms and an aryl group having 6 to 30 carbon atoms. Note that the aryl group as the substituent also encompasses a fused aromatic hydrocarbon group and the heterocyclic group also encompasses a fused aromatic heterocyclic group.

The host material is preferably a compound including bonding between at least one selected from a carbazole structure, a biscarbazole structure, an indolocarbazole structure, and an acridine structure and at least one selected from an oxazine structure, a pyrazine structure, a pyrimidine structure, a triazine structure, and a dibenzofuran structure.

Bonding between these structures means bonding by various linking groups. Preferable examples of the linking group are a single bond, a phenylene structure and metabiphenylene structure.

In the exemplary embodiment, the carbazole structure, the indolocarbazole structure, the acridine structure, the oxadine structure, the pyrazine structure, the pyrimidine structure, the triazine structure, and the dibenzofuran structure respectively refer to cyclic structures containing indolocarbazole, acridine, oxadine, pyrazine, pyrimidine, triazine, and dibenzofuran as a partial structure.

The carbazole structure, the biscarbazole structure, the indolocarbazole structure, the acridine structure, the oxazine structure, the pyrazine structure, the pyrimidine structure, the triazine structure, and the dibenzofuran structure may have a substituent as needed.

Examples of the substituent therefor include an alkyl group having 6 to 40 carbon atoms, a heterocyclic group having 2 to 40 carbon atoms, a trialkylsilyl group, dialkylarylsilyl group, an alkyldiarylsilyl group, a triarylsilyl group, a fluorine atom, and a cyano group. The trialkylsilyl group, the dialkylarylsilyl group, the alkyldiarylsilyl group, and the triarylsilyl group as the substituent contain at least one of an alkyl group having 1 to 30 carbon atoms and an aryl group having 6 to 30 carbon atoms.

In the exemplary embodiment, a "hydrogen atom" means isotopes having different neutron numbers and specifically encompasses protium, deuterium and tritium.

Since the first host material is a compound in which a donor element is bonded to an acceptor element in a molecule, the first host material is preferably a biscarbazole derivative represented by a formula (101) below.

[Formula 1]

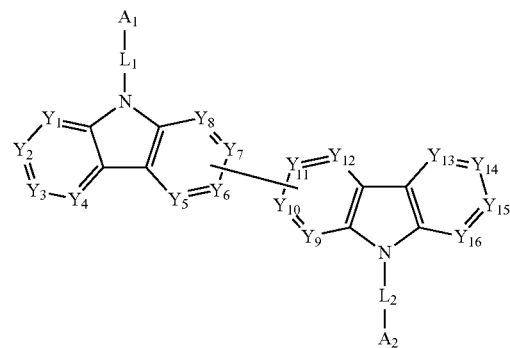

(101)

In the above formula (101), $A_1$ and $A_2$ each independently represent a hydrogen atom, a halogen atom, a cyano group, a substituted or unsubstituted aromatic hydrocarbon group having 6 to 30 atoms for forming a ring (hereinafter, referred to as "ring atoms"), a substituted or unsubstituted aromatic heterocyclic group having 2 to 30 carbon atoms for forming a ring (hereinafter, referred to as "ring carbon atoms"), a substituted or unsubstituted alkyl group having 1 to 30 carbon atoms, a substituted or unsubstituted cycloalkyl group having 3 to 30 ring carbon atoms, a substituted or unsubstituted alkoxy group having 1 to 30 carbon atoms, a substituted or unsubstituted aralkyl group having 7 to 30 carbon atoms, a substituted or unsubstituted aryloxy group having 6 to 30 ring carbon atoms, or a substituted or unsubstituted silyl group.

However, it is preferable that at least one of $A_1$ and $A_2$ is a cyano group.

Note that, in $A_1$ and $A_2$, the aromatic hydrocarbon group also encompasses a fused aromatic hydrocarbon group and the aromatic heterocyclic group also encompasses a fused aromatic heterocyclic group.

In the above formula (101), $Y_1$ to $Y_4$ and $Y_{13}$ to $Y_{16}$ independently represent C(R) or a nitrogen atom. $Y_5$ to $Y_8$ independently represent C(R), a nitrogen atom or a carbon atom to be bonded to one of $Y_9$ to $Y_{12}$. $Y_9$ to $Y_{12}$ independently represent C(R), a nitrogen atom or a carbon atom to be bonded to one of $Y_5$ to $Y_8$. R independently represents a hydrogen atom or a substituent. The substituent in R represents the same as the substituent described in relation to the above first host material.

$L_1$ and $L_2$ in the above formula (101) each independently represent a single bond, a substituted or unsubstituted divalent aromatic hydrocarbon group having 6 to 30 ring carbon atoms, a substituted or unsubstituted divalent aromatic heterocyclic group having 2 to 30 ring carbon atoms, or a group formed by bonding the above divalent aromatic hydrocarbon group and the above divalent aromatic heterocyclic group.

Note that, in $L_1$ and $L_2$, the aromatic hydrocarbon group also encompasses a fused aromatic hydrocarbon group and the aromatic heterocyclic group also encompasses a fused aromatic heterocyclic group.

At least one of $L_1$ and $L_2$ is preferably represented by a formula (a) below.

[Formula 2]

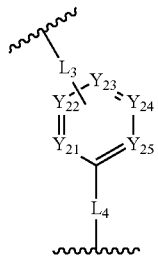

(a)

In the above formula (a), $Y_{21}$ to $Y_{25}$ each independently represent $C(R_a)$, a nitrogen atom or a carbon atom to be bonded to $L_3$, in which $R_a$ each independently represents a hydrogen atom or a substituent. The substituent in $R_a$ represents the same as the substituent described in relation to the above first host material.

$L_3$ and $L_4$ in the above formula (a) each independently represent a single bond, a substituted or unsubstituted divalent aromatic hydrocarbon group having 6 to 30 ring carbon atoms, a substituted or unsubstituted divalent aromatic heterocyclic group having 2 to 30 ring carbon atoms, or a group formed by bonding the above divalent aromatic hydrocarbon group and the above divalent aromatic heterocyclic group.

Note that, in $L_3$ and $L_4$, the aromatic hydrocarbon group also encompasses a fused aromatic hydrocarbon group and the aromatic heterocyclic group also encompasses a fused aromatic heterocyclic group.

Second Host Material

The second host material in the exemplary embodiment is a compound having a fused aromatic hydrocarbon group having 10 to 30 ring carbon atoms or a fused aromatic heterocyclic group having 8 to 30 ring atoms.

The second host material is exemplified by an anthracene derivative represented by a formula (20A), (20B), (20C), (20D) or (20E) below. However, the invention is not limited by the anthracene derivative having these structures.

[Formula 3]

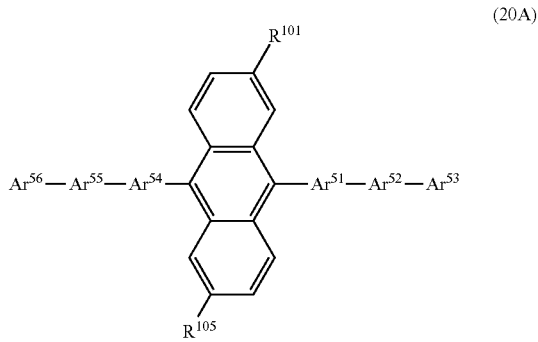

(20A)

In the formula (20A), $R^{101}$ and $R^{105}$ each independently represent a hydrogen atom, halogen atom, cyano group, substituted or unsubstituted monocyclic group having 5 to 30 ring atoms, substituted or unsubstituted fused cyclic group having 8 to 30 ring atoms, a group provided by combining a monocyclic group and a fused cyclic group, substituted or unsubstituted alkyl group having 1 to 30 carbon atoms, substituted or unsubstituted cycloalkyl group having 3 to 30 ring carbon atoms, substituted or unsubstituted alkoxy group having 1 to 30 carbon atoms, substituted or unsubstituted aralkyl group having 7 to 30 carbon atoms, substituted or unsubstituted aryloxy group having 6 to 30 ring carbon atoms, or substituted or unsubstituted silyl group.

In the formula (20A), $Ar^{51}$ and $Ar^{54}$ each independently represent a substituted or unsubstituted divalent monocyclic residue having 5 to 30 ring atoms, or substituted or unsubstituted divalent fused cyclic residue having 8 to 30 ring atoms.

In the formula (20A), $Ar^{52}$ and $Ar^{55}$ each independently represent a single bond, substituted or unsubstituted divalent monocyclic residue having 5 to 30 ring atoms, or substituted or unsubstituted divalent fused cyclic residue having 8 to 30 ring atoms.

In the formula (20A), $Ar^{53}$ and $Ar^{56}$ each independently represent a hydrogen atom, substituted or unsubstituted monocyclic group having 5 to 30 ring atoms, or substituted or unsubstituted fused cyclic group having 8 to 30 ring atoms.

[Formula 4]

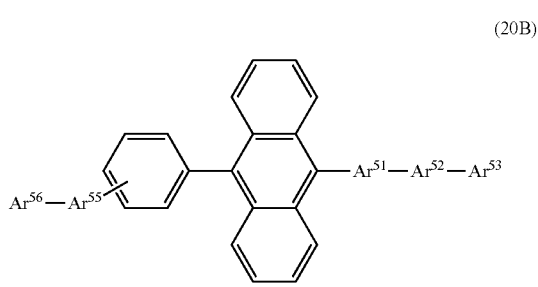

(20B)

In the formula (20B), $Ar^{51}$ represents a substituted or unsubstituted divalent monocyclic residue having 5 to 30 ring atoms, or substituted or unsubstituted divalent fused cyclic residue having 8 to 30 ring atoms.

In the formula (20B), $Ar^{52}$ and $Ar^{55}$ each independently represent a single bond, substituted or unsubstituted divalent monocyclic residue having 5 to 30 ring atoms, or substituted or unsubstituted divalent fused cyclic residue having 8 to 30 ring atoms.

In the formula (20B), $Ar^{53}$ and $Ar^{56}$ each independently represent a hydrogen atom, substituted or unsubstituted monocyclic group having 5 to 30 ring atoms, or substituted or unsubstituted fused cyclic group having 8 to 30 ring atoms.

[Formula 5]

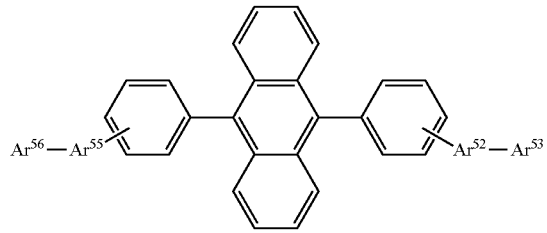

(20C)

In the formula (20C), $Ar^{52}$ represents a substituted or unsubstituted divalent monocyclic residue having 5 to 30 ring atoms, or substituted or unsubstituted divalent fused cyclic residue having 8 to 30 ring atoms.

In the formula (20C), $Ar^{55}$ represents a single bond, substituted or unsubstituted divalent monocyclic residue having 5 to 30 ring atoms, or substituted or unsubstituted divalent fused cyclic residue having 8 to 30 ring atoms.

In the formula (20C), $Ar^{53}$ and $Ar^{56}$ each independently represent a hydrogen atom, substituted or unsubstituted monocyclic group having 5 to 30 ring atoms, or substituted or unsubstituted fused cyclic group having 8 to 30 ring atoms.

[Formula 6]

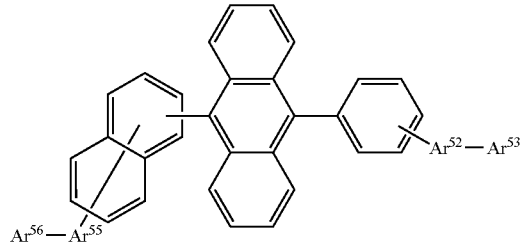

(20D)

In the formula (20D), $Ar^{52}$ represents a substituted or unsubstituted divalent monocyclic residue having 5 to 30 ring atoms, or substituted or unsubstituted divalent fused cyclic residue having 8 to 30 ring atoms.

In the formula (20D), $Ar^{55}$ represents a single bond, substituted or unsubstituted divalent monocyclic residue having 5 to 30 ring atoms, or substituted or unsubstituted divalent fused cyclic residue having 8 to 30 ring atoms.

In the formula (20D), $Ar^{53}$ and $Ar^{56}$ each independently represent a hydrogen atom, substituted or unsubstituted monocyclic group having 5 to 30 ring atoms, or substituted or unsubstituted fused cyclic group having 8 to 30 ring atoms.

[Formula 7]

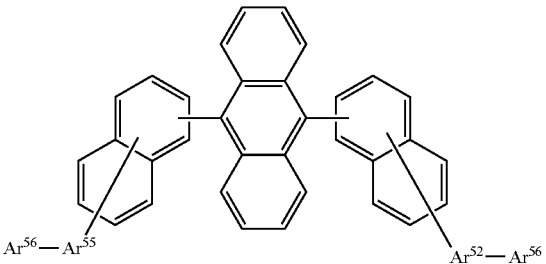

(20E)

In the formula (20E), $Ar^{52}$ and $Ar^{55}$ each independently represent a single bond, substituted or unsubstituted divalent monocyclic residue having 5 to 30 ring atoms, or substituted or unsubstituted divalent fused cyclic residue having 8 to 30 ring atoms.

In the formula (20E), $Ar^{53}$ and $Ar^{56}$ each independently represent a hydrogen atom, substituted or unsubstituted monocyclic group having 5 to 30 ring atoms, or substituted or unsubstituted fused cyclic group having 8 to 30 ring atoms.

The monocyclic group in the formulae (20A), (20B), (20C), (20D) and (20E) is a group only having a ring structure without a fused structure.

The monocyclic group has 5 to 30 ring atoms, preferably 5 to 20 ring atoms. Examples of the monocyclic group are: an aromatic group such as a phenyl group, biphenyl group, terphenyl group, and quarterphenyl group; and a heterocyclic group such as a pyridyl group, pyrazyl group, pyrimidyl group, triazinyl group, furyl group, and thienyl group. Among the monocyclic group, a phenyl group, biphenyl group and terphenyl group are preferable.

The fused cyclic group in the formulae (20A), (20B), (20C), (20D) and (20E) is a group having a fused structure of two rings or more.

The fused cyclic group has 8 to 30 ring atoms, preferably 8 to 20 ring atoms. Examples of the fused cyclic group are: a fused aromatic ring group such as a naphthyl group, phenanthryl group, anthryl group, chrysenyl group, benzanthryl group, benzophenanthryl group, triphenylenyl group, benzochrysenyl group, indenyl group, fluorenyl group, 9,9-dimethylfluorenyl group, benzofluorenyl group, dibenzofluorenyl group, fluoranthenyl group, and benzofluoranthenyl group; and a fused heterocyclic group such as a benzofuranyl group, benzothiophenyl group, indolyl group, dibenzofuranyl group, dibenzothiophenyl group, carbazolyl group, quinolyl group, and phenanthrolinyl group. Among the fused ring groups, a naphthyl group, phenanthryl group, anthryl group, 9,9-dimethylfluorenyl group, fluoranthenyl group, benzoanthryl group, dibenzothiophenyl group, dibenzofuranyl group and carbazolyl group are preferable.

Among the examples of the second host material, a compound satisfying the relationship of the above numerical formulae (2), (5) and (6) is preferable in a combination with the first host material and the first dopant material.

First Dopant Material

The first dopant material in the exemplary embodiment preferably has properties to emit fluorescence and to have a large speed constant of radiational transition. In this arrangement, singlet excitons electrically excited on the first host material, singlet excitons generated by the TADF mechanism and the like are transferred to singlet excitons of the first dopant material by Förster energy transfer and the first dopant material immediately emits light. In other words, a fluorescent emission is possible through the above energy transition before triplet excitons on the first host material causes TTA, by which decrease in an efficiency in the high current density area is likely to be considerably improved.

It is preferable to select a first dopant material having a fluorescence lifetime of 5 ns or less, more preferably 2 ns or less as the first dopant material having a large speed constant of radiational transition. A fluorescence quantum efficiency of the first dopant material is preferably 80% or more in a solution. The fluorescence quantum efficiency can be obtained by measuring the dopant material in a range of $10^{-5}$ to $10^{-6}$ mol/l of a concentration in a toluene solution using Absolute PL Quantum Yield Measurement System C9920-02 manufactured by HAMAMATSU PHOTONICS K.K.

It is also expected by measuring an EL spectrum of the device and confirming a luminescence component of a material other than the first dopant material is 1/10 or less of the luminescence component of the dopant that the first dopant material has a large speed constant of radiational transition.

Compound to be Used as First Dopant Material

As the first dopant material, a material that is not a heavy metal complex, namely, a fluorescent dopant material is usable. The fluorescent first dopant material is exemplified by a fused aromatic compound. Examples of the fused aromatic compound include a naphthalene derivative, an anthracene derivative, a pyrene derivative, a chrysene derivative, a fluoranthene derivative, an indenoperylene derivative, a pyrromethene boron complex compound, a compound having a pyrromethene skeleton or a metal complex thereof, a diketopyrrolopyrrole derivative, and a perylene derivative.

Examples of the naphthalene derivative include a bisarylamino naphthalene derivative and an aryl-substituted naphthalene derivative. Examples of the anthracene derivative include a bisarylamino anthracene derivative and an aryl-substituted anthracene derivative. Examples of the pyrene derivative include a bisarylamino pyrene derivative and an aryl-substituted pyrene derivative. Examples of the chrysene derivative include a bisarylamino chrysene derivative and an aryl-substituted chrysene derivative.

Examples of the fluoranthene derivative include compounds represented by formulae (2) to (18) below.

[Formula 8]

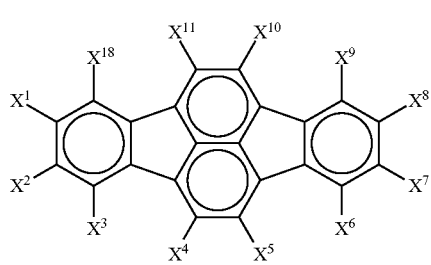

(2)

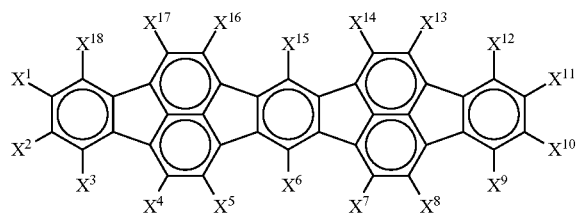

(3)

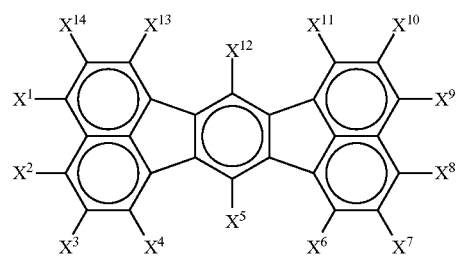

(4)

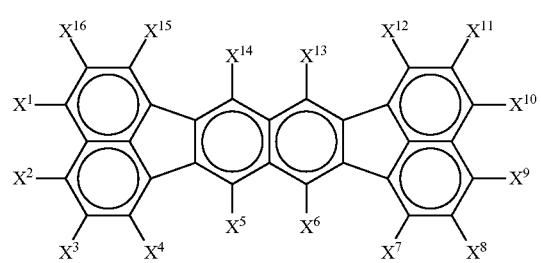

(5)

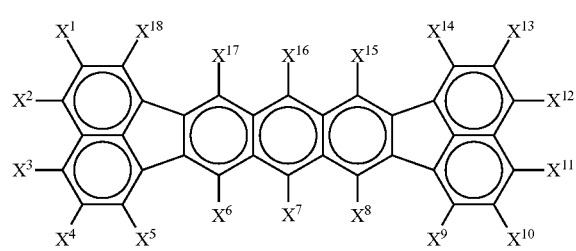

(6)

[Formula 9]

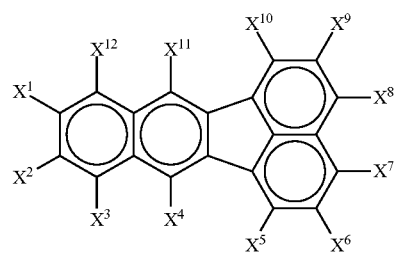

(7)

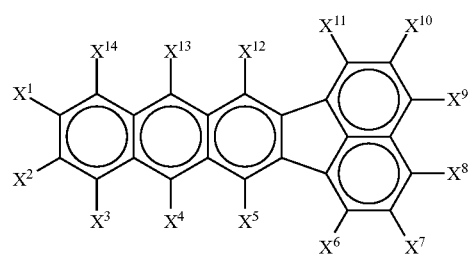

(8)

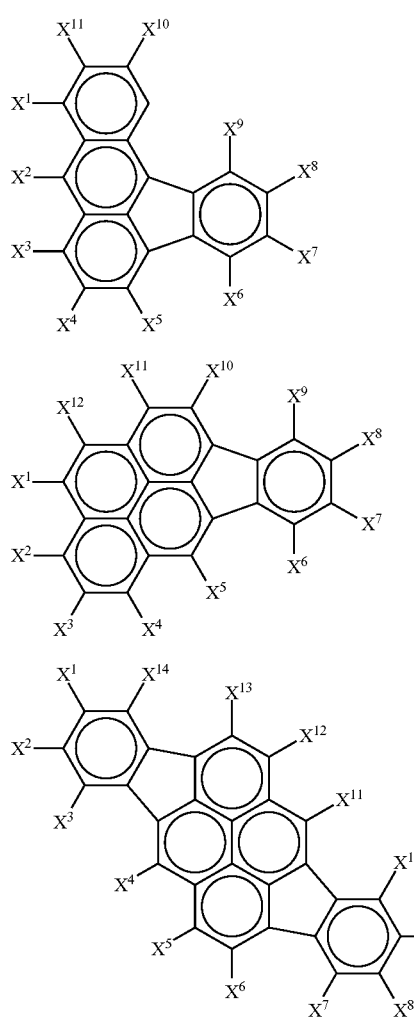

[Formula 10]

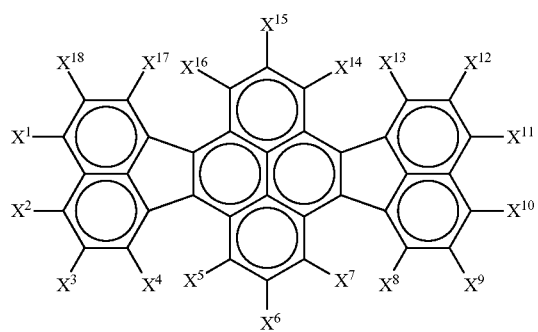

(12)

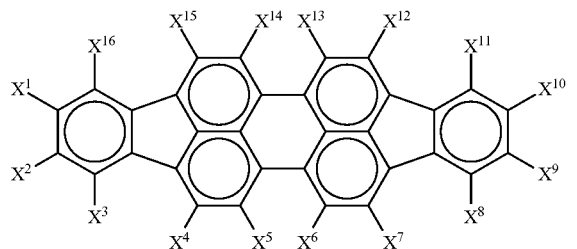

(13)

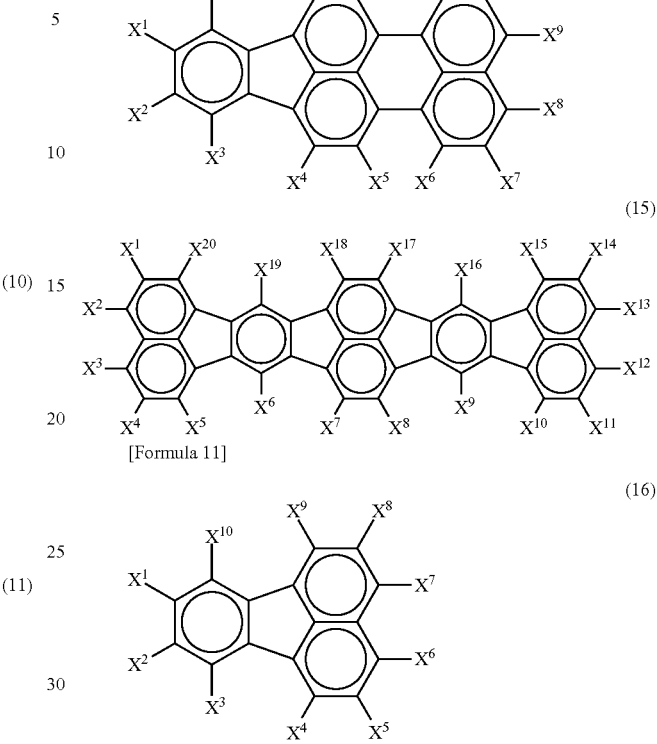

[Formula 11]

In the formulae (2) to (16), $X^1$ to $X^{20}$ each independently represent a hydrogen atom, a linear, branched, cyclic alkyl group having 1 to 20 carbon atoms, a linear, branched, cyclic alkoxy group having 1 to 20 carbon atoms, a substituted or unsubstituted aryl group having 6 to 30 carbon atoms, a substituted or unsubstituted aryloxy group having 6 to 30 carbon atoms, a substituted or unsubstituted arylamino group having 6 to 30 carbon atoms, a substituted or unsubstituted alkylamino group having 1 to 30 carbon atoms, a substituted or unsubstituted arylalkylamino group having 7 to 30 carbon atoms, or a substituted or unsubstituted alkenyl group having 8 to 30 carbon atoms.

The adjacent substituents and $X^1$ to $X^{20}$ may be bonded together to form a cyclic structure.

Further, when the adjacent substituents are aryl groups, the substituents may be the same.

The compounds represented by the formulae (2) to (16) preferably contain an amino group or an alkenyl group and are preferably represented by formulae (17) and (18) below.

[Formula 12]

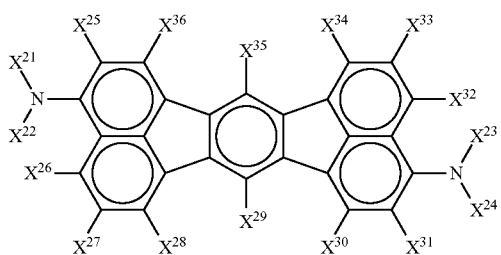

(17)

-continued

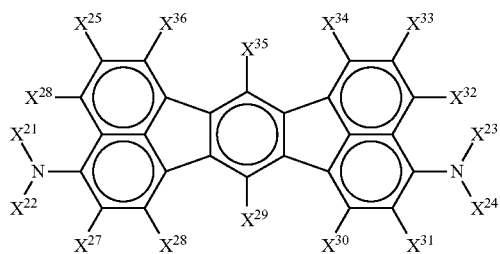
(18)

In the formulae (17) and (18), $X^{21}$ to $X^{24}$ each independently represent an alkyl group having 1 to 20 carbon atoms, or a substituted or unsubstituted aryl group having 6 to 30 carbon atoms.

$X^{21}$ and $X^{22}$ may be bonded to each other by a carbon-carbon bond, or through —O— and —S—.

$X^{23}$ and $X^{24}$ may be bonded to each other by a carbon-carbon bond, or through —O— and —S—.

$X^{25}$ to $X^{36}$ represent a hydrogen atom, a linear, branched, cyclic alkyl group having 1 to 20 carbon atoms, a linear, branched, cyclic alkoxy group having 1 to 20 carbon atoms, a substituted or unsubstituted aryl group having 6 to 30 carbon atoms, a substituted or unsubstituted aryloxy group having 6 to 30 carbon atoms, a substituted or unsubstituted arylamino group having 6 to 30 carbon atoms, a substituted or unsubstituted alkylamino group having 1 to 30 carbon atoms, a substituted or unsubstituted arylalkylamino group having 7 to 30 carbon atoms, or a substituted or unsubstituted alkenyl group having 8 to 30 carbon atoms.

The adjacent substituents and $X^{25}$ to $X^{36}$ may be bonded together to form a cyclic structure.

At least one of the substituents $X^{25}$ to $X^{36}$ in the above formulae preferably contains an amine group or an alkenyl group.

The fluorescent compound having a fluoranthene skeleton preferably contains an electron-donating group in order to achieve a high efficiency and a long lifetime. The electron-donating group is preferably a substituted or unsubstituted arylamino group. Further, the fluorescent compound having a fluoranthene skeleton preferably has 5 or more fused rings, particularly preferably 6 or more fused rings.

A compound represented by a formula (20) below is also preferable as the fused aromatic compound.

[Formula 13]

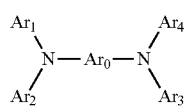
(20)

In the formual (20); $Ar_0$ is a substituted or unsubstituted divalent fused aromatic hydrocarbon group having 10 to 50 ring carbon atoms; and $Ar_1$ to $Ar_4$ each independently represent a substituted or unsubstituted aryl group having 6 to 30 ring carbon atoms, a substituted or unsubstituted heterocyclic group having 5 to 30 ring atoms, a substituted or unsubstituted alkyl group having 6 to 30 carbon atoms; or a substituted or unsubstituted aralkyl group having 7 to 30 carbon atoms.

The first emitting layer 12 using the TADF mechanism is preferably a blue fluorescent layer or a yellow fluorescent layer. In the exemplary embodiment, when the first emitting layer 12 is a yellow fluorescent layer, the first dopant material contained in the first emitting layer 12 is preferably a yellow fluorescent material. The yellow fluorescent material is preferably the above fluoranthene derivative. When the first emitting layer 12 is a blue fluorescent layer, the first dopant material contained in the first emitting layer 12 is preferably a blue fluorescent material. The blue fluorescent material is preferably the compound represented by the formula (20).

Figure 8:
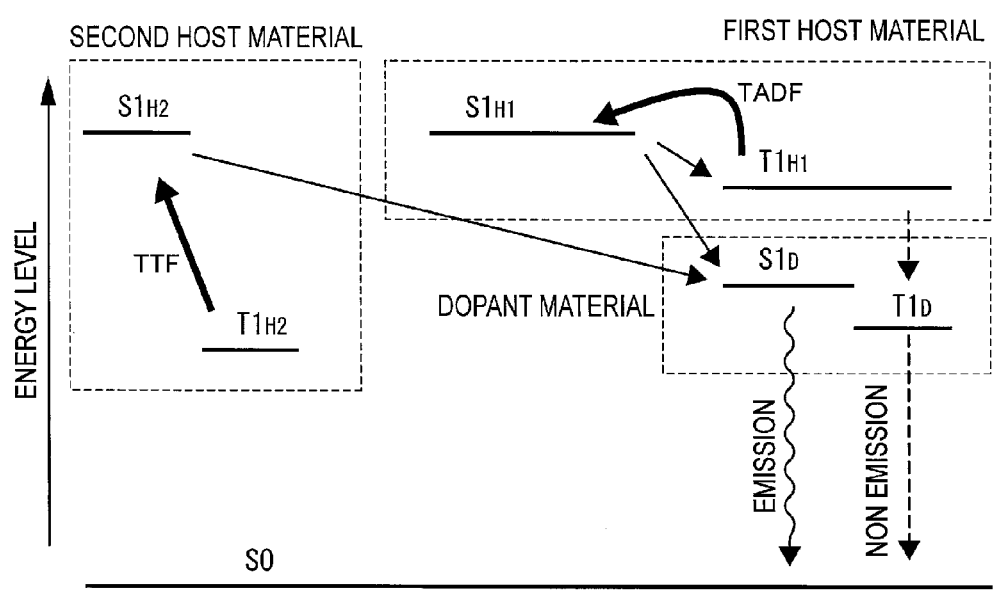
FIG. 8 shows a relationship between energy levels of a first host material, a second host material and a fluorescent material in the emitting layer.

Relationship in Energy Level Among First Host Material, Second Host Material and First Dopant Material FIG. 8 shows a relationship in an energy level among the first host material, the second host material and the first dopant material in the first emitting layer in the exemplary embodiment.

In FIG. 8, S0 represents a ground state, $S1_{H1}$ represents a lowest singlet state of the first host material, $T1_{H1}$ represents a lowest triplet state of the first host material, $S1_{H2}$ represents a lowest singlet state of the second host material, $T1_{H2}$ represents a lowest triplet state of the second host material, $S1_D$ represents a lowest singlet state of the first dopant material, and $T1_D$ represents a lowest triplet state of the first dopant material. As shown in FIG. 3, a difference between $S1_{H1}$ and $T1_{H1}$ corresponds to $\Delta ST(H1)$, a difference between $S1_{H1}$ and S0 corresponds to EgS(H1), a difference between $S1_D$ and S0 corresponds to EgS(D), and a difference between $T1_{H1}$ and $T1_{D1}$ corresponds to $\Delta T$. A solid arrow in FIG. 8 shows energy transfer between the excited states, a wavy arrow shows energy with emission, and a dotted-line arrow shows energy to be deactivated without emission.

As shown in FIG. 8, the TTF mechanism and the TADF mechanism coexist in the emission mechanism of the exemplary embodiment. In the first host material, a sufficiently small $\Delta ST(H1)$ causes energy transfer by the TADF mechanism. Specifically, energy transfer occurs by triplet excitons in the lowest triplet state $T1_{H1}$ being brought into the lowest singlet state $S1_{H1}$ by inverse intersystem crossing and then brought into the lowest singlet state $S1_D$ of the first dopant material by Förster transfer. The internal quantum efficiency by this mechanism is theoretically 100%. Moreover, in the second host material, energy transfer occurs using the TTF mechanism. Specifically, Förster transfer from the lowest singlet state $S1_{H2}$ to the lowest singlet state $S1_H$ of the first dopant material occurs, so that fluorescence can be obtained. The internal quantum efficiency by this mechanism is theoretically 40%.

Accordingly, in the emitting layer containing the first host material and the second host material at a mass ratio of 50:50, an obtainable emission derived from the first host material is 50% and an obtainable emission derived from the second host material is 20%, so that the internal quantum efficiency is theoretically 70%.

Moreover, as shown in FIG. 8, when the lowest triplet state $T1_{H2}$ of the second host material is lower than the lowest triplet state $T1_D$ of the first dopant material (when the formula (5) is satisfied), energy is transferred from the lowest triplet state $T1_D$ to the lowest triplet state $T1_{H2}$, so that the TTF mechanism can work more efficiently in the second host material.

Half Bandwidth

A half bandwidth represents a width of an emission spectrum when a luminous intensity becomes half relative to the maximum luminous intensity of the emission spectrum. It is understood that the first host material having 50 nm or more of a half bandwidth of a photoluminescence spectrum is a material easily forming an aggregate state and easily causing inverse intersystem crossing in a thin film. Accordingly, the TADF mechanism easily works in the first host material having 50 nm or more of the half bandwidth of the photoluminescence spectrum. Particularly preferably, the half bandwidth of the photoluminescence spectrum of the first host material is 65 nm or more.

A thickness of the first emitting layer 12 is preferably in a range of 5 nm to 50 nm, more preferably in a range of 7 nm to 50 nm and most preferably in a range of 10 nm to 50 nm. The thickness of less than 5 nm may cause difficulty in forming the emitting layer and in controlling chromaticity, while the thickness of more than 50 nm may raise drive voltage.

In the first emitting layer 12, a ratio of the first host material and the second host material is preferably in a range of 80:20 to 20:80 at a mass ratio. Moreover, a ratio of the first and second host materials (i.e., the total of the host materials) and the first dopant material is preferably in a range of 99:1 to 50:50 at a mass ratio.

Second Emitting Layer

The second emitting layer 14 includes a third host material and a second dopant material (second luminescent material). The second emitting layer 14 may be fluorescent or phosphorescent. When the second emitting layer 14 is fluorescent, the second emitting layer 14 may be a layer using the TADF mechanism in the same manner as in the first emitting layer 12.

The second emitting layer 14 is only required to emit so that a combination with the first emitting layer 12 allows the entire organic EL device 1 to exhibit a white emission. For instance, when the first emitting layer 12 is a blue fluorescent layer, the second emitting layer 14 is only required to be a yellow emitting layer. When the first emitting layer 12 is a yellow fluorescent layer, the second emitting layer 14 is only required to be a blue emitting layer.

When the first dopant material contained in the first emitting layer 12 has a main peak wavelength from 400 nm to less than 500 nm, the second dopant material contained in the second emitting layer 14 has a main peak wavelength from 500 nm to 700 nm. When the first dopant material has a main peak wavelength from 500 nm to 700 nm, the second dopant material has a main peak wavelength from 400 nm to less than 500 nm.

The third host material is exemplified by the anthracene derivative represented by the formula (20A), (20B), (20C), (20D) or (20E). The third host material may be the same as or different from the first host material.

When the second emitting layer 14 is a fluorescent layer, examples of the second dopant material include an arylamine compound, a styrylamine compound, anthracene, naphthalene, phenanthrene, pyrene, tetracene, coronene, chrysene, fluorescein, perylene, phthaloperylene, naphthaloperylene, perynone, phthaloperynone, naphthaloperynone, diphenylbutadiene, tetraphenylbutadiene, coumaline, oxadiazole, aldazine, bisbenzoxazoline, bisstyryl, pyrazine, cyclopentadiene, a metal complex of quinoline, a metal complex of aminoquinoline, a metal complex of benzoquinoline, imine, diphenylethylene, vinylanthracene, diaminocarbazole, pyrane, thiopyrane, polymethine, merocyanin, an imidazole chelated oxinoid compound, quinacridone, rubrene and a fluorescent dye.

When the second emitting layer 14 is a phosphorescent layer, a phosphorescent material is usable as the second dopant material. The phosphorescent material is preferably a compound containing a metal complex.

The metal complex preferably has a metal atom selected from Ir (iridium), Pt (platinum), Os (osmium), Au (gold), Cu (copper), Re (rhenium) and Ru (ruthenium), and a ligand. Particularly, the ligand preferably has an ortho-metal bond.

The phosphorescent material is preferably a compound containing a metal selected from Ir, Os and Pt because such a compound, which exhibits high phosphorescence quantum yield, can further enhance external quantum efficiency of the organic EL device. The phosphorescent material is more preferably a metal complex such as an iridium complex, osmium complex or platinum complex, among which an iridium complex and platinum complex are more preferable and ortho metalation of an iridium complex is the most preferable. The organic metal complex formed of the ligand selected from the group consisting of phenyl quinoline, phenyl isoquinoline, phenyl pyridine, phenyl pyrimidine, phenyl pyrazine, phenyl imidazole and benzoquinoline is preferable in terms of luminous efficiency and the like.

Examples of such a preferable metal complex are shown below.

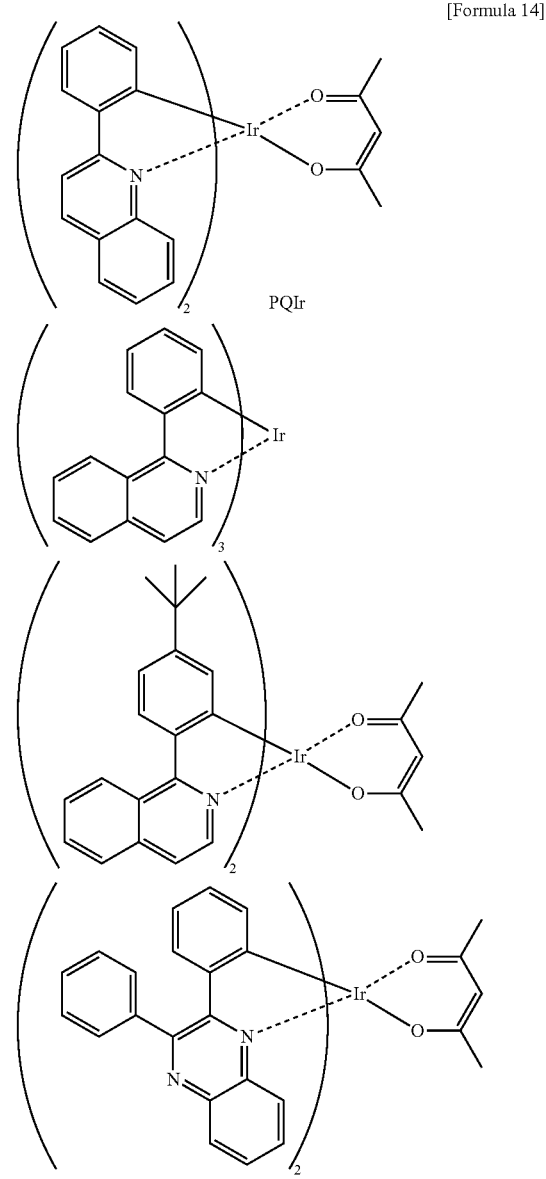

[Formula 14]

PQIr

-continued
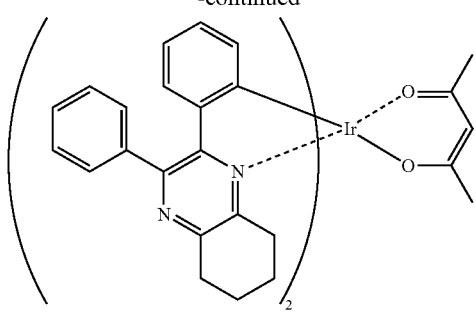
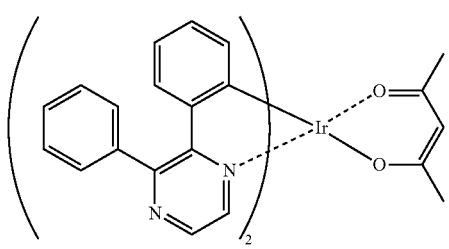
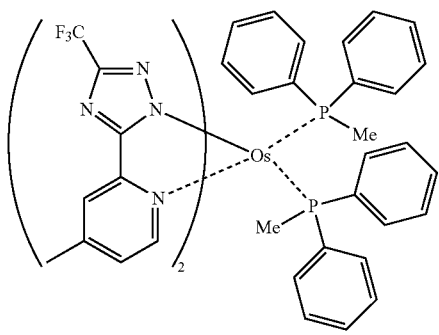
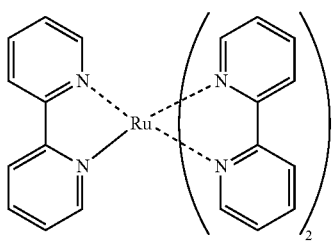
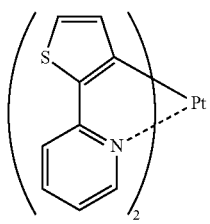
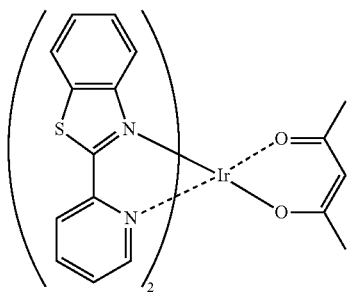
-continued
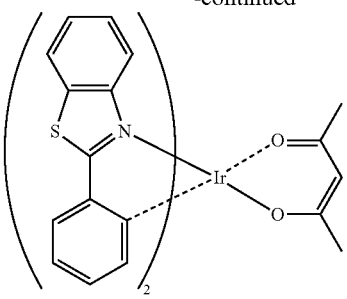
[Formula 15]
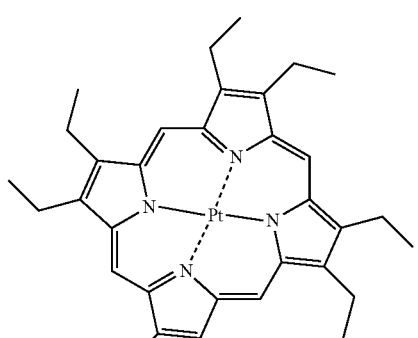
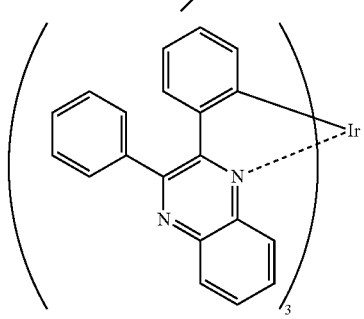
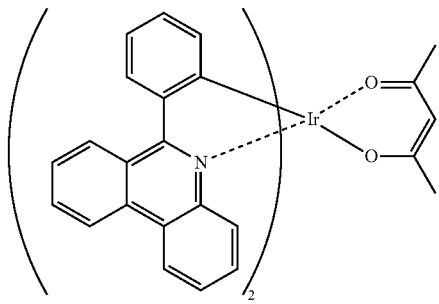
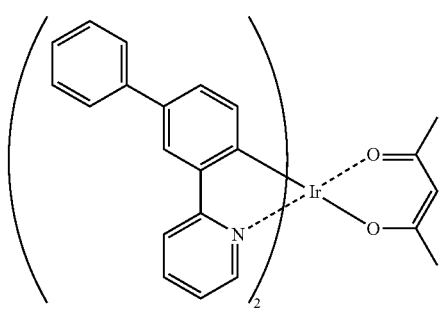

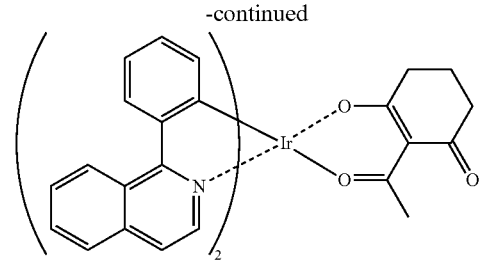
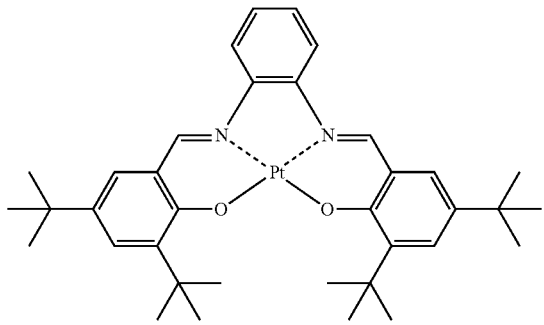
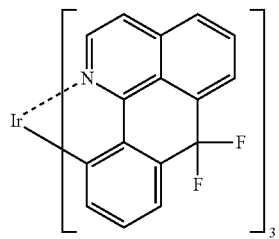
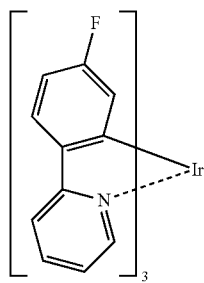
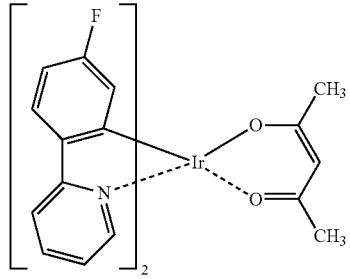
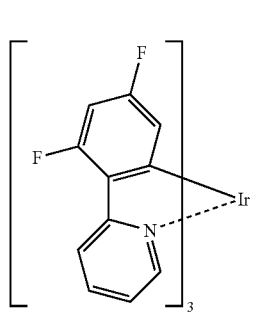
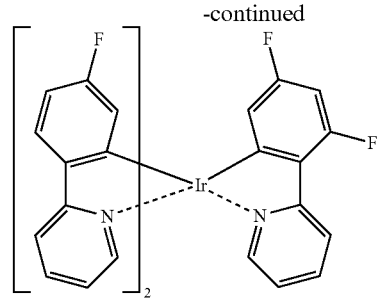
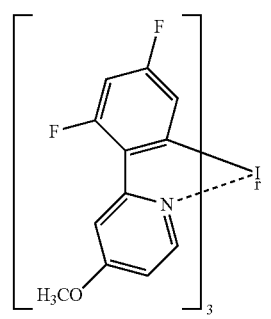
[Formula 16]
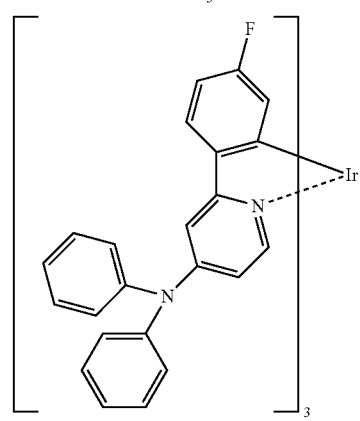
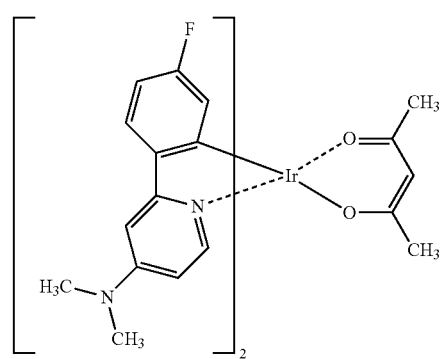
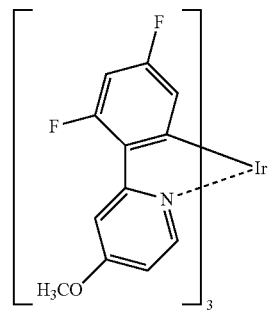

33
-continued
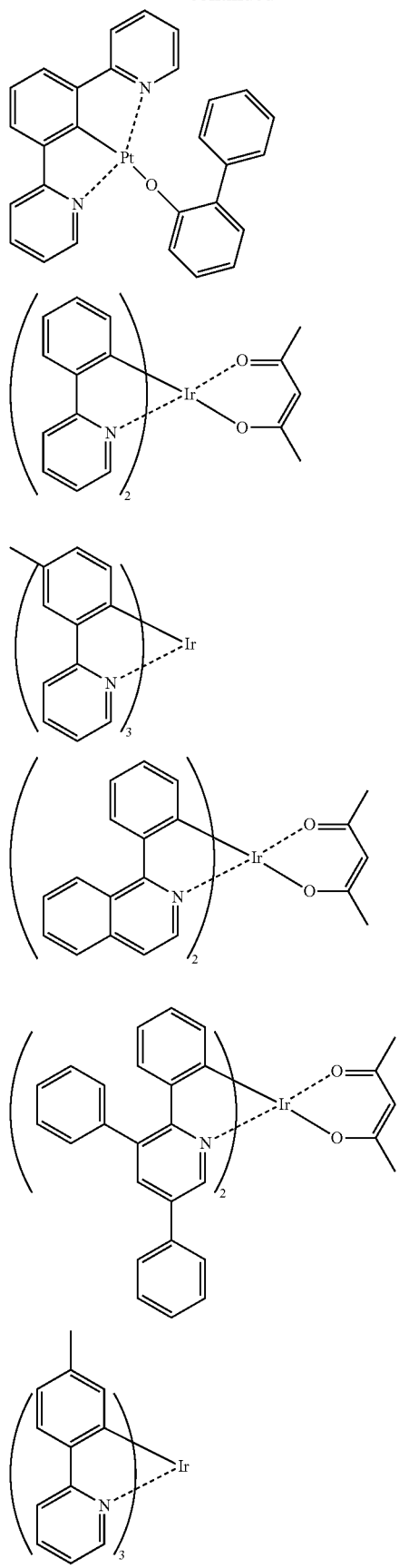
34
-continued
[Formula 17]
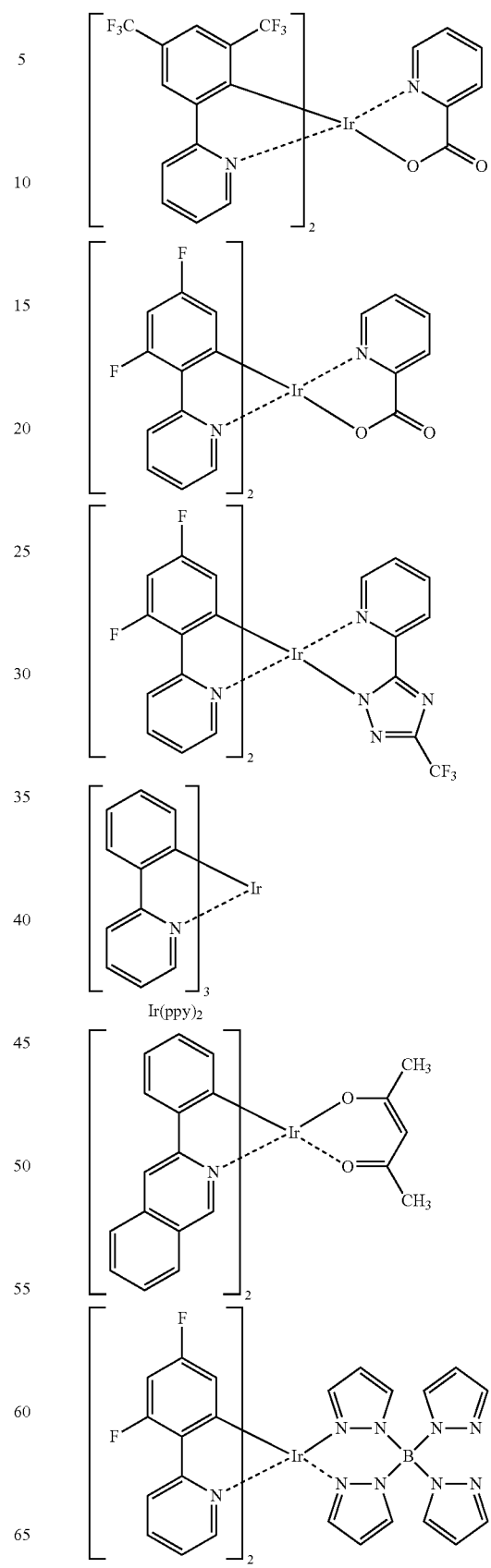
Ir(ppy)₂

-continued

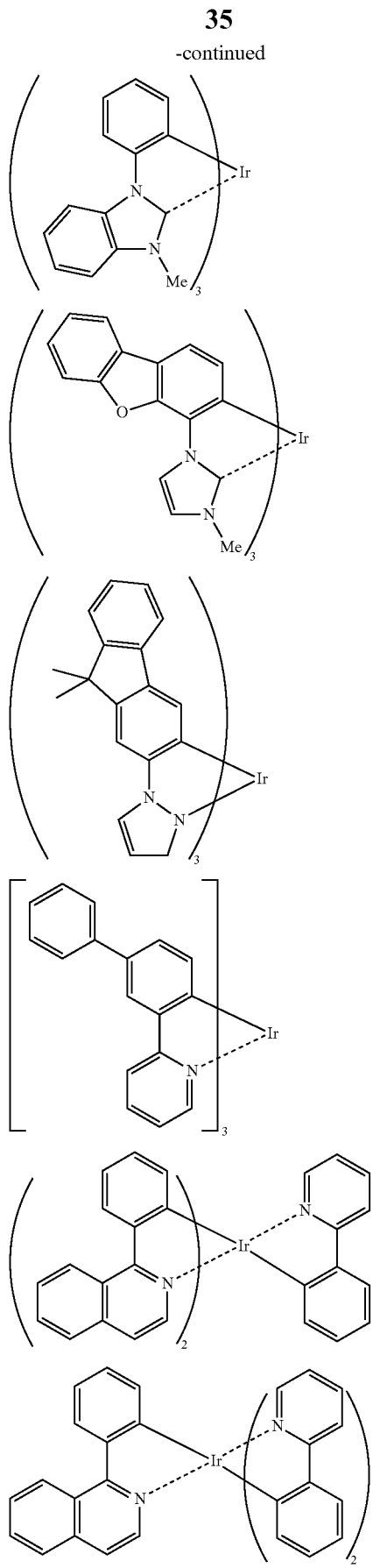

-continued

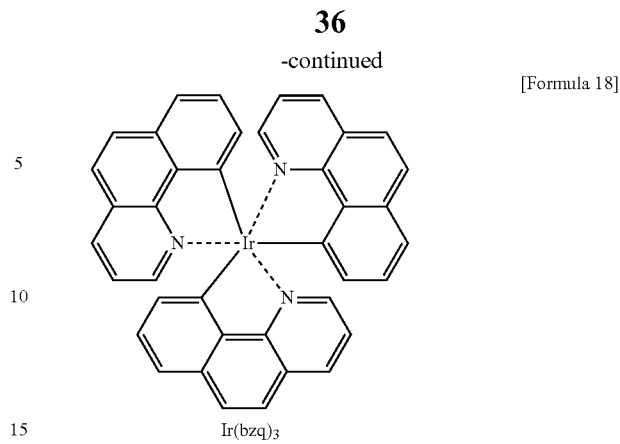

[Formula 18]

Ir(bzq)₃

Space Layer

Provided as an energy barrier of a HOMO level or a LUMO level between the first emitting layer 12 and the second emitting layer 14 adjacent thereto, the space layer 13 controls injection of charge (holes or electrons) into the first emitting layer 12 and the second emitting layer 14 and controls balance of charge injected thereinto. Moreover, the space layer 13 is provided as a barrier of triplet energy, thereby preventing diffusion of triplet energy generated in the first emitting layer 12 to the second emitting layer 14 and providing an efficient emission within the first emitting layer 12.

The organic EL device 1 in the exemplary embodiment includes the emitting layers 12 and 14 and the space layer 13 in the following arrangement (E1).

(E1) first emitting layer (yellow fluorescent layer)/space layer/second emitting layer (blue fluorescent layer)

In other words, the first emitting layer 12 is a yellow fluorescent layer and exhibits yellow fluorescence using the TADF mechanism. The second emitting layer 14 is a blue fluorescent layer. With this arrangement, the organic EL device can exhibit a white emission as a whole of the device.

In the exemplary embodiment, as shown in the arrangement (E1), it is preferable that the first emitting layer 12 is closer to the anode 3 while the second emitting layer 14 is closer to the cathode 4. However, the following arrangements (E2) to (E3) are also usable. Even with these arrangements, the organic EL device can exhibit a white emission as a whole of the device.

(E2) second emitting layer (green•red phosphorescent layer)/space layer/first emitting layer (blue fluorescent layer)

(E3) second emitting layer (yellow phosphorescent layer)/space layer/first emitting layer (blue fluorescent layer)

Substrate

The organic EL device 1 is formed on the light-transmissive substrate 2. The light-transmissive substrate 2 supports the anode, organic compound layer, cathode and the like of the organic EL device. The light-transmissive substrate 2 is preferably a smooth and flat substrate that transmits 50% or more of light in a visible region of 400 nm to 700 nm.

The light-transmissive substrate is exemplified by a glass plate and a polymer plate.

The glass plate is formed of soda-lime glass, barium/strontium-containing glass, lead glass, aluminosilicate glass, borosilicate glass, barium borosilicate glass, quartz and the like.

The polymer plate is formed of polycarbonate, acryl, polyethylene terephthalate, polyether sulfide and polysulfone.

Anode and Cathode

The anode of the organic EL device injects holes into the emitting layer, so that it is efficient that the anode has a work function of 4.5 eV or higher.

Exemplary materials for the anode are indium-tin oxide (ITO), tin oxide (NESA), indium zinc oxide, gold, silver, platinum and copper.

When light from the emitting layer is to be emitted through the anode, the anode preferably transmits more than 10% of the light in the visible region. Sheet resistance of the anode is preferably several hundreds Ω/sq. or lower. A thickness of the anode is typically in a range of 10 nm to 1 µm, and preferably in a range of 10 nm to 200 nm, though it depends on the material of the anode.

The cathode is preferably formed of a material with smaller work function in order to inject electrons into the emitting layer.

Although a material for the cathode is subject to no specific limitation, examples of the material are indium, aluminum, magnesium, alloy of magnesium and indium, alloy of magnesium and aluminum, alloy of aluminum and lithium, alloy of aluminum, scandium and lithium, and alloy of magnesium and silver.

Like the anode, the cathode may be made by forming a thin film on, for instance, the electron transporting layer and the electron injecting layer by a method such as vapor deposition. In addition, the light from the emitting layer may be emitted through the cathode. When light from the emitting layer is to be emitted through the cathode, the cathode preferably transmits more than 10% of the light in the visible region.

Sheet resistance of the cathode is preferably several hundreds Ω/sq. or lower.

A thickness of the cathode is typically in the range of 10 nm to 1 µm, and preferably in the range of 50 nm to 200 nm, though it depends on the material of the cathode.

Hole Injecting•Transporting Layer

The hole injection/transport layer helps injection of holes to the emitting layer and transport the holes to an emitting region. A compound having a large hole mobility and a small ionization energy is used as the hole injection/transport layer.

A material for forming the hole injection/transport layer is preferably a material of transporting the holes to the emitting layer at a lower electric field intensity. For instance, an aromatic amine compound is preferably used.

Electron Injecting•Transporting Layer

The electron injecting•transporting layer helps injection of the electrons into the emitting layer and transports the electrons to an emitting region. A compound having a large electron mobility is used as the electron injecting•transporting layer.

A preferable example of the compound used as the electron injecting•transporting layer is an aromatic heterocyclic compound having at least one heteroatom in a molecule. Particularly, a nitrogen-containing cyclic derivative is preferable. The nitrogen-containing cyclic derivative is preferably a heterocyclic compound having a nitrogen-containing six-membered or five-membered ring skeleton.

In the organic EL device in the exemplary embodiment, in addition to the above exemplary compounds, any compound selected from compounds known as being used in the typical organic El device is usable as a compound for the organic compound layer other than the first emitting layer 12 and the second emitting layer 14.

Layer Formation Method(s)

A method for forming each layer of the organic EL device in the exemplary embodiment is subject to no limitation except for the above particular description. However, known methods of dry film-forming such as vacuum deposition, sputtering, plasma or ion plating and wet film-forming such as spin coating, dipping, flow coating or ink-jet are applicable.

Second Exemplary Embodiment

Next, a second exemplary embodiment is described below.

In the description of the second exemplary embodiment, the same components as those in the first exemplary embodiment are denoted by the same reference signs and names to simplify or omit an explanation of the components. In the second exemplary embodiment, the same materials and compounds as described in the first exemplary embodiment are usable.

Figure 9:
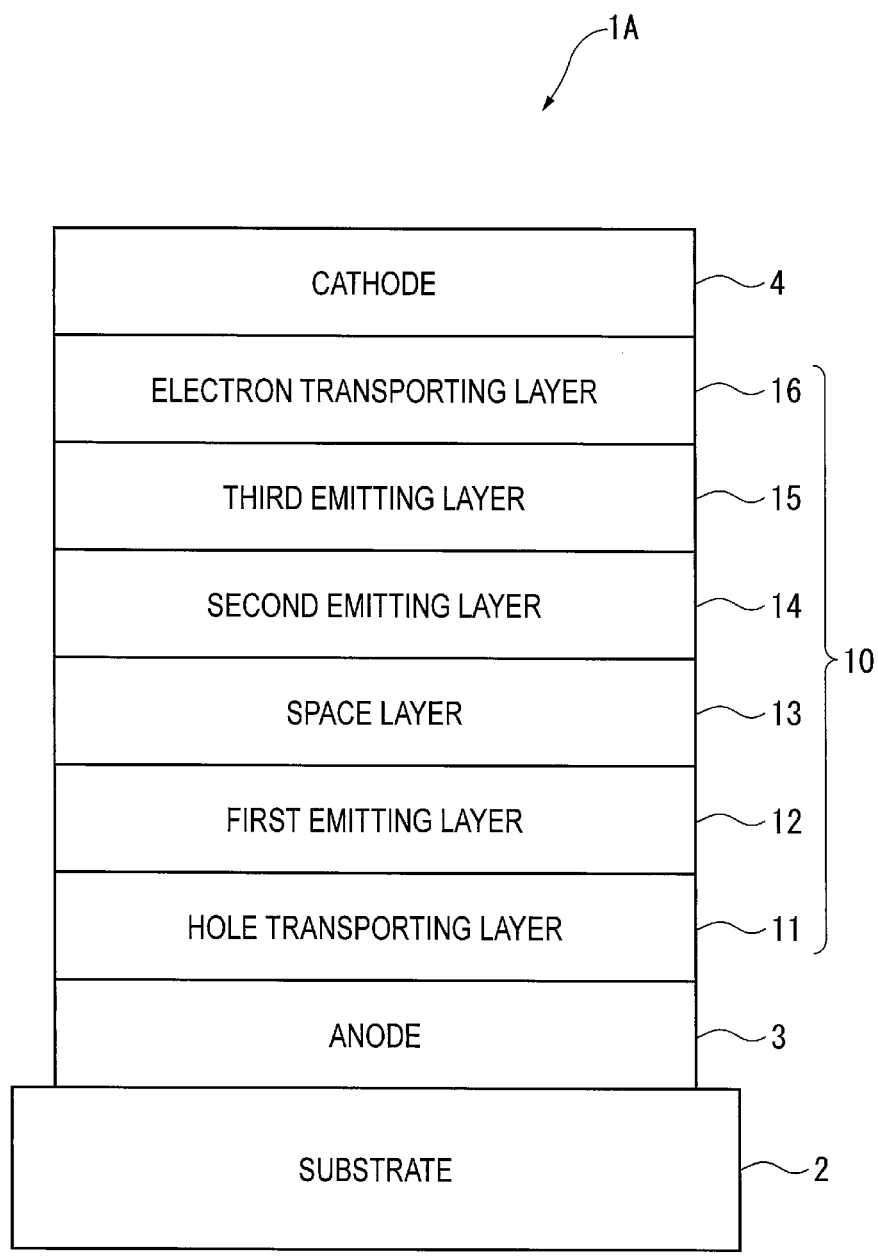
FIG. 9 schematically shows an exemplary arrangement of an organic EL device according to a second exemplary embodiment of the invention.

An organic EL device 1A according to the second exemplary embodiment is different from the organic EL device in the exemplary embodiment in that a third emitting layer 15 is provided adjacent to the second emitting layer 14. As shown in FIG. 9, the anode 3, hole transporting layer 11, first emitting layer 12, space layer 13, second emitting layer 14, third emitting layer 15, electron transporting layer 16, and cathode 4 are laminated on the substrate 2 in this order.

In the second exemplary embodiment, in order that the organic EL device 1A exhibits a white emission, the emitting layer and the space layer 13 are preferably provided, for instance, in the following arrangement (E4).

(E4) first emitting layer (yellow fluorescent layer)/space layer/second emitting layer (blue fluorescent layer)/third emitting layer (green fluorescent layer)

The organic EL device 1A may have more than one space layers. An additional space layer may be formed between the adjacent emitting layers. For instance, the arrangement (E4) may be modified to the following arrangement (E5).

(E5) first emitting layer (yellow fluorescent layer)/space layer/second emitting layer (blue fluorescent layer)/space layer/third emitting layer (green fluorescent layer)

In the above arrangements (E4) and (E5), at least the first emitting layer is an emitting layer using the TADF mechanism. Further, the second emitting layer and the third emitting layer may be emitting layers using the TADF mechanism.

When the third emitting layer 15 is a green fluorescent layer as in the above arrangements (E4) and (E5), the third emitting layer 15 has a peak wavelength from 500 nm to 570 nm. The third emitting layer 15 contains a third material and a third luminescent material.

Third Exemplary Embodiment

Next, a third exemplary embodiment is described below.

In the description of the third exemplary embodiment, the same components as those in the first exemplary embodiment are denoted by the same reference signs and names to simplify or omit an explanation of the components. In the third exemplary embodiment, the same materials and compounds as described in the first exemplary embodiment are usable.

Figure 10:
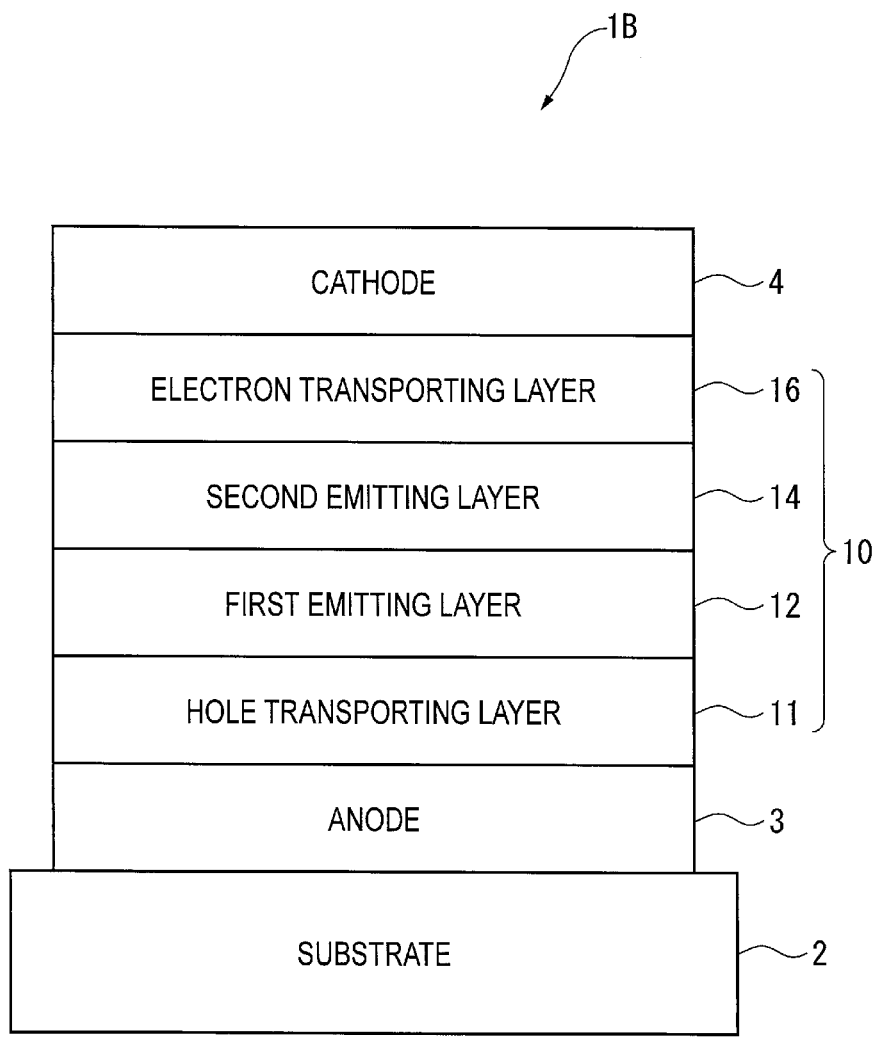
FIG. 10 schematically shows an exemplary arrangement of an organic EL device according to a third exemplary embodiment of the invention.

An organic EL device 1B in the third exemplary embodiment is different from the organic EL device in the first exemplary embodiment in that no space layer 13 is provided. As shown in FIG. 10, the anode 3, hole transporting layer 11, first emitting layer 12, second emitting layer 14, electron transporting layer 16, and cathode 4 are preferably laminated on the substrate 2 in this order. Moreover, the organic EL device 1B may include the anode 3, hole transporting layer 11, second emitting layer 14, first emitting layer 12, electron transporting layer 16, and cathode 4 which are laminated on the substrate 2 in this order (not shown).

In the third exemplary embodiment, in order that the organic EL device 1B exhibits a white emission, the emitting layer is preferably provided, for instance, in the following arrangements (E6) and (E7).

(E6) second emitting layer (green•red phosphorescent layer)/first emitting layer (blue fluorescent layer)

(E7) second emitting layer (yellow phosphorescent layer)/first emitting layer (blue fluorescent layer)

Here, the green•red phosphorescent layer refers to an emitting layer containing a green emitting dopant material and a red emitting dopant material in a mixture.

In the third exemplary embodiment, as shown in FIG. 10 and in the arrangements (E6) and (E7), the organic EL device 1B is exemplarily shown in which the second emitting layer 14 is closer to the anode 3 while the first emitting layer 12 is closer to the cathode 4. However, the following arrangements (E8) and (E9) are also usable. Even with these arrangements, the organic EL device can exhibit a white emission as a whole of the device.

(E8) first emitting layer (blue fluorescent layer)/second emitting layer (green•red phosphorescent layer)

(E9) first emitting layer (blue fluorescent layer)/second emitting layer (yellow phosphorescent layer)

Fourth Exemplary Embodiment

Next, a fourth exemplary embodiment is described below.

Figure 11:
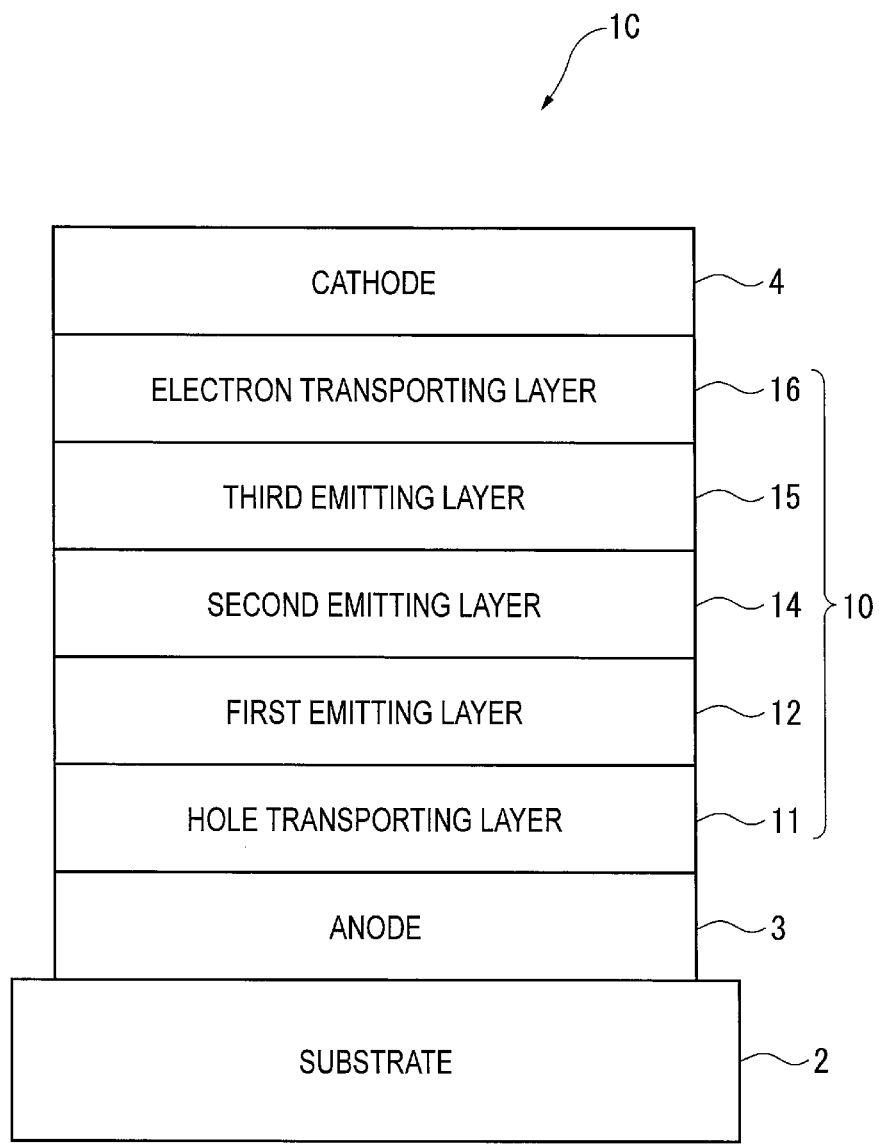
FIG. 11 schematically shows an exemplary arrangement of an organic EL device according to a fourth exemplary embodiment of the invention.

An organic EL device 1C in the fourth exemplary embodiment is different from the organic EL device in the second exemplary embodiment in that no space layer 13 is provided. As shown in FIG. 11, the anode 3, hole transporting layer 11, first emitting layer 12, second emitting layer 14, third emitting layer 15, electron transporting layer 16, and cathode 4 are laminated on the substrate 2 in this order.

In the description of the fourth exemplary embodiment, the same components as those in the second exemplary embodiment are denoted by the same reference signs and names to simplify or omit an explanation of the components. In the fourth exemplary embodiment, the same materials and compounds as described in the second exemplary embodiment are usable.

In the fourth exemplary embodiment, in order that the organic EL device 1C exhibits a white emission, the emitting layer is preferably provided, for instance, in the following arrangement (E10).

(E10) first emitting layer (yellow fluorescent layer)/second emitting layer (blue fluorescent layer)/third emitting layer (green fluorescent layer)

Fifth Exemplary Embodiment

An organic EL device according to a fifth exemplary embodiment is a so-called tandem-type device including at least two emitting units and an intermediate unit. In addition to charges injected from a pair of electrodes, charges supplied from the intermediate unit are injected into the emitting units. Accordingly, by providing the intermediate unit, luminous efficiency (current efficiency) relative to injected current is improved.

Figure 12:
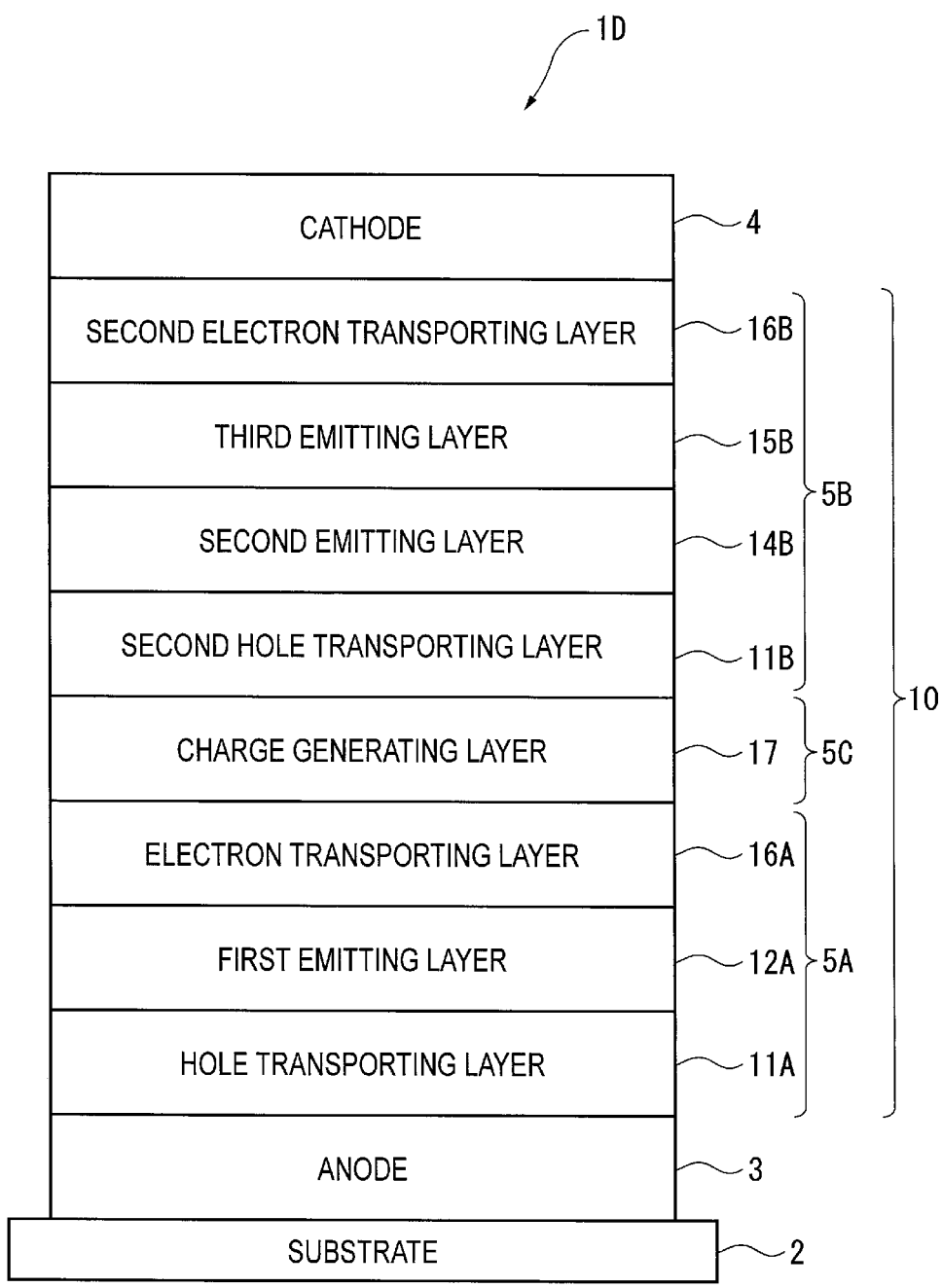
FIG. 12 schematically shows an exemplary arrangement of an organic electroluminescence device according to a fifth exemplary embodiment of the invention.

As shown in FIG. 12, an organic EL device 1D according to the fifth exemplary embodiment includes the anode 3, a first emitting unit 5A, an intermediate unit 5C, a second emitting unit 5B and the cathode 4 which are laminated on the substrate 2 in this order. Moreover, it is also preferable that the organic EL device 1D includes the anode 3, second emitting unit 5B, intermediate unit 5C, first emitting unit 5A, and the cathode 4 which are laminated on the substrate 2 in this order (not shown).

The first emitting unit 5A includes a hole transporting layer 11A, first emitting layer 12A, and electron transporting layer 16A.

The intermediate unit 5C includes an intermediate conductive layer, charge generating layer and the like. In the fifth exemplary embodiment, the intermediate unit 5C includes a charge generating layer 17.

The second emitting unit 5B includes a second hole transporting layer 11B, second emitting layer 14B, third emitting layer 15B, and second electron transporting layer 16B.

The first emitting layer 12A is the same as the first emitting layer 12 in the first exemplary embodiment. Specifically, also in the fifth exemplary embodiment, the first emitting layer 12A contains the first host material, second host material and fluorescent material, in which the difference $\Delta ST(H1)$ between singlet energy $EgS(H1)$ of the first host material and the energy gap $Eg_{77K}(H1)$ at 77[K] of the first host material satisfies the relationship of the above numerical formula (1). Accordingly, the first emitting layer 12 exhibits an emission using the TADF mechanism as described above.

The second emitting layer 14B is the same as the second emitting layer 14 of the first exemplary embodiment. The third emitting layer 15B is the same as the third emitting layer 15 of the second exemplary embodiment.

The second emitting layer 14B of the fifth exemplary embodiment is preferably phosphorescent. The second emitting layer 14B includes the third host material and a phosphorescent material.

Examples of the third host material are the same as the examples of the first host material and the second host material. The third host material is preferably selected from a carbazole derivative, a biscarbazole derivative, an indolocarbazole derivative, an acridine derivative, an oxazine derivative, a pyrazine derivative, a pyrimidine derivative, a triazine derivative, a dibenzofuran derivative, a dibenzothiophene derivative and the like. These derivatives may have a substituent as needed. The third host material may be a compound having a fused aromatic hydrocarbon group having 10 to 30 ring carbon atoms or a fused aromatic heterocyclic group having 8 to 30 ring atoms.

The phosphorescent material is preferably a compound containing a metal complex and is exemplified by the compound described in the second exemplary embodiment.

The charge generating layer 17, in which charges are generated when an electrical field is applied on the organic EL device 1D, injects electrons into the electron transporting layer 16A and injects holes into the second hole transporting layer 11B.

As a material for the charge generating layer 17, known materials such as the materials described in the specification of U.S. Pat. No. 7,358,661 are usable. Specific examples of the material include oxides, mixture of the oxides, complex oxides, nitrides, iodides and borides of metals such as In, Sn, Zn, Ti, Zr, Hf, V, Mo, Cu, Ga, Sr, La and Ru. The electron transporting zone 16A near an interface with the charge generating layer is preferably doped with a donor (e.g., an alkali metal) in order that the second emitting layer 14B can easily accept electrons from the charge generating layer 17. As the donor, at least one of a donor metal, donor metal compound and donor metal complex can be selected. Specific examples of the compounds used for the donor metal, donor metal compound and donor metal complex are compounds disclosed in Japanese Patent Application No. PCT/JP2010/003434 (International Publication No. WO2010/134352).

The second hole transporting layer 11B and the second electron transporting layer 16B are the same as the hole transporting layer 11 and the electron transporting layer 16 of the first exemplary embodiment.

In the fifth exemplary embodiment, in order that the organic EL device 1D exhibits a white emission, the emitting units and the intermediate unit are preferably provided, for instance, in the following arrangements (U1) to (U12).

(U1) first emitting unit (blue fluorescent)/intermediate unit/second emitting unit (yellow fluorescent)

(U2) first emitting unit (blue fluorescent)/intermediate unit/second emitting unit (yellow phosphorescent)

(U3) first emitting unit (blue fluorescent)/intermediate unit/second emitting unit (green•red fluorescent)

(U4) first emitting unit (blue fluorescent)/intermediate unit/second emitting unit (green•red phosphorescent)

(U5) second emitting unit (yellow fluorescent)/intermediate unit/first emitting unit (blue fluorescent)

(U6) second emitting unit (yellow phosphorescent)/intermediate unit/first emitting unit (blue fluorescent)

(U7) second emitting unit (green•red fluorescent)/intermediate unit/first emitting unit (blue fluorescent)

(U8) second emitting unit (green•red phosphorescent)/intermediate unit/first emitting unit (blue fluorescent)

(U9) second emitting unit (blue fluorescent)/intermediate unit/first emitting unit (yellow fluorescent)

(U10) second emitting unit (blue fluorescent)/intermediate unit/first emitting unit (green•red fluorescent)

(U11) first emitting unit (yellow fluorescent)/intermediate unit/second emitting unit (blue fluorescent)

(U12) first emitting unit (green red fluorescent)/intermediate unit/second emitting unit (blue fluorescent)

In the above arrangements, the green•red fluorescent unit or the green•red phosphorescent unit emits by a green emitting dopant material and a red emitting dopant material contained therein. These dopant materials may be contained in separate emitting layers or may be contained in the same emitting layer.

In the arrangements (U1) to (U9), the first emitting unit 5A including the first emitting layer 12A emits using the TADF mechanism. However, when the second emitting layer 14B and the third emitting layer 15B are fluorescent layers, these layers emit using the TADF mechanism, whereby the second emitting unit 5B may emit using the TADF mechanism.

Among the arrangements (U1) to (U12), the arrangements (U2), (U4), (U6) and (U8) in which the first emitting unit 5A exhibits blue fluorescence and the second emitting unit exhibits phosphorescence are preferable.

Since the organic EL device 1D is a so-called tandem-type device, electrical current for driving can be reduced and durability can be improved.

Sixth Exemplary Embodiment

An organic EL device 1E according to a sixth exemplary embodiment is different from the organic EL device of the fifth exemplary embodiment in that no third emitting layer 15B is provided.

In the description of the sixth exemplary embodiment, the same components as those in the fifth exemplary embodiment are denoted by the same reference signs and names to simplify or omit an explanation of the components. In the sixth exemplary embodiment, the same materials and compounds as described in the fifth exemplary embodiment are usable.

Figure 13:
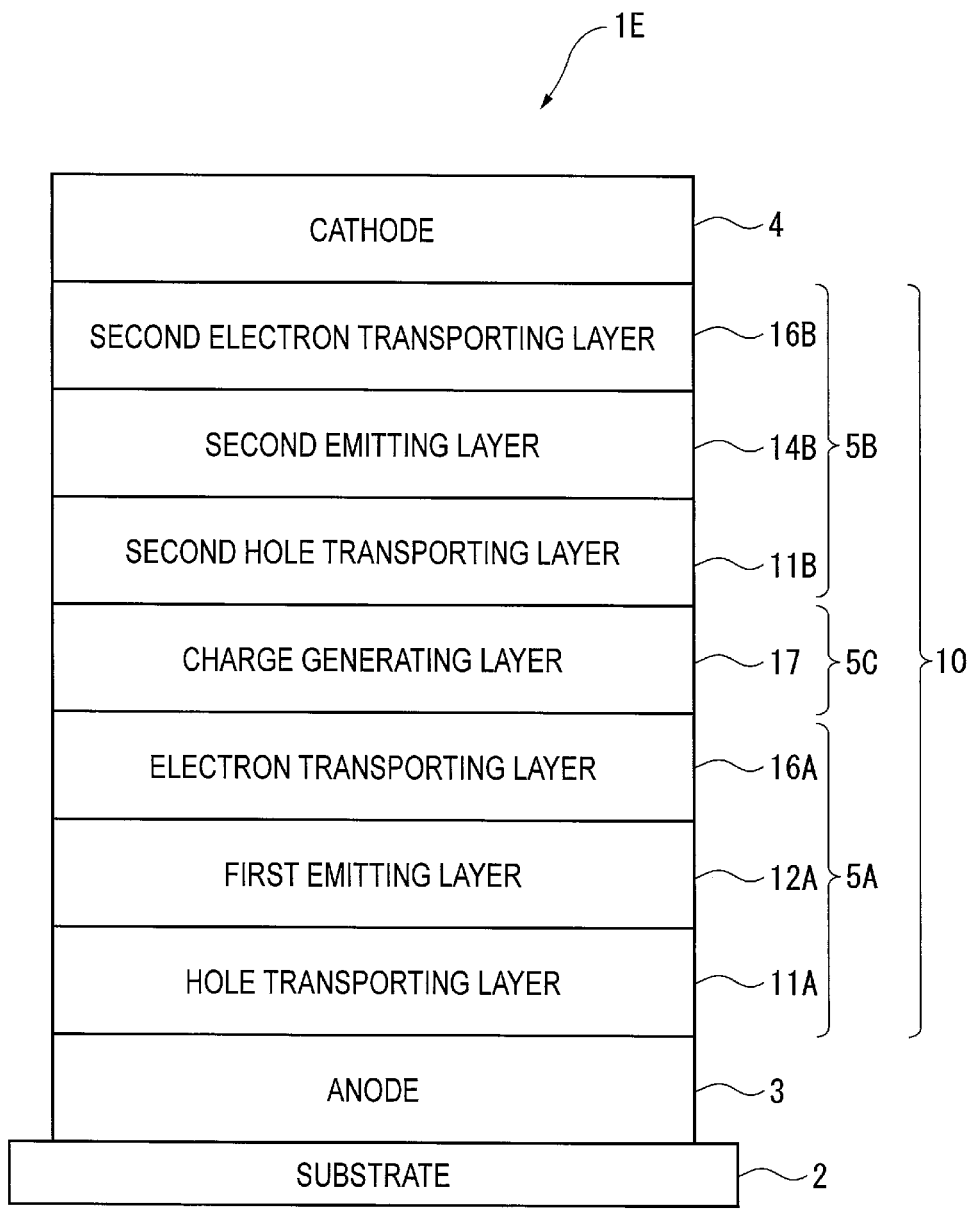
FIG. 13 schematically shows an exemplary arrangement of an organic EL device according to a sixth exemplary embodiment of the invention.

As shown in FIG. 13, the organic EL device 1E of the sixth exemplary embodiment includes the anode 3, hole transporting layer 11A, first emitting layer 11A, electron transporting layer 16A, charge generating layer 17, the second hole transporting layer 11B, the second emitting unit 14B, the second electron transporting layer 16B and the cathode 4 which are laminated on the substrate 2 in this order.

In the organic EL device 1E, the first emitting layer 12A emits using the TADF mechanism. However, when the second emitting layer 14B is a fluorescent layer, the second emitting layer 14B may be an emitting layer using the TADF mechanism. In this arrangement, both of the first emitting unit 5A and the second emitting unit 5B emit using the TADF mechanism.

Since the organic EL device 1E is a so-called tandem-type device, electrical current for driving can be reduced and durability can be improved.

Seventh Exemplary Embodiment

An organic EL device in a seventh exemplary embodiment has the same device arrangement as the organic EL device 1 of the first exemplary embodiment shown in FIG. 1, but is different from the organic EL device of the first exemplary embodiment in that the first emitting layer 12 has no second host material. Specifically, the first emitting layer 12 includes the first host material and the fluorescent material. The materials for the first host material and the fluorescent material described in the first exemplary embodiment are usable as the first host material and the fluorescent material in the seventh exemplary embodiment.

In this arrangement, the first emitting layer 12 only exhibits an emission derived from the first host material using the TADF mechanism.

Modification(s) of Embodiment(s)

It should be noted that the invention is not limited to the above description but may include any modification as long as such modification stays within a scope and a spirit of the invention.

For instance, an electron blocking layer may be provided to the emitting layer adjacent to the anode while a hole blocking layer may be provided adjacent to the emitting layer near the cathode. With this arrangement, the electrons and the holes can be trapped in the emitting layer, thereby enhancing probability of exciton generation in the emitting layer.

Moreover, a material having a large triplet energy may be provided adjacent to at least one of a side near the anode and a side near the cathode of the fluorescent-emitting layer. With this arrangement, triplet excitons are trapped within the emitting layer to efficiently cause TTF (Triplet-Triplet Fusion) phenomenon, thereby realizing a high efficiency of the fluorescent-emitting layer.

Further, the materials and treatments for practicing the invention may be altered to other arrangements and treatments as long as such other arrangements and treatments are compatible with the invention.

EXAMPLE(S)
Examples of the invention will be described below. However, the invention is not limited by these Examples.
The used compounds were as follows.
[Formula 19]
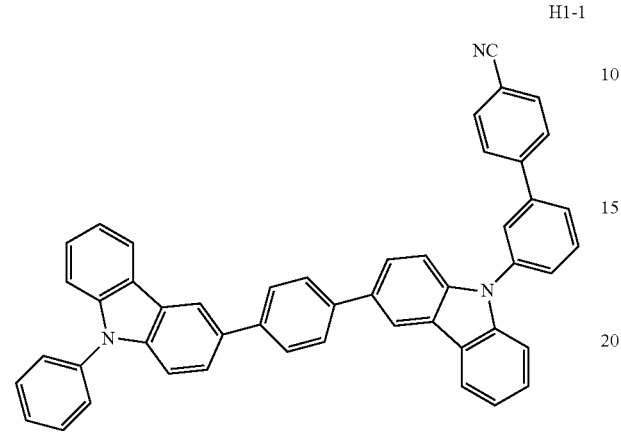
H1-1
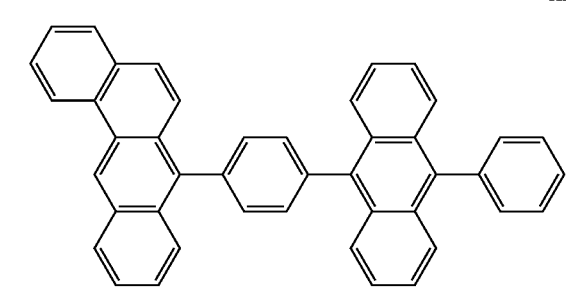
H2-1
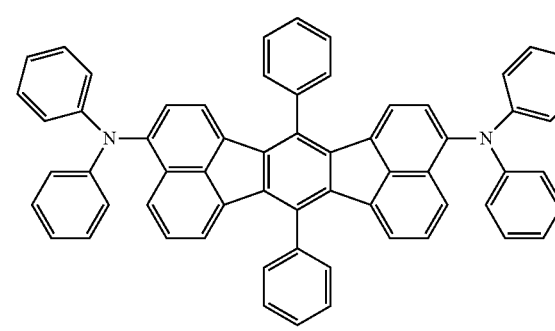
YD-1
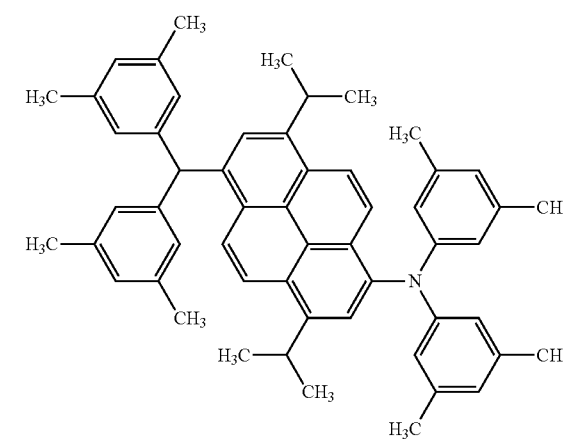
BD-1
[Formula 20]
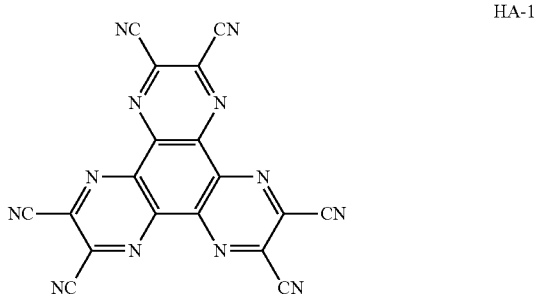
HA-1
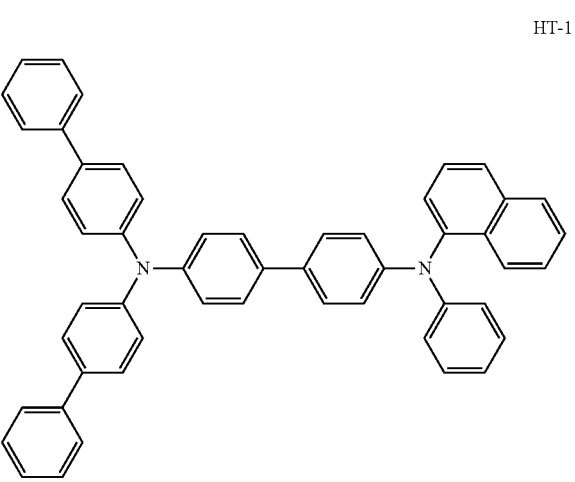
HT-1
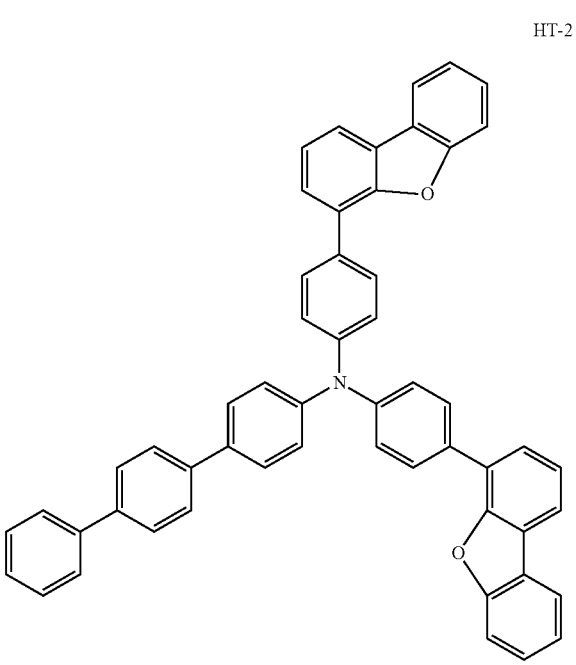
HT-2

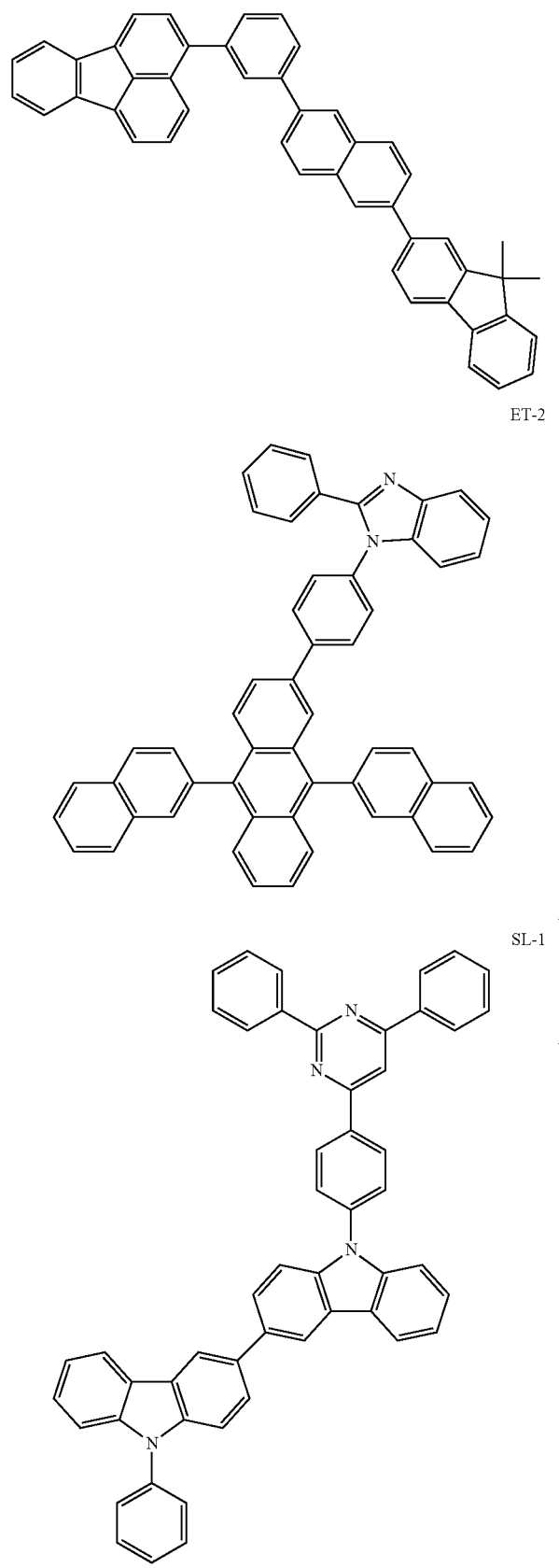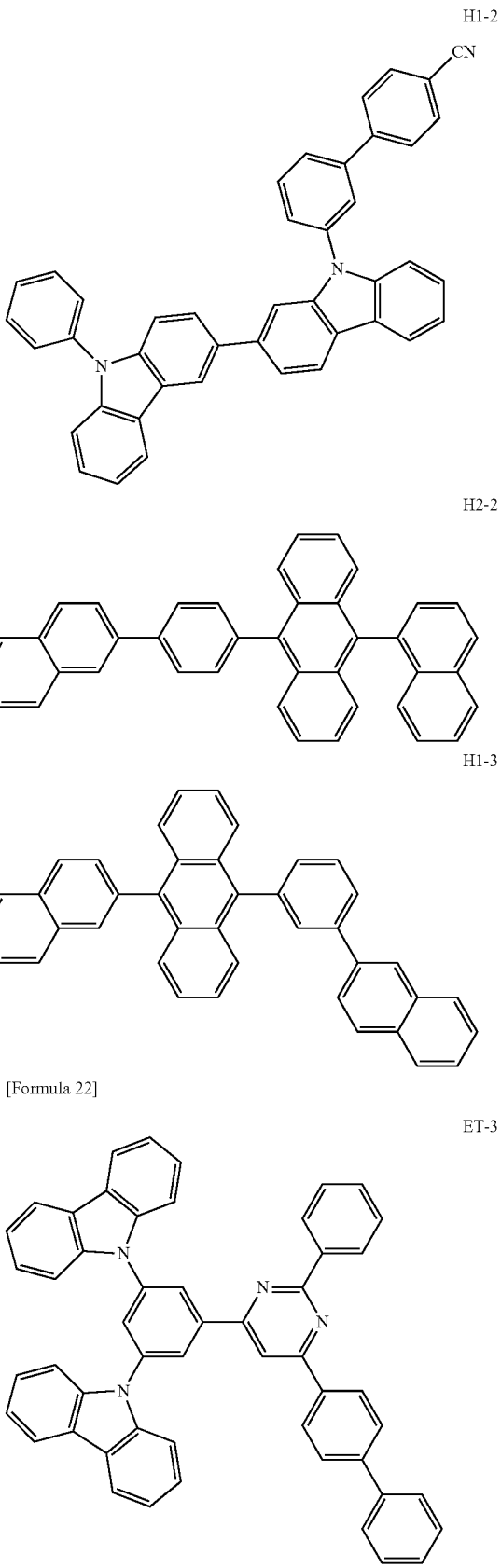

ET-4
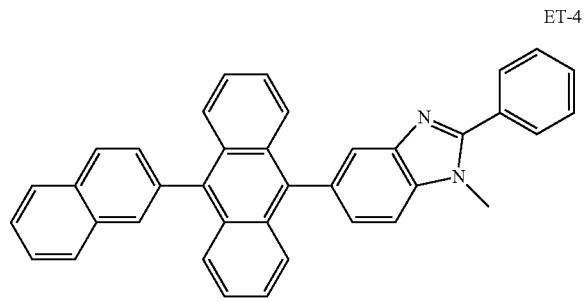
HT-3
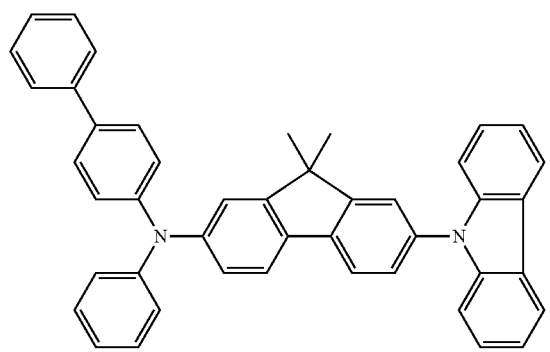
ET-5
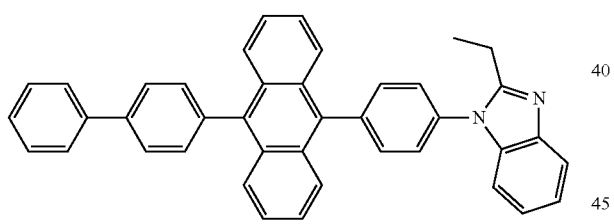
HT-4
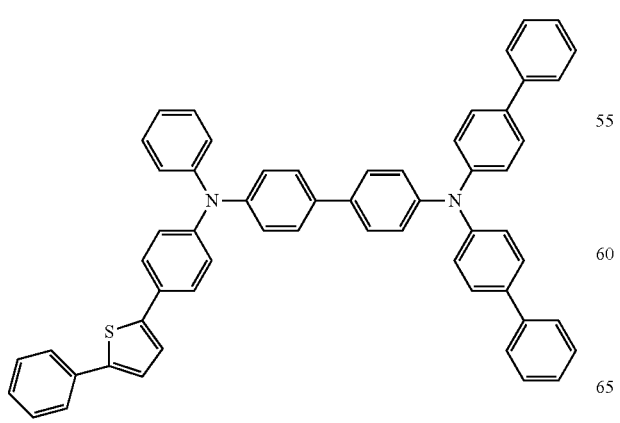
HT-5
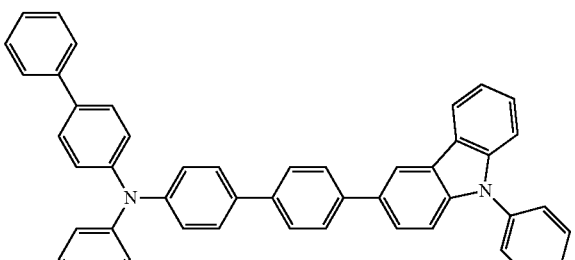
[Formula 23]
H1-4
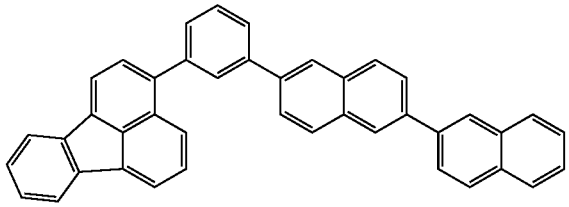
GD-1
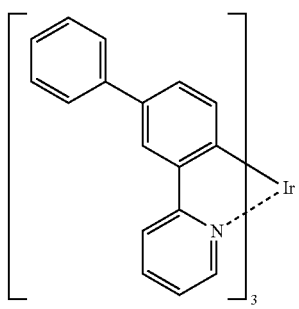
RD-1
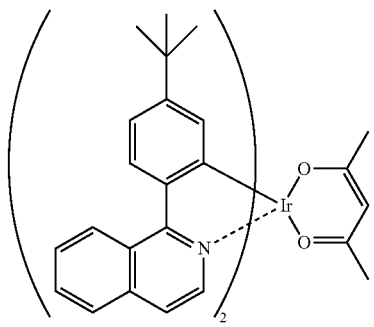

[Formula 24]

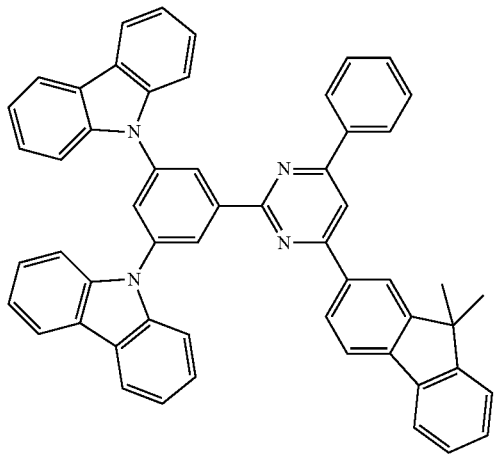

H1-5

Evaluation of Compounds

Firstly, properties of the compounds used in Example were measured. A measurement method and a calculation method are described below. Measurement results and calculation results are shown in Table 1.

(Measurement 1) Singlet Energy EgS

Singlet Energy EgS was obtained according to the following method.

The target compound to be measured was evaporated and deposited on a quartz substrate to prepare a sample. An absorption spectrum of the sample was measured at a normal temperature (300K). A sample was 100 nm thick. The absorption spectrum was expressed in coordinates of which ordinate axis indicated absorbance and of which abscissa axis indicated the wavelength. A tangent was drawn to the fall of the absorption spectrum on the long-wavelength side, and a wavelength value λedge (nm) at an intersection of the tangent and the abscissa axis was obtained. The wavelength value was converted to an energy value by the following conversion equation. The energy value was defined as EgS.

The conversion equation: EgS (eV)=1239.85/λedge

For the measurement of the absorption spectrum, a spectrophotometer (U3310 manufactured by Hitachi, Ltd.) was used.

The tangent to the fall of the absorption spectrum on the long-wavelength side was drawn as follows. While moving on a curve of the absorption spectrum from the maximum spectral value closest to the long-wavelength side in a long-wavelength direction, a tangent at each point on the curve was checked. An inclination of the tangent was decreased and increased in a repeated manner as the curve falls (i.e., a value of the ordinate axis is decreased). A tangent drawn at a point of the minimum inclination closest to the long-wavelength side (except when absorbance was 0.1 or less) was defined as the tangent to the fall of the absorption spectrum on the long-wavelength side.

The maximum absorbance of 0.2 or less was not included in the above-mentioned maximum absorbance on the long-wavelength side.

(Measurement 2) Energy Gap $Eg_{77K}$ and Triplet Energy $EgT_D$ $Eg_{77K}$ and $EgT_D$ were obtained by the following method.

Each of the compounds was measured by a known method of measuring phosphorescence (e.g. a method described in "Hikarikagaku no Sekai (The World of Photochemistry)" (edited by The Chemical Society of Japan, 1993, on and near page 50). Specifically, each of the compounds was dissolved in a solvent (sample: 10 μmol/L, EPA (diethylether:isopentane:ethanol=5:5:2 in volume ratio, each solvent in a spectroscopic grade), thereby forming a sample for phosphorescence measurement. The sample for phosphorescence measurement was put into a quartz cell, cooled to 77K and irradiated with excitation light, so that phosphorescence intensity was measured while changing a wavelength. The phosphorescence spectrum was expressed in coordinates of which ordinate axis indicated phosphorescence intensity and of which abscissa axis indicated the wavelength.

A tangent was drawn to the rise of the phosphorescent spectrum on the short-wavelength side, and a wavelength value λedge (nm) at an intersection of the tangent and the abscissa axis was obtained. The wavelength value was converted to an energy value by the following conversion equation. The energy value was defined as $Eg_{77K}(H)$ or $EgT_D(Eg_{77K}(D))$.

The conversion equation: $Eg_{77K}(H)$ (eV)=1239.85/λedge $EgT_D$ (eV)=1239.85/λedge The tangent to the rise of the phosphorescence spectrum on the short-wavelength side was drawn as follows. While moving on a curve of the phosphorescence spectrum from the short-wavelength side to the maximum spectral value closest to the short-wavelength side among the maximum spectral values, a tangent is checked at each point on the curve toward the long-wavelength of the phosphorescence spectrum. An inclination of the tangent was increased as the curve rises (i.e., a value of the ordinate axis was increased). A tangent drawn at a point of the maximum inclination was defined as the tangent to the rise of the phosphorescence spectrum on the short-wavelength side.

The maximum with peak intensity being 10% or less of the maximum peak intensity of the spectrum was not included in the above-mentioned maximum closest to the short-wavelength side of the spectrum. The tangent drawn at a point of the maximum spectral value being closest to the short-wavelength side and having the maximum inclination was defined as a tangent to the rise of the phosphorescence spectrum on the short-wavelength side.

For phosphorescence measurement, a spectrophotofluorometer body F-4500 and optional accessories for low temperature measurement (which were manufactured by Hitachi High-Technologies Corporation) were used. The measurement instrument is not limited to this arrangement. A combination of a cooling unit, a low temperature container, an excitation light source and a light-receiving unit may be used for measurement.

(Measurement 3) ΔST

ΔST was obtained as a difference between EgS and $Eg_{77K}$ measured in the above (Measurement 1) and (Measurement 2) (see the above numerical formula (3)). The results are shown in Table 1.

A half bandwidth was obtained as follows.

Each of the compounds was formed in a 100 nm thick film on a glass substrate with a vapor deposition apparatus to prepare a sample for fluorescence measurement.

The sample for fluorescence measurement was placed so that light was irradiated vertically on the glass substrate. The sample for phosphorescence measurement was irradiated with excitation light at a room temperature 300(K), so that fluorescence intensity was measured while changing a wavelength.

The photoluminescence spectrum was expressed in coordinates of which ordinate axis indicated fluorescence intensity and of which abscissa axis indicated the wavelength. For fluorescence measurement, a spectrophotofluorometer F-4500 (manufactured by Hitachi High-Technologies Corporation) was used.

The half bandwidth (unit: nm) was measured based on the photoluminescence spectrum.

The results are shown in Table 1.

A half bandwidth was obtained as follows.

Each of the compounds was formed in a 100 nm thick film on a glass substrate with a vapor deposition apparatus to prepare a sample for fluorescence measurement.

The sample for fluorescence measurement was placed so that light was irradiated vertically on the glass substrate. The sample for phosphorescence measurement was irradiated with excitation light at a room temperature 300(K), so that fluorescence intensity was measured while changing a wavelength.

The photoluminescence spectrum was expressed in coordinates of which ordinate axis indicated fluorescence intensity and of which abscissa axis indicated the wavelength. For fluorescence measurement, a spectrophotofluorometer F-4500 (manufactured by Hitachi High-Technologies Corporation) was used.

The half bandwidth (unit: nm) was measured based on the photoluminescence spectrum.

The compounds H1-1 and H1-2 were measured with respect to the half bandwidth. The results are shown in Table 1.

TABLE 1

|      | EgS (thin film) [eV] | Eg (77K) [eV] | $\Delta$ST [eV] | Half Bandwidth [nm] |
|------|----------------------|---------------|-----------------|---------------------|
| H1-1 | 2.99                 | 2.71          | 0.28            | 67                  |
| H1-2 | 3.02                 | 2.74          | 0.28            | 63                  |

Preparation and Evaluation of Organic EL Device

The organic EL device was prepared and evaluated as follows.

Example 1

A glass substrate (size: 25 mm×75 mm×1.1 mm thick, manufactured by Geomatec Co., Ltd.) having an ITO transparent electrode (anode) was ultrasonic-cleaned in isopropyl alcohol for five minutes, and then UV/ozone-cleaned for 30 minutes. A film of ITO was 77 nm thick.

After the glass substrate having the transparent electrode line was cleaned, the glass substrate was mounted on a substrate holder of a vacuum vapor deposition apparatus. Initially, the compound HA-1 was evaporated and deposited on a surface of the glass substrate where the transparent electrode line was provided in a manner to cover the transparent electrode, thereby forming a 5-nm thick film of the compound HA-1. The HA-1 film serves as a hole injecting layer.

After the film formation of the HA-1 film, a compound HT-1 was evaporated and deposited on the HA-1 film to form a 65-nm thick HT-1 film. The HT-1 film serves as the first hole transporting layer.

A compound HT-2 was evaporated and deposited on the HT-1 film to form a 10 nm thick HT-2 film. The HT-2 film serves as a second hole transporting layer.

A compound H1-1 (first host material), a compound H2-1 (second host material) and a compound YD-1 (first dopant material) were further co-evaporated and co-deposited on the HT-2 film to form a 5 nm thick first emitting layer. A concentration of the first host material was set at 40 mass %, a concentration of the second host material was set at 40 mass %, and a concentration of the first dopant material was set at 20 mass % in the first emitting layer.

A compound H2-1 (third host material) and a compound BD-1 (second dopant material) were co-evaporated and co-deposited on the first emitting layer to form a 20 nm thick second emitting layer. A concentration of the second dopant material in the second emitting layer was set at 5 mass %.

An electron transporting compound ET-1 was evaporated and deposited on the second emitting layer to form a 5 nm thick hole blocking layer.

Further, a compound ET-2 was evaporated and deposited on the ET-1 film to form a 30 nm thick electron transporting layer.

LiF was evaporated and deposited on the electron transporting layer to form a 1 nm thick LiF layer.

A metal Al was evaporated and deposited on the LiF film to form an 80 nm thick metal cathode.

A device arrangement of the organic EL device in Example 1 is simply shown in Table 2.

Numerals in parentheses represent a film thickness (unit: nm) in Table 2. The numerals represented by percentage in the parentheses, which are described after the numerals representing the film thickness, indicate a concentration of each of the materials in the emitting layers. When the emitting layer contains the first host material and the second host material, a mass concentration (unit: mass %) of the second host material and a mass concentration (unit: mass %) of the dopant material are shown in this order. When the emitting layer only contains a single host material, the mass concentration of the dopant material is shown. Further, as for the layers other than the emitting layers, a mass concentration (unit: mass %) of an additional component other than the main component is shown.

The materials for the emitting layer are separately shown in Table 3.

Example 2

Films of the organic EL device in Example 2 were formed in the same manner as in Example 1 except that the film thickness of the HT-1 film was set to 75 nm and a 3 nm thick SL-1 film was formed by evaporating and depositing a compound SL-1 as the space layer between the first emitting layer and the second emitting layer.

A device arrangement of the organic EL device in Example 2 is simply shown in Table 2. The materials for the emitting layer are separately shown in Table 3.

TABLE 2

Example 1 ITO(77)/HA-1(5)/HT-1(65)/HT-2(10)/H1-1:H2-1:YD-1 (5:50%, 20%)/H2-1:BD-1(20:5 %)/ET-1(5)/ET-2(30)/ LiF(1)/Al(80)

Example 2 ITO(77)/HA-1(5)/HT-1(75)/HT-2(10)/H1-1:H2-1:YD-1 (5:50%, 20%)/SL-1(3)/H2-1:BD-1(20, 5%)/ET-1(5)/ET-2(30)/ LiF(1)/Al(80)

TABLE 3

| | First Emitting Layer | | | | Second Emitting Layer | |
|---|---|---|---|---|---|---|
| | First Host Material | Second Host Material | Dopant Material | Space Layer | Host Material | Dopant Material |
| Example 1 | H1-1 | H2-1 | YD-1 | — | H2-1 | BD-1 |
| Example 2 | H1-1 | H2-1 | YD-1 | SL-1 | H2-1 | BD-1 |

Example 3

A glass substrate (size: 25 mm×75 mm×1.1 mm thick, manufactured by Geomatec Co., Ltd.) having an ITO transparent electrode (anode) was ultrasonic-cleaned in isopropyl alcohol for five minutes, and then UV/ozone-cleaned for 30 minutes. A film of ITO was 130 nm thick.

After the glass substrate having the transparent electrode line was cleaned, the glass substrate was mounted on a substrate holder of a vacuum vapor deposition apparatus. Initially, the compound HI-1 was evaporated and deposited on a surface of the glass substrate where the transparent electrode line was provided in a manner to cover the transparent electrode, thereby forming a 5 nm thick film of the compound HA-1. The HA-1 film serves as a hole injecting layer.

After the film formation of the HA-1 film, a compound HT-1 was evaporated and deposited on the HA-1 film to form a 75 nm thick HT-1 film. Moreover, a compound HT-2 was evaporated and deposited on the HT-1 film to form a 15 nm thick HT-2 film. The HT-1 film and the HT-2 film serve as a hole transporting layer.

A compound H1-2 (first host material), a compound H2-2 (second host material) and a compound BD-1 (first dopant material) were co-evaporated and co-deposited on the HT-2 film to form a 25 nm thick first emitting layer. A concentration of the first host material was set at 48 mass %, a concentration of the second host material was set at 48 mass %, and a concentration of the first dopant material was set at 4 mass % in the first emitting layer.

A compound ET-3 was evaporated and deposited on the first emitting layer to form a 5 nm thick electron transporting layer.

A compound ET-4 and Li were co-evaporated and co-deposited on the electron transporting layer to form a 10 nm thick electron injecting layer. A concentration of Li was set at 4 mass %.

The compound HA-1 was evaporated and deposited on the electron injecting layer to form a 20 nm thick charge generating layer.

The hole transporting compound HT-1 was evaporated and deposited on the charge generating layer to form a 30 nm thick second hole transporting layer.

A hole transporting compound HT-3 was evaporated and deposited on the second hole transporting layer to form a 10 thick third hole transporting layer.

A compound H1-4 (third host material) and a compound YD-1 (second dopant material) were co-evaporated and co-deposited on the third hole transporting layer to form a 30 nm thick second emitting layer. A concentration of the second dopant material in the second emitting layer was set at 10 mass %.

A compound ET-2 was evaporated and deposited on the second emitting layer to form a 35 thick second electron transporting layer.

LiF was evaporated and deposited on the second electron transporting layer to form a 1 nm thick LiF film.

A metal Al was evaporated and deposited on the LiF film to form an 80 nm thick metal cathode.

Thus, the organic EL device of Example 3 was prepared.

A device arrangement of the organic EL device in Example 3 is simply shown in Table 4. Similar to Table 2, numerals in parentheses represent a film thickness (unit: nm) in Table 4. The numerals represented by percentage in the parentheses, which are described after the numerals representing the film thickness, indicate a concentration of each of the materials in the emitting layers.

The materials for the emitting layer are separately shown in Table 5.

Example 4

For manufacturing an organic EL device in Example 4, the materials for the second hole transporting layer and the third hole transporting layer in Example 3 were replaced by materials shown in Table 4. The compound H1-4 (third host material) and a second dopant material RD-1 were co-evaporated and co-deposited on the third hole transporting layer at a 10% concentration of the second dopant to form the second emitting layer. Further, a compound H1-5 (host material) and a dopant material GD-1 were co-evaporated and co-deposited on the second emitting layer at a 20% concentration of the dopant to form the third emitting layer. Other layers of the organic EL device in Example 4 were manufactured in the same manner as in Example 3. Materials for the emitting layers of the organic EL device in Example 4 are separately shown in Table 5.

TABLE 4

| | Device Arrangement |
|---|---|
| Example 3 | ITO(130)/HA-1(5)/HT-1(75)/HT-2(15)/H1-1:H2-1:BD-1 (25:50%, 4%)/ET-3(5)/ET-4:Li(10:4%)/HA-1(20)/HT-1(30)/ HT-3 (10)/H1-3:YD-1(30)/ET-5(35)/LiF(1)/Al(80) |
| Example 4 | ITO(130)/HA-1(5)/HT-1(75)/HT-2(15)/H1-1:H2-1:BD-1 (25:50%, 4%)/ET-3(5)/ET-4:Li(10:4%)/HA-1(20)/HT-4(25)/ HT-5 (10)/H1-4:RD-1(5:10%)/H1-5:GD-1(30:20%)ET-5(35)/LiF(1)/Al(80) |

TABLE 5

| | First Emitting Unit First Emitting Layer | | | Second Emitting Unit | | | |
|---|---|---|---|---|---|---|---|
| | | | | Second Emitting Layer | | Third Emitting Layer | |
| | First Host Material | Second Host Material | Dopant Material | Host Material | Dopant Material | Host Material | Dopant Material |
| Example 3 | H1-2 | H2-2 | BD-1 | H1-3 | YD-1 | — | — |
| Example 4 | H1-2 | H2-2 | BD-1 | H1-4 | RD-1 | H1-5 | GD-1 |

Evaluation of Organic EL Devices

The prepared organic EL devices in Examples 1 to 4 were evaluated in terms of drive voltage, luminance intensity, CIE1931 chromaticity, current efficiency L/J, power efficiency η, external quantum efficiency EQE, and delayed fluorescence ratio. Evaluation results of the prepared organic EL devices in Examples 1 to 4 at the current density of 1.00 mA/cm$^2$ and 10 mA/cm$^2$ in terms of the above evaluation items except for the delayed fluorescence ratio are shown in Tables 6 and 7.

Drive Voltage

Voltage was applied between ITO and Al such that the current density was 1.00 mA/cm$^2$ or 10 mA/cm$^2$, where the voltage (unit: V) was measured.

CIE1931 Chromaticity

Voltage was applied on each of the organic EL devices such that the current density was 1.00 mA/cm$^2$ or 10 mA/cm$^2$, where CIE1931 chromaticity coordinates (x, y) were measured using a spectroradiometer CS-1000 (manufactured by Konica Minolta, Inc.).

Current Efficiency L/J and Power Efficiency η

Voltage was applied on each of the organic EL devices such that the current density was 1.00 mA/cm$^2$ or 10 mA/cm$^2$, where spectral radiance spectra were measured by the aforementioned spectroradiometer. Based on the obtained spectral radiance spectra, the current efficiency (unit: cd/A) and the power efficiency η (unit: lm/W) were calculated.

External Quantum Efficiency EQE

The external quantum efficiency EQE (unit: %) was calculated based on the obtained spectral-radiance spectra, assuming that the spectra was provided under a Lambertian radiation.

TABLE 6

| | Current Density (mA/cm$^2$) | Voltage (V) | Chromaticity CIEx | Chromaticity CIEy | L/J (cd/A) | η (lm/W) | EQE (%) |
|---|---|---|---|---|---|---|---|
| Example 1 | 1.00 | 3.4 | 0.450 | 0.427 | 24.91 | 22.93 | 9.52 |
| | 10 | 3.9 | 0.448 | 0.427 | 22.97 | 18.41 | 8.77 |
| Example 2 | 1.00 | 3.4 | 0.470 | 0.433 | 22.63 | 20.75 | 8.66 |
| | 10 | 3.9 | 0.455 | 0.424 | 19.46 | 15.49 | 7.55 |

TABLE 7

| | Current Density (mA/cm$^2$) | Voltage (V) | Chromaticity CIEx | Chromaticity CIEy | L/J (cd/A) | η (lm/W) | EQE (%) |
|---|---|---|---|---|---|---|---|
| Example 3 | 1.00 | 6.7 | 0.322 | 0.329 | 33.8 | 16.0 | 16.1 |
| | 10 | 8.1 | 0.323 | 0.328 | 30.5 | 11.8 | 14.5 |
| Example 4 | 1.00 | 6.5 | 0.344 | 0.34 | 39.2 | 19.0 | 26.7 |
| | 10 | 8.3 | 0.348 | 0.335 | 34.9 | 13.2 | 24.4 |

As shown in FIG. 6, the organic EL devices in Examples 1 and 2 exhibit a white emission at a high luminous efficiency in a high current density area at 1.00 mA/cm$^2$ and 10 mA/cm$^2$.

As shown in FIG. 7, the organic EL devices in Examples 3 and 4 exhibit a white emission at a further higher luminous efficiency than those in the Examples 1 and 2 in a high current density area at 10 mA/cm$^2$.

Further, in the organic EL devices in Examples 1 and 2, the external quantum efficiency EQE was measured at 0.1 mA/cm$^2$, 1 mA/cm$^2$, 10 mA/cm$^2$, and 50 mA/cm$^2$. A relationship between the current density and the external quantum efficiency EQE is shown in FIG. 14.

Figure 14:
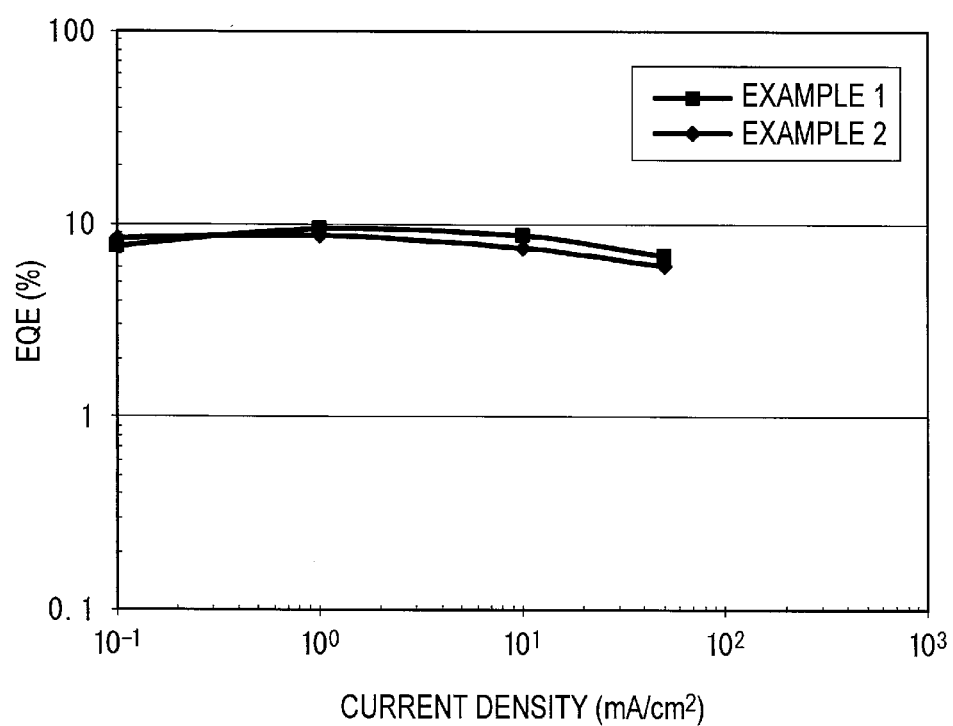
FIG. 14 shows a relationship of an current density and an external quantum efficiency of organic electroluminescence devices in Examples 1 and 2 of the invention.

It is understood from FIG. 14 that, in the organic EL devices in Examples 1 and 2, roll-off was not observed and the luminous efficiency was kept even in a high current density area at 1 mA/cm$^2$ or more.

Further, the delayed fluorescence ratio (TTF ratio) and the residual strength ratio of the organic EL device in Example 2 were measured.

In the organic EL device in Example 2, voltage pulse waveform (pulse width: 500 micro second, frequency: 20 Hz, voltage: equivalent to 0.1 to 100 mA/cm$^2$) output from a pulse generator 8114A (manufactured by Agilent Technologies) was applied. EL emission was input in a photomultiplier R928 (manufactured by HAMAMATSU PHOTONICS K.K.). The pulse voltage waveform and the EL emission were synchronized and loaded in an oscilloscope 2440 (manufactured by Tektronix) to obtain a transitional EL waveform. Reciprocal numbers of square root of luminous intensity were plotted, which were fitted in a linear line using a value before the elapse of 10$^{-5}$ seconds calculated by the method of least squares to determine the delayed fluorescence ratio (TTF ratio).

Figure 15:
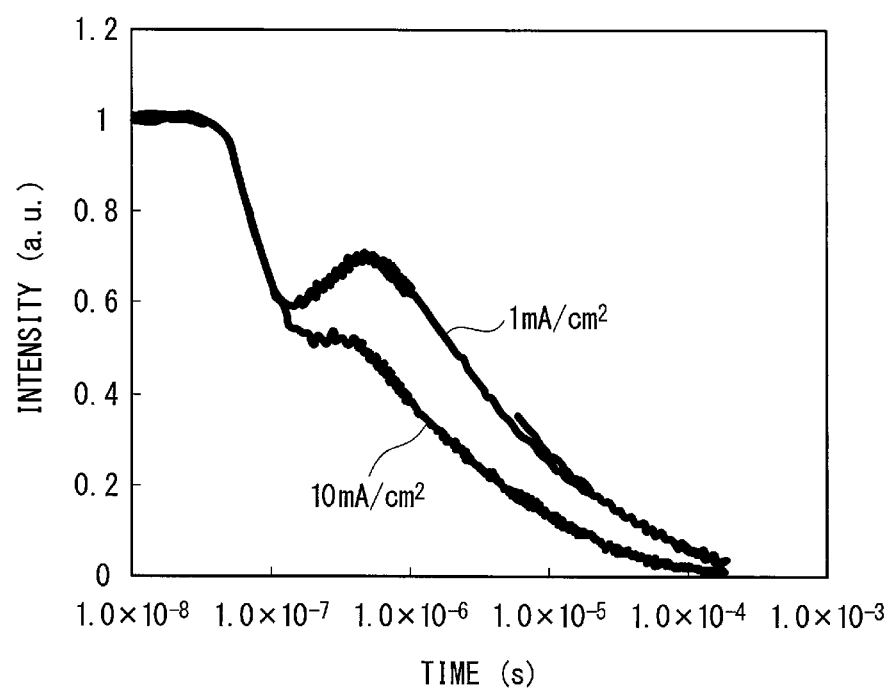
FIG. 15 shows a transitional EL waveform of the organic electroluminescence device in Example 2 of the invention.
Figure 16:
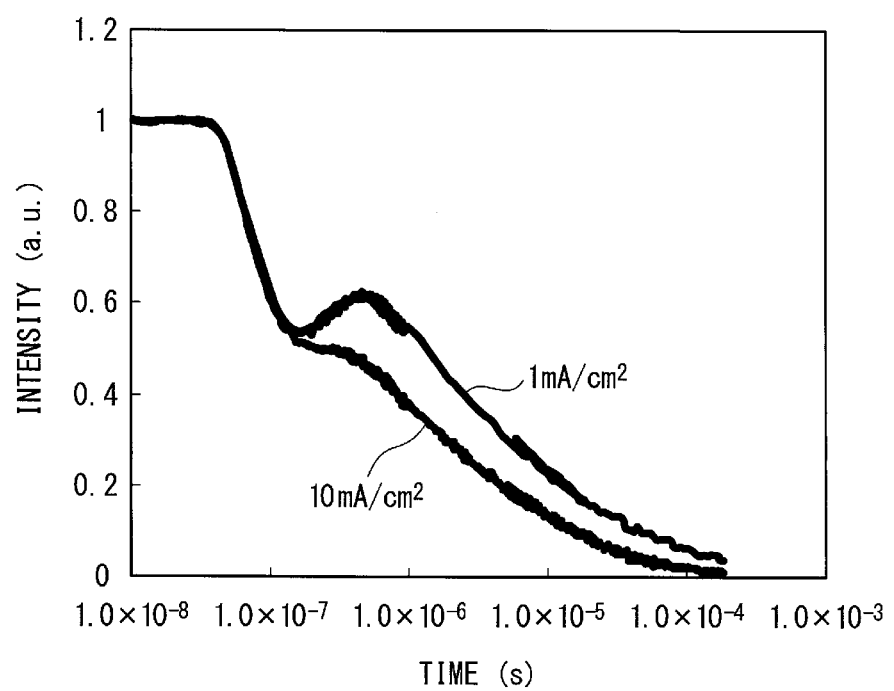
FIG. 16 shows another transitional EL waveform of the organic electroluminescence device in Example 2 of the invention.

Voltage of 1.00 mA/cm$^2$ and 10 mA/cm$^2$ was applied on the organic EL device of the Example 2 at the room temperature, where the transitional EL waveform is shown in FIG. 15. The pulse voltage was removed at the time of about 3×10$^{-8}$ seconds. A color filter for eliminating a luminescence component from the second emitting layer of the organic EL device of the Example 2 was inserted into an oscilloscope. With this oscilloscope, only a luminescence component from the first emitting layer was detected as a luminescence component derived from the TADF mechanism. The obtained transitional EL waveform is shown in FIG. 16.

Based on a graph, where the voltage removal time was a starting point and the reciprocal numbers of the square root of luminous intensity before the elapse of 10$^{-5}$ seconds after voltage removal were plotted, the delayed fluorescence ratio was obtained. The residual strength ratio at 1 μs was read from FIGS. 15 and 16. The results are shown in Table 8.

TABLE 8

| | Current Density (mA/cm$^2$) | TTF Ratio (%) No filter | TTF Ratio (%) with filter | Residual Strength Ratio No filter | Residual Strength Ratio with filter |
|---|---|---|---|---|---|
| Example 2 | 1.00 | 59.00 | 50.00 | 0.62 | 0.54 |
| | 10 | 40.00 | 39.00 | 0.38 | 0.38 |

It is understood from Table 8 that the value of TTF ratio in the organic EL device of Example 2 exceeds the theoretical upper-limit (37.5%) of the TTF ratio. Particularly, since the TTF ratio exceeds the theoretical upper-limit in the results with the filter, it is understood that delayed fluorescence by the TADF mechanism is generated in the first emitting layer.

Figure 17:
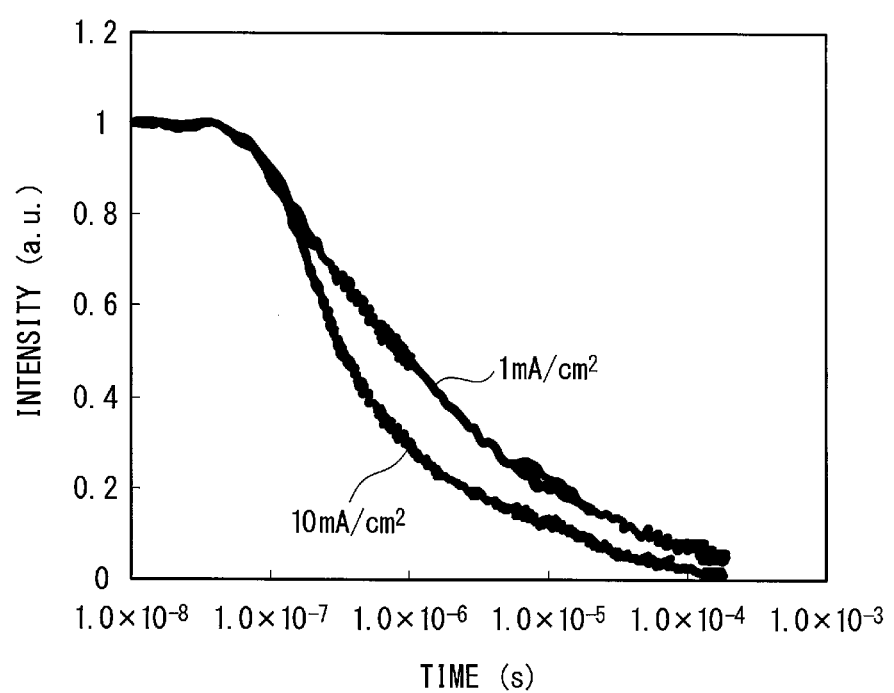
FIG. 17 shows a transitional EL waveform of organic electroluminescence devices in Examples 3 and 4 of the invention.

For the organic EL devices of Examples 3 and 4, transitional EL waveforms were obtained in the same manner as the organic EL device of Example 2. The obtained transitional EL waveform is shown in FIG. 17.

Evaluation Example 1

An organic EL device in Evaluation Example 1 was manufactured in the same manner as in Example 3 except that no second emitting unit was provided. In other words, the organic EL device in Evaluation Example 1 has only the first emitting unit as the emitting unit in the organic EL device of Example 3. The delayed fluorescence ratio (TTF ratio) and the residual strength ratio of this organic EL device were obtained in the same manner as in the organic EL device of Example 2. The results are shown in Table 9.

TABLE 9

| | Current Density (mA/cm$^2$) | TTF Ratio (%) | Residual Strength Ratio |
|---|---|---|---|
| Evaluation Example 1 | 1.00 | 43.00 | 0.47 |

It is understood from Table 9 that the value of TTF ratio in the organic EL device of Evaluation Example 1 exceeds the theoretical upper-limit (37.5%) of the TTF ratio. In other words, it is understood that the first emitting unit of Example 3 generates delayed fluorescence by the TADF mechanism.

Evaluation Example 2

Figure 18:
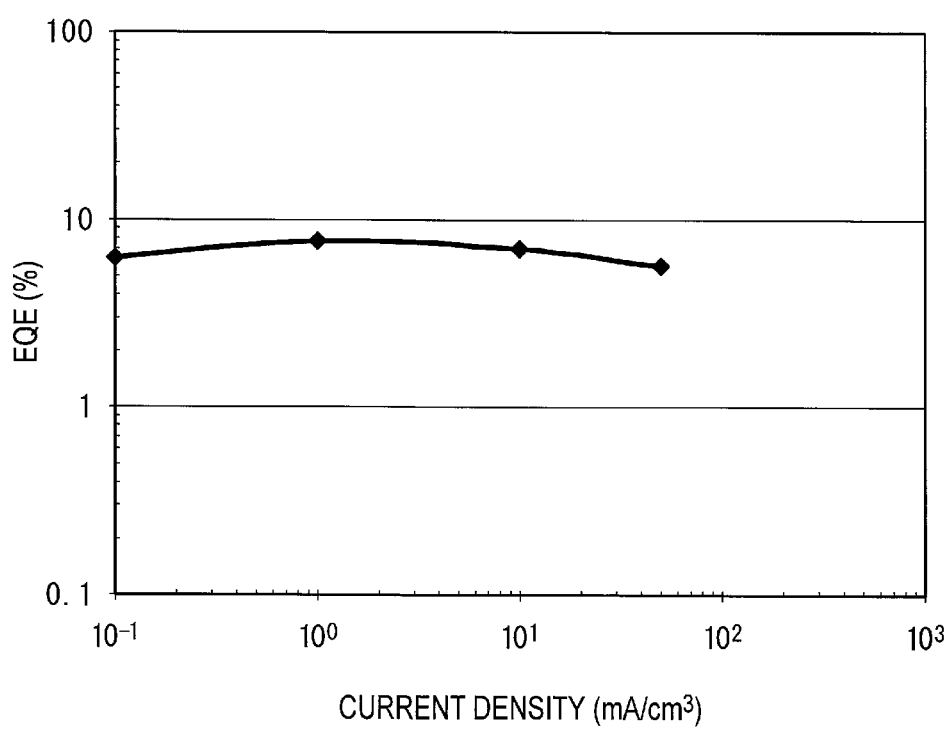
FIG. 18 shows a relationship of an current density and an external quantum efficiency of an organic electroluminescence device in Evaluation Example of the invention.

An organic EL device in Evaluation Example 2 was manufactured in the same manner as in the organic EL device of Examples 3 and 4 except for having only the first emitting unit as the emitting unit. In this organic EL device, the external quantum efficiency EQE was measured at 0.1 mA/cm$^2$, 1 mA/cm$^2$, 10 mA/cm$^2$, and 50 mA/cm$^2$. A relationship between the current density and the external quantum efficiency EQE is shown in FIG. 18. It is understood from FIG. 18 that, also in the organic EL device including only the first emitting unit in Examples 4 and 3, roll-off was not observed and the luminous efficiency was kept in a high current density area at 1 mA/cm$^2$ or more.

Reference Example

Herein, an organic EL device described in Non-Patent Literature 1 is shown as a reference example and compared with the organic EL device of Example 1 in terms of the device arrangement.

A device arrangement of the organic EL devices in the reference example is simply shown below in the same manner as in Example 1.

ITO(110)/NPD(40)/*m*-CP(10)/*m*-CP:PIC-TRZ (20.6%)/BP4*m*Py(40)/LiF(0.8)/Al(70)

Compounds used in the reference example will be shown below.

[Formula 25]

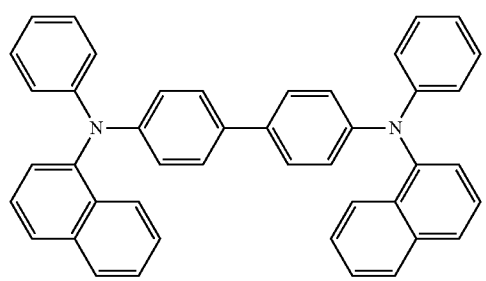

α-NPD

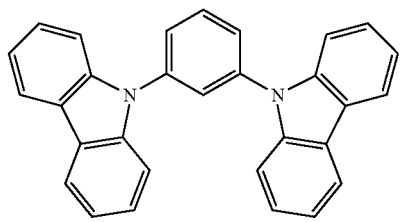

m-CP

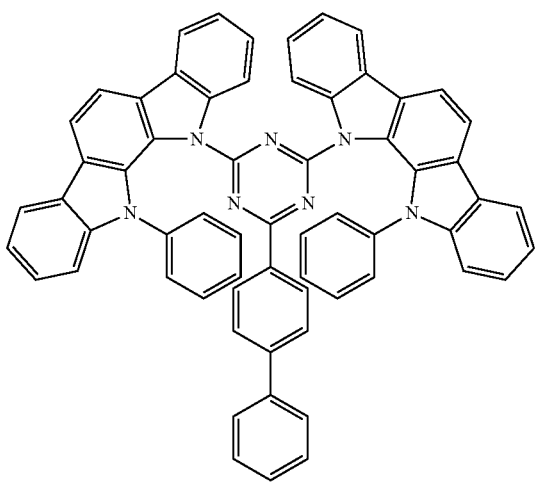

PIC-TRZ

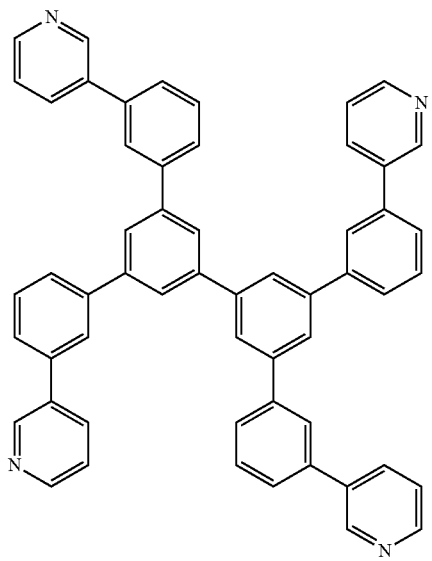

BP4mPy

The device only exhibits the maximum EQE of 5.1% in the current density area at 0.01 mA/cm$^2$ which is much lower than the current density area in a practical use. Accordingly, in a high current density area around 1 mA/cm$^2$ and 10 mA/cm$^2$, roll-off is generated and a luminous efficiency is reduced.

Accordingly, it is understood that the organic EL devices of Examples 1 to 4 emitted light with a high efficiency even in the high current density area.

The invention claimed is:
1. An organic electroluminescence device comprising a pair of electrodes and an organic compound layer interposed between the pair of electrodes, wherein the organic compound layer comprises a plurality of emitting layers at least comprising a first emitting layer and a second emitting layer, the first emitting layer comprises a first host material and a fluorescent first luminescent material, the second emitting layer comprises a second luminescent material that is different from the first luminescent material, a difference $\Delta ST(H1)$ between singlet energy $EgS(H1)$ of the first host material and an energy gap $Eg_{77K}(H1)$ at 77[K] of the first host material satisfies a formula (1) below, $$\Delta ST(H1)=EgS(H1)-Eg_{77K}(H1)<0.3 \text{ [eV]} \qquad (1) \text{ and}$$

the first luminescent material has a main peak wavelength from 400 nm to less than 500 nm and the second luminescent material has a main peak wavelength from 500 nm to 700 nm, or alternatively, the first luminescent material has a main peak wavelength from 500 nm to 700 nm and the second luminescent material has a main peak wavelength from 400 nm to less than 500 nm.

2. The organic electroluminescence device according to claim 1, wherein the first emitting layer further comprises a second host material, and the singlet energy $EgS(H1)$ of the first host material, singlet energy $EgS(H2)$ of the second host material, and singlet energy $EgS(D)$ of the first luminescent material satisfy formulae (2) and (3) below, $$EgS(H1)>EgS(D) \qquad (2)$$

$$EgS(H2)>EgS(D) \qquad (3).$$

3. The organic electroluminescence device according to claim 1, wherein the organic compound layer comprises a plurality of emitting units and an intermediate unit that is adjacent to the plurality of emitting units and connects the plurality of emitting units to each other, and at least one emitting unit of the plurality of emitting units comprises the first emitting layer.

4. The organic electroluminescence device according to claim 3, wherein the plurality of emitting units at least comprises a first emitting unit and a second emitting unit, the first emitting unit comprises the first emitting layer and the first luminescent material exhibits blue fluorescence, the second emitting unit comprises the second emitting layer, and the second emitting layer comprises a phosphorescent material as the second luminescent material and a third host material.

5. The organic electroluminescence device according to claim 1, wherein an anode, the first emitting layer, the second emitting layer, and a cathode are laminated in this order.

6. The organic electroluminescence device according to claim 1, wherein the second emitting layer is laminated adjacent to the first emitting layer.

7. The organic electroluminescence device according to claim 1, wherein the energy gap $Eg_{77K}(H1)$ at 77[K] of the first host material and the energy gap $Eg_{77k}(D)$ at 77K of the first luminescent material satisfy a formula (7) below:

$$\Delta T = Eg_{77k}(H1) - Eg_{77K}(D) \geq 0.5 \text{[eV]} \qquad (7).$$

8. The organic electroluminescence device according to claim 1, wherein the energy gap $Eg_{77K}(H1)$ at 77[K] of the first host material and the energy gap $Eg_{77k}(D)$ at 77K of the first luminescent material satisfy a formula (7-1) below:

$$\Delta T = Eg_{77k}(H1) - Eg_{77K}(D) \geq 0.9 \text{[eV]} \qquad (7\text{-}1).$$

9. The organic electroluminescence device according to claim 1, wherein the energy gap $Eg_{77K}(H1)$ at 77[K] of the first host material and the energy gap $Eg_{77k}(D)$ at 77K of the first luminescent material satisfy a formula (7-2) below:

$$\Delta T = Eg_{77k}(H1) - Eg_{77K}(D) \geq 1.0 \text{[eV]} \qquad (7\text{-}2).$$

10. The organic electroluminescence device according to claim 1, wherein the second luminescent material is a phosphorescent material.

11. The organic electroluminescence device according to claim 1, wherein the second emitting layer comprises the second luminescent material that is a phosphorescent material; and a third host material.

* * * * *